(12) United States Patent
Yoshikawa et al.

(10) Patent No.: US 7,737,490 B2
(45) Date of Patent: Jun. 15, 2010

(54) VERTICAL AND TRENCH TYPE INSULATED GATE MOS SEMICONDUCTOR DEVICE

(75) Inventors: Koh Yoshikawa, Matsumoto (JP); Hiroki Wakimoto, Matsumoto (JP); Masahito Otsuki, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 0 days.

(21) Appl. No.: 11/741,015

(22) Filed: Apr. 27, 2007

(65) Prior Publication Data

US 2007/0252195 A1 Nov. 1, 2007

(30) Foreign Application Priority Data

| Apr. 27, 2006 | (JP) | ............................... 2006-122811 |
| Jul. 7, 2006 | (JP) | ............................... 2006-187439 |
| Mar. 8, 2007 | (JP) | ............................... 2007-058029 |

(51) Int. Cl.
*H01L 29/76* (2006.01)
(52) U.S. Cl. ................. 257/329; 257/565; 257/370; 257/E21.384; 257/E29.04; 438/270
(58) Field of Classification Search ............... 257/329, 257/565, 370, E21.384, E29.04; 438/270
See application file for complete search history.

(56) References Cited

U.S. PATENT DOCUMENTS 5,801,408 A * 9/1998 Takahashi .................. 257/212

| 6,221,721 B1 * | 4/2001 | Takahashi | ............... 438/270 |
| 6,380,586 B1 | 4/2002 | Yoshikawa | |
| 2003/0116807 A1 | 6/2003 | Matsuda | |
| 2004/0188803 A1 | 9/2004 | Matsuda | |
| 2006/0163649 A1 | 7/2006 | Otsuki | |

FOREIGN PATENT DOCUMENTS

| JP | 10-163483 A | 6/1998 |
| JP | 2000-228519 A | 8/2000 |
| JP | 2001-274400 A | 10/2001 |
| JP | 2003-258253 A | 9/2003 |
| JP | 2006-210547 A | 8/2006 |

* cited by examiner

*Primary Examiner*—Cuong Q Nguyen
*Assistant Examiner*—Cathy N Lam
(74) *Attorney, Agent, or Firm*—Rossi Kimms & McDowell LLP

(57) ABSTRACT

A vertical and trench type insulated gate MOS semiconductor device is provided in which the surfaces of p-type channel regions and the surfaces of portions of an n-type semiconductor substrate alternate in the longitudinal direction of the trench between the trenches arranged in parallel, and an $n^+$-type emitter region selectively formed on the surface of the p-type channel region is wide by the side of the trench and becomes narrow toward the center point between the trenches. This enables the device to achieve low on-resistance and enhanced turn-off capability.

17 Claims, 43 Drawing Sheets

US 7,737,490 B2

VERTICAL AND TRENCH TYPE INSULATED GATE MOS SEMICONDUCTOR DEVICE

CROSS REFERENCE TO RELATED APPLICATIONS

This application claims priority from application Serial No. JP 2006-122811, filed on Apr. 27, 2006; JP 2006-187439 filed on Jul. 7, 2006; and JP 2007-058029, filed on Mar. 8, 2007, the contents of each these being incorporated herein in their entirety.

BACKGROUND OF THE INVENTION

A. Field of the Invention

The present invention relates to a power MOS semiconductor device having a trench type insulated gate. Further in detail, the invention relates to a vertical power MOS semiconductor device having a trench type insulated gate structure with a trench, a gate insulator film and a control electrode, the trench being formed in a semiconductor substrate in a stripe-like surface pattern, the gate insulator film being formed on the sidewall surface of the trench and the control electrode being buried in the trench with the gate insulator film interposed between. In the structure, first conductivity type regions and second conductivity type regions are alternately formed on the surface of the substrate in the longitudinal direction of the trench.

B. Description of the Related Art

In recent years, in compliance with requirements for downsizing and performance enhancement in power source equipment in the field of power electronics, efforts have been concentrated on a power semiconductor device to improve the performance thereof in obtaining a high breakdown voltage, a high current capacity and, along with this, a low power loss, a high breakdown blocking capability and a high operation speed. As a power semiconductor device capable of obtaining such a high current capacity and a low power loss, many vertical MOS semiconductor devices are used which are provided with trench type insulated gates. A power MOS semiconductor device is driven by a MOS (Metal/Oxide film/Semiconductor) gate. Two types of MOS gate structure are well known, i.e., planar MOS gate structures and trench MOS gate structures. A planar MOS gate structure has a MOS gate provided in plane on the surface of a semiconductor substrate and a trench MOS gate structure has a MOS gate formed by being buried in a trench vertically formed to the surface of a semiconductor substrate. In recent vertical semiconductor devices, a so-called vertical and trench type MOS semiconductor device having a trench MOS gate structure has become a focus of attention because its structure makes it easy to obtain low on-resistance characteristics.

With respect to a vertical trench type MOS semiconductor device having such a trench type insulated gate structure, a vertical and trench type IGBT (Insulated Gate Bipolar Transistor) has already been publicly known as a device that enables the realization of both low on-resistance and high breakdown voltage (JP-A-2000-228519 (FIG. 6 and FIG. 7)). The vertical and trench type IGBT has a trench type insulated gate structure in which a gate electrode is buried in each trench formed in stripes or linearly with an insulator film interposed between. Moreover, p-type channel regions and n-type semiconductor substrate regions form a pattern of alternately appearing on the surface of a semiconductor substrate between the trenches in the direction along the trenches.

In order to realize secured load short circuit blocking capability, reduction in on-voltage and reduction in input capacitance of a trench gate IGBT, a device is known in which p-type base regions are formed in a direction perpendicular to the direction of a trench gate and in stripes, and each of unit cells of the trench gate IGBT is formed to have such an approximately uniform channel length as to be equal to or shorter than that of related trench type IGBTs (see the abstract of JP-A-2001-274400).

An example of a structure of such a vertical and trench type IGBT is shown in a perspective view in FIG. 10, with cross sectional views in FIG. 11-1, FIG. 11-2, FIG. 11-3 and a plan view in FIG. 12. Furthermore, for making an explanation with comparison, a principal part of a related planar type IGBT is shown in a cross sectional view in FIG. 17. The structures and operations of the related IGBTs will be explained with reference to the above drawings. In the related vertical and trench type IGBT, on one of the principal surfaces (hereinafter referred to as the top surface) of $n^-$-type semiconductor substrate 111, p-type channel region 112 is selectively formed and, on the other principal surface (hereinafter referred to as the bottom surface), $n^+$-type FS (field stop) layer 150 and p-type collector layer 151 are formed. Moreover, a number of trenches 113 with a surface pattern that is orthogonal to p-type channel region 112 are formed from the top surface of $n^-$-type semiconductor substrate 111 to a depth reaching an $n^-$-type drain layer as a region in $n^-$-type semiconductor substrate 111 through p-type channel region 112. The inner surface of trench 113 is covered with gate oxide film 114. Further to the inside of trench 113, gate electrode 115 of a material such as conductive polycrystalline silicon is buried. On the surface of channel region 112 between trenches 113 adjacent to each other, $p^+$-type body region 117 is provided in the approximate middle thereof. Adjacent to $p^+$-type body region 117 and trench 113, an $n^+$-type emitter region 116 is provided. On gate electrode 115, insulator layer 118 is disposed and metal electrode 119 of a metal such as aluminum is provided on the whole surface of the unit cell region of the IGBT with insulator layer 118 insulating and separating gate electrode 115 from metal electrode 119. Moreover, an arrangement is provided so that metal electrode 119 makes ohmic contact with the surfaces of $n^+$-type emitter region 116 and $p^+$-type body region 117 in a contact region provided as a region including the surfaces of both of a portion of $n^+$-type emitter region 116 and a portion of $p^+$-type body region 117. Collector electrode 122 is then formed, by which a vertical IGBT in a wafer stage is completed. (In FIG. 17, element numbers correspond to those in FIG. 10, with the exception of the first digit. For example, stopping layer 150 in FIG. 10 is denoted as stopping layer 250 in FIG. 17.)

In the thus arranged vertical and trench type IGBT, by applying a voltage above a specified threshold value to gate electrode 115, an n-type inversion layer (not shown) is formed on the surface layer of p-type channel region 112 along the sidewall of trench 113, by which current paths are formed as shown by arrows in FIGS. 11-1 to 11-3. This makes the vertical and trench type IGBT in a turned-on state between the emitter and the collector. Moreover, by bringing the voltage applied to gate electrode 115 to below a specified threshold value, the n-type inversion layer on p-type channel region 112 along the sidewall of trench 113 disappears, by which the current paths disappear to make the vertical and trench type IGBT in a turned-off state between the emitter and the collector. Furthermore, along trench 113, vertical (in the direction perpendicular to the principal surfaces of the substrate: FIG. 11-1) and lateral (in the direction in parallel to the principal surfaces of the substrate: FIG. 11-2) current paths (shown by arrows) are formed. Thus, compared with a publicly known planar type or trench type vertical IGBT, the areas of the current paths are remarkably expanded. In addition, between trenches 113 on the substrate surface side, minority carriers are stored in the surface region so that n⁻-type semiconductor substrate 111 appears to offer the advantage of reducing on-resistance. In such a related vertical trench type IGBT, the presence of a rough correlation was observed between the designed breakdown voltage and the current density. This was such that a current density was 200 to 250 A/cm² in a 600 V class IGBT, 100 to 150 A/cm² in a 1200 V class IGBT and 40 to 60 A/cm² in a 2500 V class IGBT, which was such a correlation as to be roughly expressed as VI=150 kVA.

However, in the arrangement of the vertical trench type IGBT shown in FIG. 10, a problem is present in low turn-off capability. It was found that the problem is due to the following cause. This will be explained by using FIG. 10, FIG. 11-1 to FIG. 11-3 and FIG. 12 again. FIG. 11-1 to FIG. 11-3 are cross sectional views taken on line A-A, line B-B and line C-C, respectively, of FIG. 10. As was explained for the related background art, in the arrangement of the vertical and trench type IGBT shown in FIG. 10, two kinds of current paths are formed with current paths of a so-called trench type IGBT (shown by arrows) as shown in FIG. 11-1, the cross sectional view taken on line A-A of FIG. 10, and the paths of the currents (shown by arrows) flowing in the lateral direction (in the direction in parallel to the principal surface of the substrate) along the sidewall of the trench as shown in FIG. 11-2, the cross sectional view taken on line B-B of FIG. 10. Of the two kinds of current paths, the current paths of electrons (solid line arrows) flowing in the lateral direction along the sidewall of the trench are rather similar to the electron current paths (solid line arrows) in a planar IGBT shown in FIG. 17. However, compared with the planar IGBT shown in FIG. 17, in which hole current paths are shown by broken lines and electron current paths are in the same plane, in the arrangement of the trench type IGBT shown in FIG. 11-2, electron current paths (solid line arrows) and hole current paths are not present in the same plane. In this respect, the trench type IGBT is different from the planar IGBT. The hole currents, as shown by solid line arrows in FIG. 12 being a plan view in which the trench type IGBT shown in a perspective view shown in FIG. 10 is viewed from above, are to flow from the region in the cross section along the line B-B of FIG. 11-2 toward the region in the cross section along the line C-C of FIG. 11-3. In other words, it can be said that the paths of the hole currents become current paths such that the hole currents flow in from the trench sidewall along a contact plane of an emitter electrode and a semiconductor layer. Therefore, the hole currents are to concentrate in each of encircled regions in FIG. 12 and to pass below the n⁺-type emitter region 116. The hole current is equivalent to a base current in an NPN transistor formed with n⁺-type emitter region 116/p-type channel region 112/n⁻-type semiconductor substrate 111 (Note: The layer arrangement is expressed by combining constituents with the "/" marks, in which the constituents are present in the described order while being separated with the "/" marks). It was found that the concentration of the hole current makes the operation of the NPN transistor easy to result in making the operation of a parasitic thyristor of the IGBT easy which thyristor is formed with n⁺-type emitter region 116/p-type channel region 112/n⁻-type semiconductor substrate 111/p-type collector layer 151, which makes the turning-off of the IGBT uncontrollable and degrades turn-off capability.

Furthermore, in a power semiconductor device, applied to a motor driving inverter of an electric vehicle or a hybrid vehicle and used by double-sided cooling, its high cooling efficiency makes it desirable to use the device at a further higher current density. Namely, in a 1200 V class device, it is desired that the device can be used with a current density of 300 to 500 A/cm², which is higher than the current density of 100 to 150 A/cm² of the above explained related vertical trench type IGBT. When the device is applied under such a high current density condition, there is a problem with the arrangement of the related vertical and trench type IGBT shown in the above FIG. 10 in compatibility between the use at a high current density and reduction in an on-voltage. This problem will be explained with reference to FIG. 11-1 to FIG. 12. In general, a saturation current $I_{sat}$ is expressed by the following expression (1) as $$I_{sat} = \frac{1}{(1-\alpha_{PNP})} \frac{\mu_{ns} C_{ox} Z}{2 \cdot L_{CH}} (V_{GE} - V_{GE(th)})^2 \quad (1)$$

where $\alpha_{PNP}$ is a current-amplification factor, $\mu_{ns}$ is electron mobility in an inversion layer, $C_{ox}$ is capacitance of a gate oxide layer, $L_{CH}$ is a channel length, $V_{GE}$ is a gate bias voltage, $V_{GE(th)}$ is a gate threshold voltage and Z is a total emitter width. To ensure design freedom and sacrificing no other characteristics, it is desirable to adjust the saturation current $I_{sat}$ by changing only the total emitter width Z in the above expression (1).

More particularly, it is desirable to allow the saturation current $I_{sat}$ to increase by increasing the total emitter width Z. Here, the total emitter width is the sum of the widths (lengths) of the sections of n⁺-type emitter region 116, with each of which sections n⁺-type emitter region 116 in a unit cell region between trenches 113 makes contact with trench 113, about the total cells in a unit area. In the following, although the emitter width will be sometimes referred to as the emitter length, both are the same.

As was shown in the related background art, in the arrangement of the vertical trench type IGBT shown in the above FIG. 10, two kinds of current paths are formed. One is the current path shown in FIG. 11-1 in which currents flow in channel region 112 on the sidewall of the so-called trench type IGBT from emitter region 116 in the direction of the thickness of the substrate along the sidewall of the trench. The other is the current path shown in FIG. 11-3 in which currents flow in the channel region 112 along the sidewall of the trench in the lateral direction in parallel with the principal surface of the substrate. For achieving a low on-voltage, it is necessary to secure current paths in which currents flow in the lateral direction in parallel with the principal surface of the substrate along the sidewall of the trench.

However, only with the total emitter width widened according to the expression (1) for increasing the saturation current while keeping the arrangement of the vertical trench type IGBT shown in the above FIG. 10, it was found that the emitter region is made to come naturally closer to the end of the channel region in the longitudinal direction of the trench to make it impossible to form the current paths of the currents flowing on the sidewall of the trench in the lateral direction and to therefore make it difficult to lower the on-voltage with a high current density.

The present invention is directed to overcoming or at least reducing the effects of one or more of the problems set forth above. The invention was made in view of the foregoing problem and an object of the invention is to provide a vertical and trench type insulated gate MOS semiconductor device which can achieve lowered on-resistance and enhancement in turn-off capability.

SUMMARY OF THE INVENTION

According to a first aspect of the invention, the object of the invention can be achieved by providing a vertical and trench type insulated gate MOS semiconductor device as a device including:

a first conductivity type semiconductor substrate;

a second conductivity type channel region selectively formed on one of the principal surfaces of the semiconductor substrate;

a first conductivity type emitter region selectively formed on the surface of the second conductivity type channel region;

trenches each being formed to have a depth exceeding the depth of the second conductivity type channel region from the surface of the semiconductor substrate, and arranged in parallel to be formed in a parallel-stripes-like surface pattern;

a polysilicon gate electrode buried in each of the trenches with a gate insulator film, formed on the sidewall of the trench, interposed between;

an emitter electrode making contact with the surfaces of both of the first conductivity type emitter region and the second conductivity type channel region in a contact region, the contact region being provided between the trenches as a region including the surfaces of both of a portion of the first conductivity type emitter region and a portion of the second conductivity type channel region;

a collector layer formed on the other principal surface of the first conductivity type semiconductor substrate; and a collector electrode making contact with the surface of the collector layer, on the one of the surfaces of the first conductivity type semiconductor substrate, the surfaces of the second conductivity type channel regions and the surfaces of portions of the first conductivity type semiconductor substrate being arranged so as to alternately appear in the longitudinal direction of the trench between the trenches arranged in parallel, and the first conductivity type emitter region selectively formed on the surface of the second conductivity type channel region having a surface shape of being wide on the side of the trench and becoming narrow on the side of the center between the trenches.

According to a second aspect of the invention, the vertical and trench type insulated gate MOS semiconductor device can be provided as a device in which the first conductivity type emitter region makes contact with the trench with a side the length of which is shorter than the length of the contact region in the longitudinal direction of the trench.

According to a third aspect of the invention, the vertical and trench type insulated gate MOS semiconductor device can be further adequately provided as a device in which the first conductivity type emitter region makes contact with the trench with a side the length of which is longer than the length of the contact region in the longitudinal direction of the trench.

According to a fourth aspect of the invention, the vertical and trench type insulated gate MOS semiconductor device according to any one of the first to third aspects can be preferably provided as a device in which the first conductivity type emitter region has a side intersecting the trench at approximately 45 degrees.

According to a fifth aspect of the invention, the vertical and trench type insulated gate MOS semiconductor device according to any one of the first to fourth aspects can be further preferably provided as a device in which a second conductivity type body region is formed in the second conductivity type channel region, the body region being a region wider than that of the contact region and having an impurity concentration higher than that of the channel region.

According to a sixth aspect of the invention, the object of the invention can be achieved by providing a vertical and trench type insulated gate MOS semiconductor device as a device including:

a first conductivity type semiconductor substrate;

a second conductivity type channel region selectively formed on one of the principal surfaces of the semiconductor substrate;

a first conductivity type emitter region selectively formed on the surface of the second conductivity type channel region;

a second conductivity type body region selectively formed on the surface of the second conductivity type channel region and having an impurity concentration higher than that of the second conductivity type channel region;

trenches each being formed to have a depth exceeding the depth of the second conductivity type channel region from the surface of the semiconductor substrate, and arranged in parallel to be formed in a parallel-stripes-like surface pattern;

a polysilicon gate electrode buried in each of the trenches with a gate insulator film, formed on the sidewall of the trench, interposed between;

an emitter electrode making contact with the surfaces of the first conductivity type emitter region, the second conductivity type body region and the second conductivity type channel region in a contact region, the contact region being provided between the trenches as a region including the surfaces of a portion of the first conductivity type emitter region, a portion of the second conductivity type body region and a portion of the second conductivity type channel region;

a collector layer formed on the other principal surface of the first conductivity type semiconductor substrate; and a collector electrode making contact with the surface of the collector layer, on the one of the surfaces of the first conductivity type semiconductor substrate, the surfaces of the second conductivity type channel regions and the surfaces of portions of the first conductivity type semiconductor substrate being arranged so as to alternately appear in the longitudinal direction of the trench between the trenches arranged in parallel, the first conductivity type emitter region selectively formed on the surface of the second conductivity type channel region having a surface shape of being wide on the side of the trench and becoming narrow on the side of the center between the trenches, and the contact region having a length in the longitudinal direction of the trench longer than the length of the first conductivity type emitter region in the longitudinal direction of the trench.

According to a seventh aspect of the invention, the object of the invention can be achieved also by providing a vertical and trench type insulated gate MOS semiconductor device as a device including:

a first conductivity type semiconductor substrate;

a second conductivity type channel region selectively formed on one of the principal surfaces of the semiconductor substrate;

a first conductivity type emitter region selectively formed on the surface of the second conductivity type channel region;

a second conductivity type body region selectively formed on the surface of the second conductivity type channel region and having an impurity concentration higher than that of the second conductivity type channel region;

trenches each being formed to have a depth exceeding the depth of the second conductivity type channel region from the surface of the semiconductor substrate, and arranged in parallel to be formed in a parallel-stripes-like surface pattern;

a polysilicon gate electrode buried in each of the trenches with a gate insulator film, formed on the sidewall of the trench, interposed between;

an emitter electrode making contact with the surfaces of the first conductivity type emitter region, the second conductivity type body region and the second conductivity type channel region in a contact region, the contact region being provided between the trenches as a region including the surfaces of a portion of the first conductivity type emitter region, a portion of the second conductivity type body region and a portion of the second conductivity type channel region;

a collector layer formed on the other principal surface of the first conductivity type semiconductor substrate; and a collector electrode making contact with the surface of the collector layer, on the one of the surfaces of the first conductivity type semiconductor substrate, the surfaces of the second conductivity type channel regions and the surfaces of portions of the first conductivity type semiconductor substrate being arranged so as to alternately appear in the longitudinal direction of the trench between the trenches arranged in parallel, the first conductivity type emitter region selectively formed on the surface of the second conductivity type channel region having a surface shape of being wide on the side of the trench and becoming narrow on the side of the center between the trenches, and the second conductivity type body region having a length in the longitudinal direction of the trench longer than the length of the first conductivity type emitter region in the longitudinal direction of the trench.

According to an eighth aspect of the invention, the object of the invention can be achieved by providing a vertical and trench type insulated gate MOS semiconductor device as a device including:

a first conductivity type semiconductor substrate;

a second conductivity type channel region selectively formed on one of the principal surfaces of the semiconductor substrate;

a first conductivity type emitter region selectively formed on the surface of the second conductivity type channel region;

a second conductivity type body region selectively formed on the surface of the second conductivity type channel region and having an impurity concentration higher than that of the second conductivity type channel region;

trenches each being formed to have a depth exceeding the depth of the second conductivity type channel region from the surface of the semiconductor substrate, and arranged in parallel to be formed in a parallel-stripes-like surface pattern;

a polysilicon gate electrode buried in each of the trenches with a gate insulator film, formed on the sidewall of the trench, interposed between;

an emitter electrode making contact with the surfaces of the first conductivity type emitter region, the second conductivity type body region and the second conductivity type channel region in a contact region, the contact region being provided between the trenches as a region including the surfaces of a portion of the first conductivity type emitter region, a portion of the second conductivity type body region and a portion of the second conductivity type channel region;

a collector layer formed on the other principal surface of the first conductivity type semiconductor substrate; and a collector electrode making contact with the surface of the collector layer, on the one of the surfaces of the first conductivity type semiconductor substrate, the surfaces of the second conductivity type channel regions and the surfaces of portions of the first conductivity type semiconductor substrate being arranged so as to alternately appear in the longitudinal direction of the trench between the trenches arranged in parallel, and the contact region having a length in the longitudinal direction of the trench longer than the length of the first conductivity type emitter region in the longitudinal direction of the trench.

According to a ninth aspect of the invention, the object of the invention can be achieved also by providing a vertical and trench type insulated gate MOS semiconductor device as a device including:

a first conductivity type semiconductor substrate;

a second conductivity type channel region selectively formed on one of the principal surfaces of the semiconductor substrate;

a first conductivity type emitter region selectively formed on the surface of the second conductivity type channel region;

a second conductivity type body region selectively formed on the surface of the second conductivity type channel region and having an impurity concentration higher than that of the second conductivity type channel region;

trenches each being formed to have a depth exceeding the depth of the second conductivity type channel region from the surface of the semiconductor substrate, and arranged in parallel to be formed in a parallel-stripes-like surface pattern;

a polysilicon gate electrode buried in each of the trenches with a gate insulator film, formed on the sidewall of the trench, interposed between;

an emitter electrode making contact with the surfaces of the first conductivity type emitter region, the second conductivity type body region and the second conductivity type channel region in a contact region, the contact region being provided between the trenches as a region including the surfaces of a portion of the first conductivity type emitter region, a portion of the second conductivity type body region and a portion of the second conductivity type channel region;

a collector layer formed on the other principal surface of the first conductivity type semiconductor substrate; and a collector electrode making contact with the surface of the collector layer, on the one of the surfaces of the first conductivity type semiconductor substrate, the surfaces of the second conductivity type channel regions and the surfaces of portions of the first conductivity type semiconductor substrate being arranged so as to alternately appear in the longitudinal direction of the trench between the trenches arranged in parallel, and the second conductivity type body region having a length in the longitudinal direction of the trench longer than the length of the first conductivity type emitter region in the longitudinal direction of the trench.

According to the invention explained above, a vertical and trench type insulated gate MOS semiconductor device can be provided which can achieve lowered on-resistance and enhancement in turn-off capability.

BRIEF DESCRIPTION OF THE DRAWINGS

The foregoing advantages and features of the invention will become apparent upon reference to the following detailed description and the accompanying drawings, of which:

FIG. 11-1 is a cross sectional view taken on line A-A of FIG. 10;

FIG. 11-2 is a cross sectional view taken on line B-B of FIG. 10;

FIG. 11-3 is a cross sectional view taken on line C-C of FIG. 10;

FIG. 19-1B is a partially cutaway plan view showing the silicon substrate in the step shown in FIG. 19-1A with a resist mask provided thereon for forming the $p^+$-type body regions;

FIG. 19-2A is a cross sectional view showing a principal part of the silicon substrate in the step in which trenches each with a gate electrode buried therein, p-type channel regions, $p^+$-type body regions and an oxide film are formed on the top surface side the substrate in the manufacturing process of a vertical IGBT according to Example 9 of the invention;

FIG. 19-2B is a partially cutaway plan view showing the silicon substrate in the step shown in FIG. 19-2A with a resist mask provided thereon for forming the $p^+$-type body regions;

FIG. 20-1A is a cross sectional view showing the principal part of the silicon substrate in the step in which $n^+$-type emitter regions are formed on the top surface side thereof in the manufacturing process of the vertical IGBT according to Example 4 of the invention;

FIG. 20-1B is a partially cutaway plan view showing the silicon substrate in the step shown in FIG. 20-1A with a resist mask provided thereon for forming the $n^+$-type emitter regions;

FIG. 20-2A is a cross sectional view showing the principal part of the silicon substrate in the step in which $n^+$-type emitter regions are formed on the top surface side thereof in the manufacturing process of the vertical IGBT according to Example 9 of the invention;

FIG. 20-2B is a partially cutaway plan view showing the silicon substrate in the step shown in FIG. 20-2A with a resist mask provided thereon for forming the $n^+$-type emitter regions;

FIG. 23-1 is an enlarged plan view showing a unit cell region of the vertical IGBT according to Example 4 of the invention;

FIG. 23-2 is an enlarged plan view showing hole current paths in the unit cell region of the vertical IGBT according to Example 4 of the invention shown in FIG. 23-1;

FIG. 30-1 is an enlarged plan view showing a unit cell region of the vertical IGBT according to Example 9 of the invention;

FIG. 30-2 is an enlarged plan view showing hole current paths in the unit cell region of the vertical IGBT according to Example 9 of the invention shown in FIG. 30-1;

DETAILED DESCRIPTION OF SPECIFIC EMBODIMENTS

In the following, detailed explanations will be provided for a vertical IGBT as a vertical and trench type insulated gate MOS semiconductor device according to the invention by using attached drawings. The invention, unless it departs from the spirit and the scope thereof, is not limited to the descriptions of examples that will be explained below.

Figure 1:
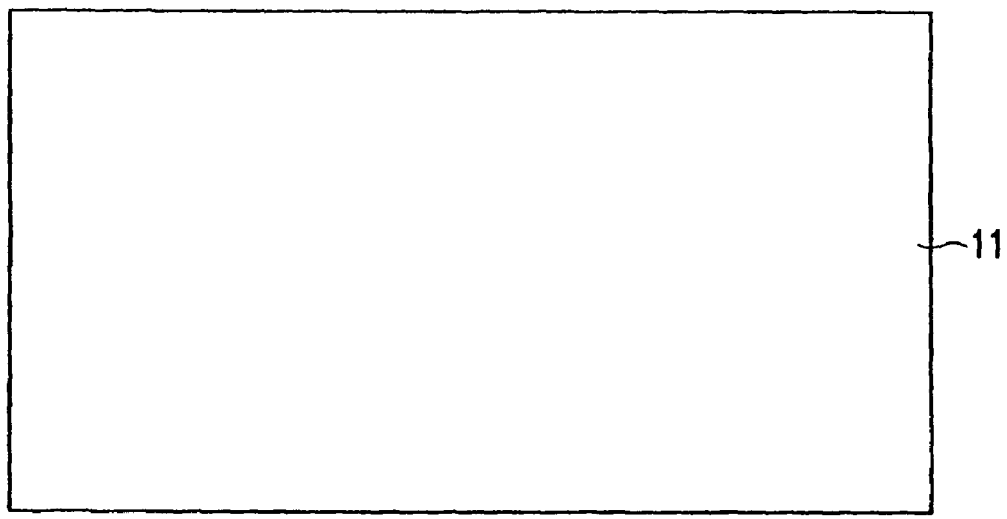
FIG. 1 is a cross sectional view showing the principal part of a silicon substrate in the step of being prepared in the manufacturing process of a vertical IGBT according to Example 1 of the invention.
Figure 2:
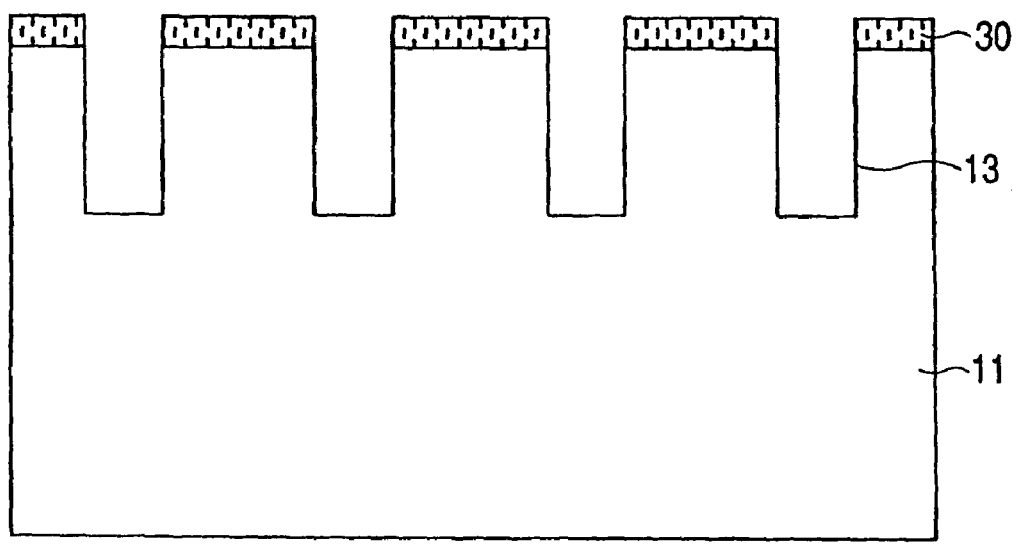
FIG. 2 is a cross sectional view showing the principal part of the silicon substrate in a state in which trenches are formed therein in the step subsequent to the step shown in FIG. 1.
Figure 13:
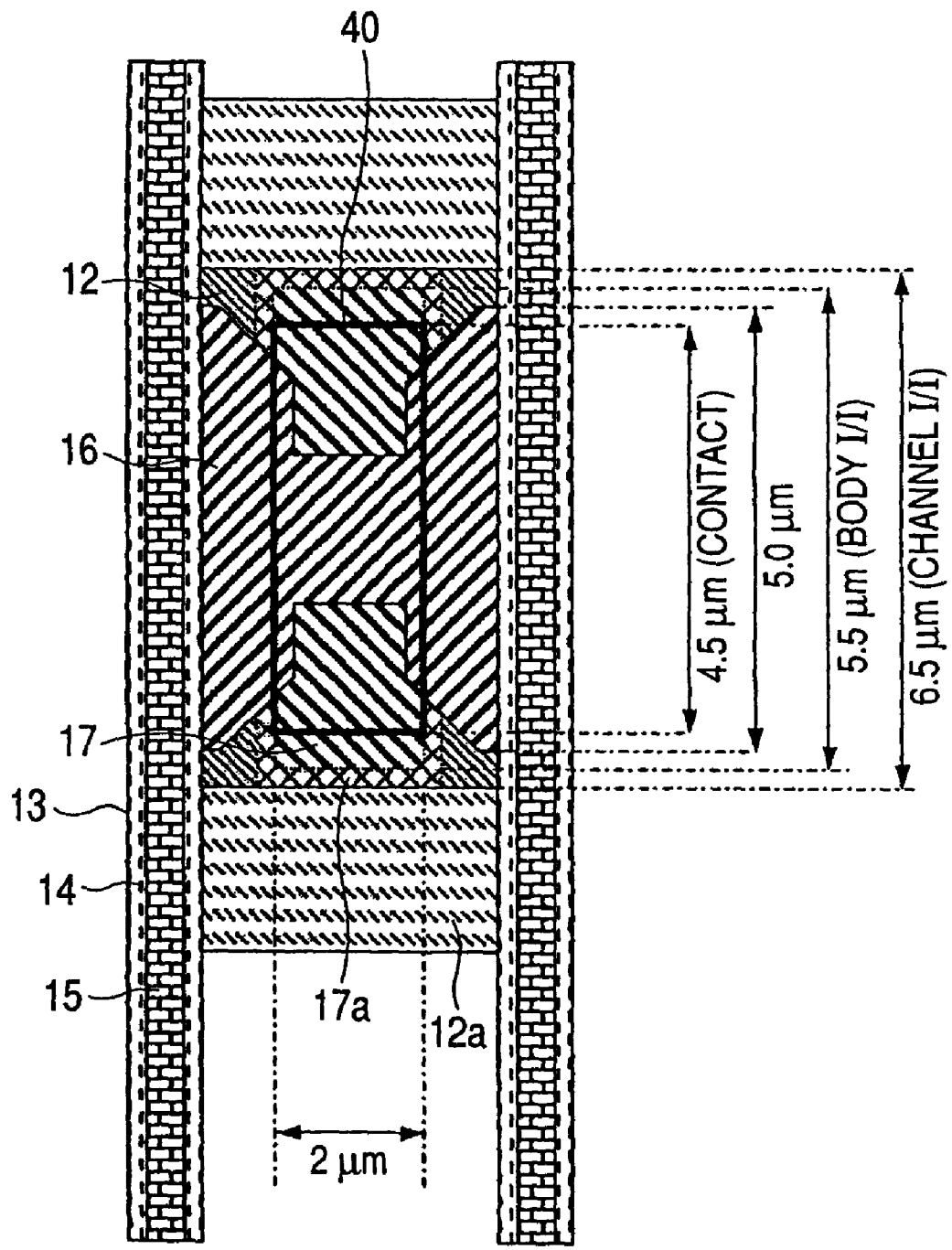
FIG. 13 is an enlarged plan view showing a unit cell region of the vertical IGBT according to Example 1 of the invention.
Figure 14:
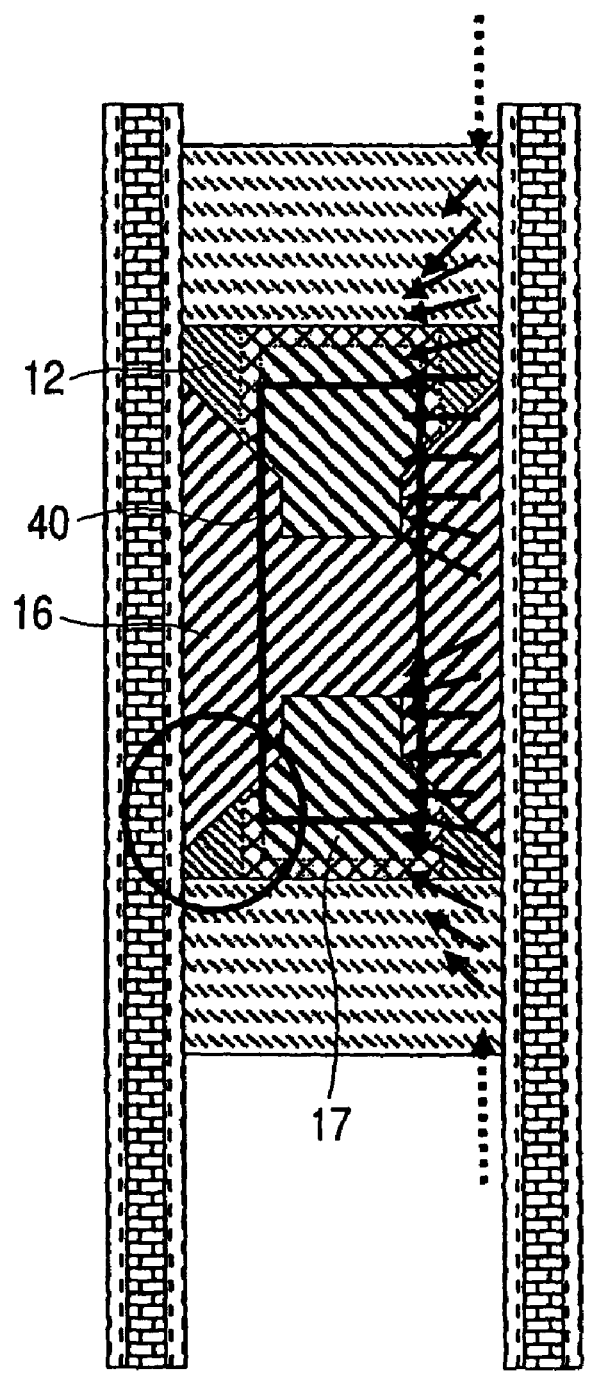
FIG. 14 is an enlarged plan view showing hole current paths in the unit cell region of the vertical IGBT according to Example 1 of the invention shown in FIG. 13.
Figure 15:
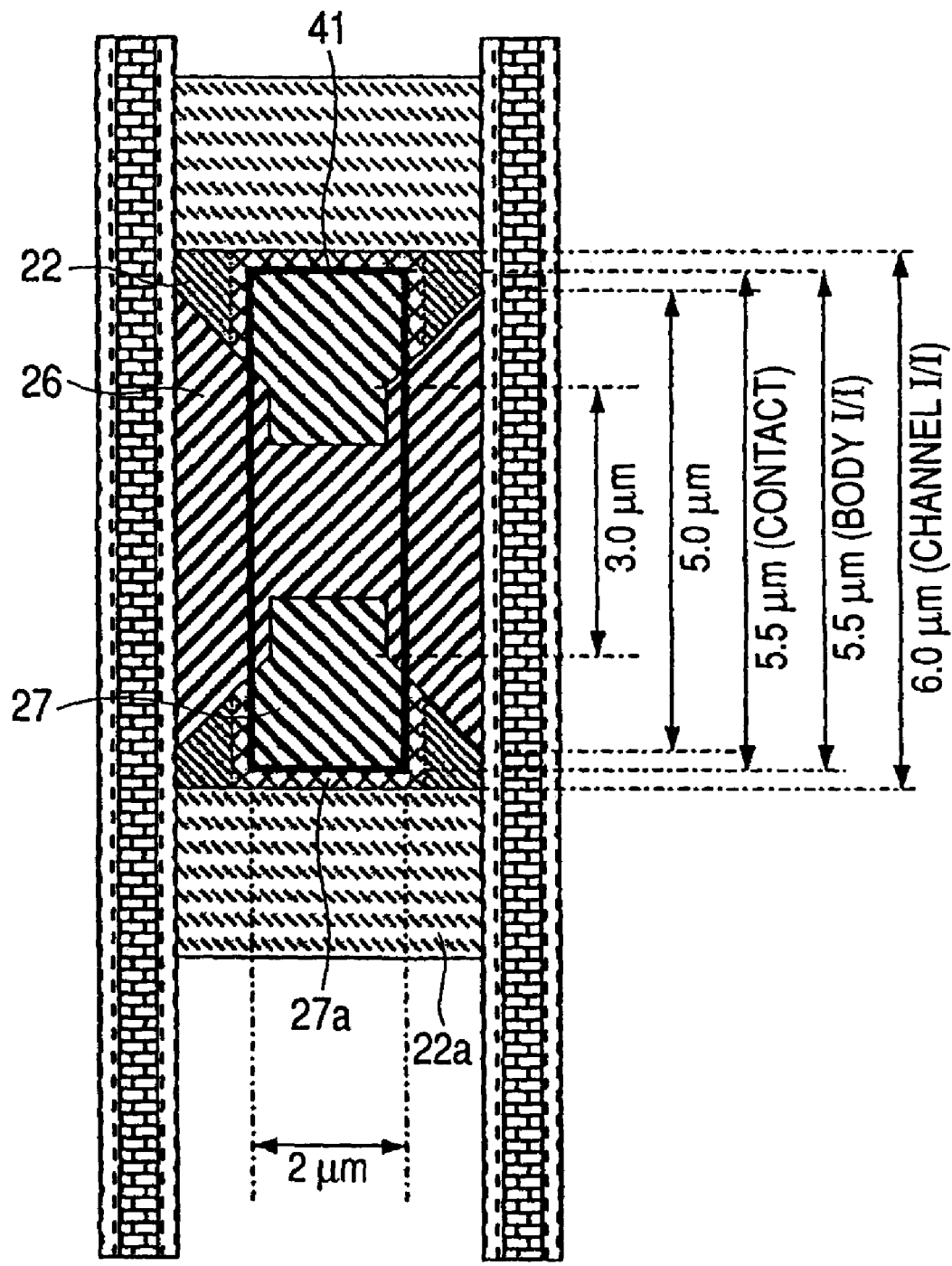
FIG. 15 is an enlarged plan view showing a unit cell region of a vertical IGBT according to Example 2 of the invention.
Figure 16:
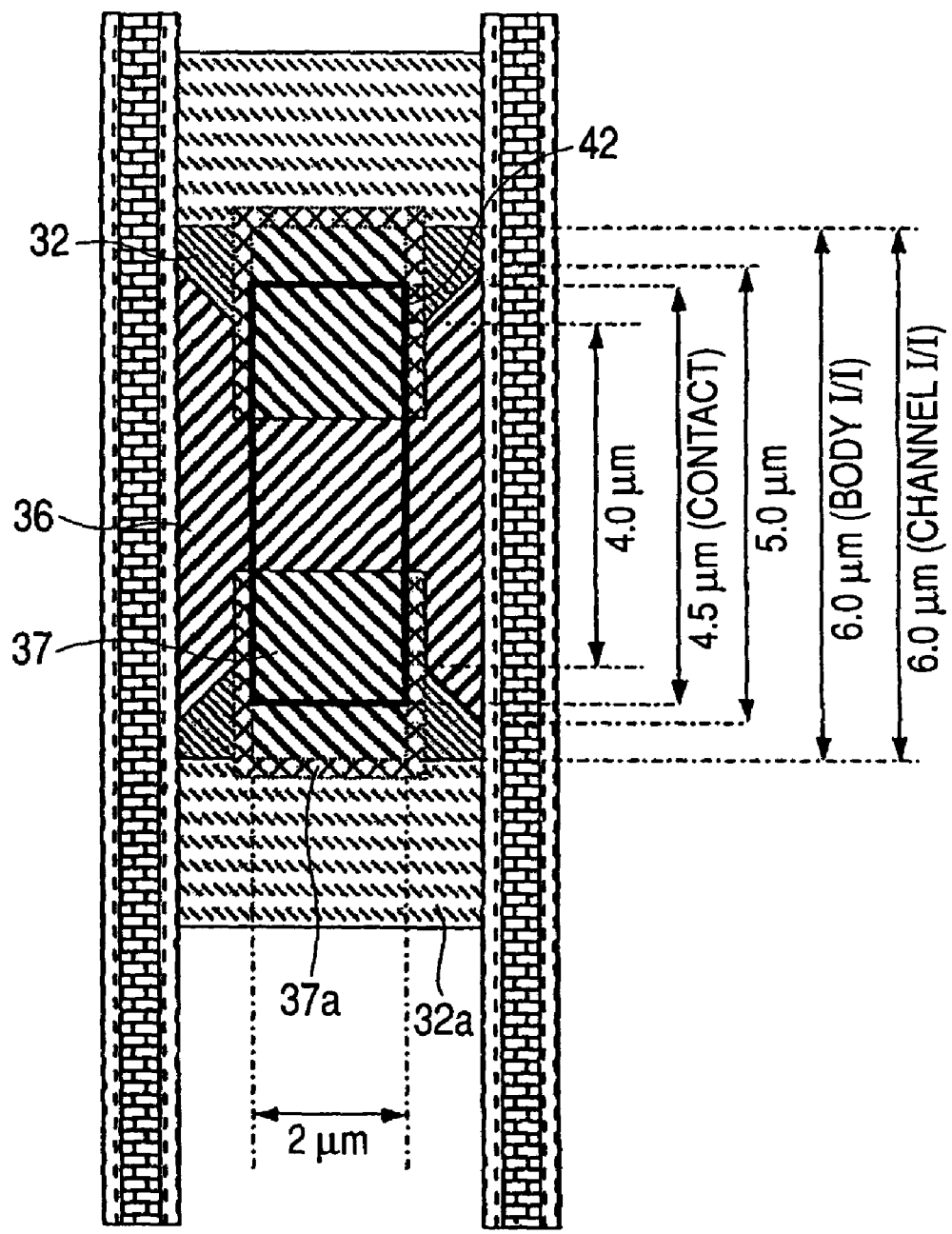
FIG. 16 is an enlarged plan view showing a unit cell region of a vertical IGBT according to Example 3 of the invention.
Figure 17:
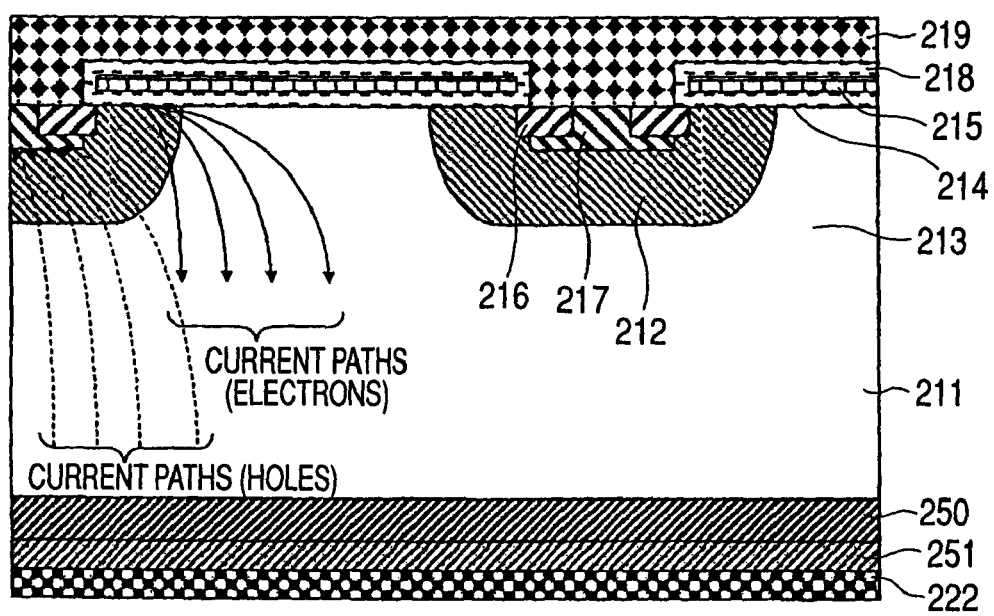
FIG. 17 is a cross sectional view showing a principal part of a related planar type IGBT.
Figure 18A:
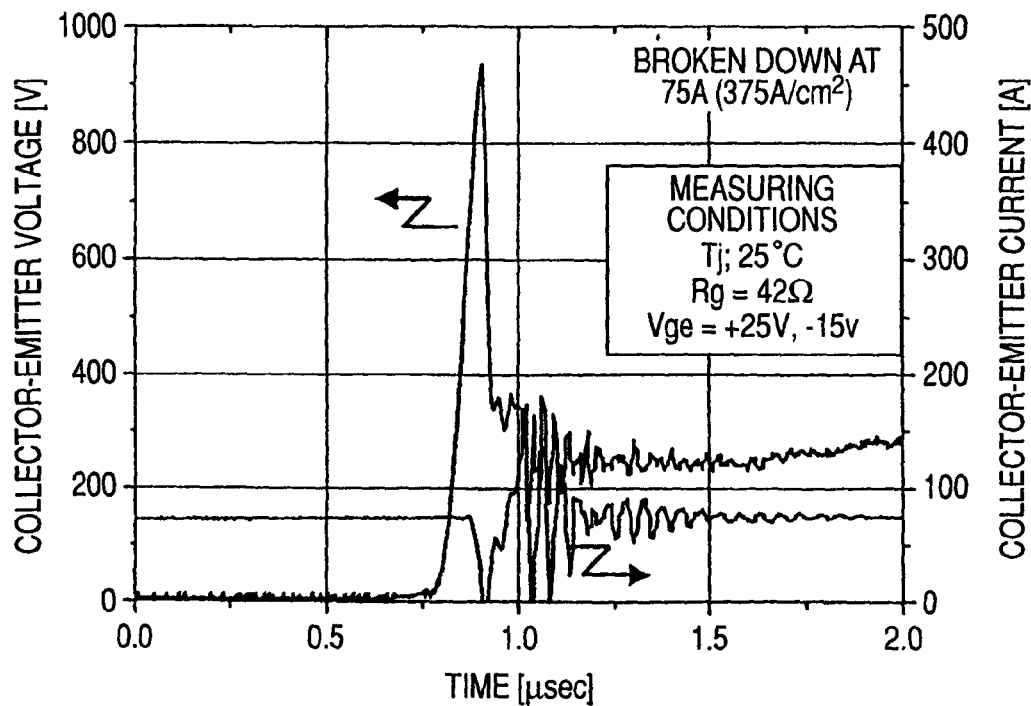
FIG. 18A is a diagram showing waveforms of a related vertical and trench type IGBT shown in FIG. 12 at turning-off.
Figure 18B:
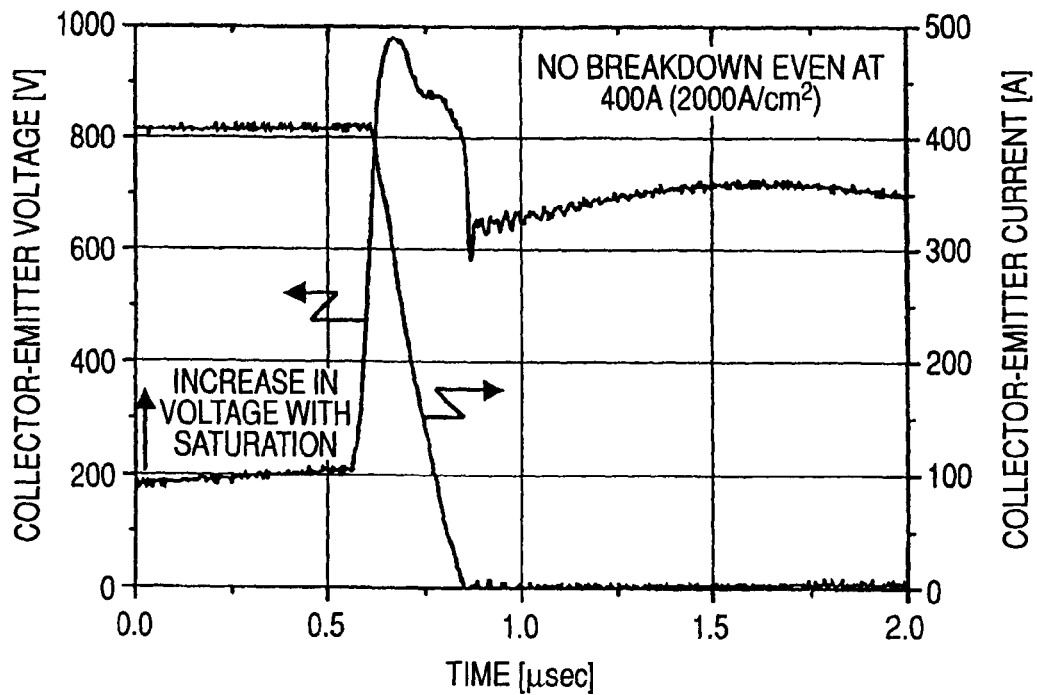
FIG. 18B is a diagram showing waveforms of the vertical and trench type IGBT according to Example 4 at turning-off.
Figure 21A:
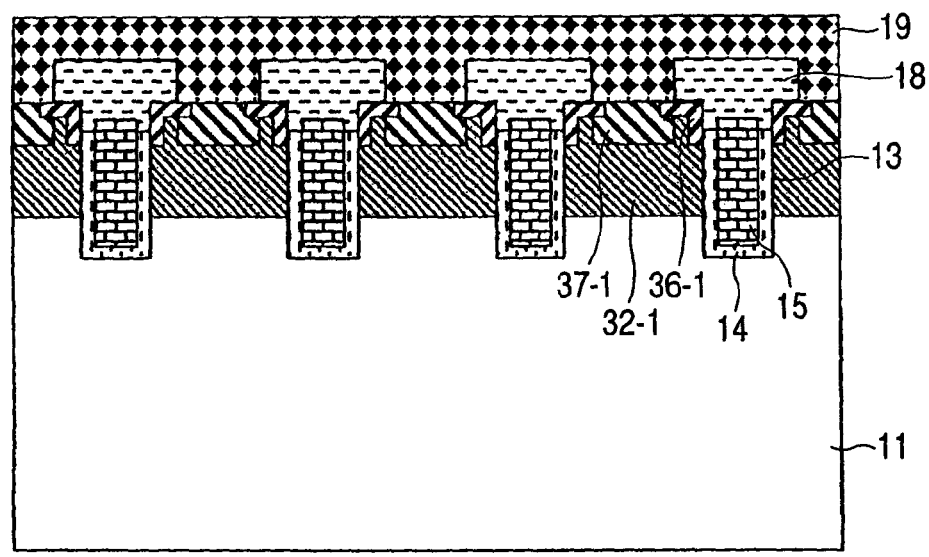
FIG. 21A is a cross sectional view showing the principal part of the silicon substrate in the step in which an interlayer insulator film is deposited on the whole surface of the silicon substrate, contact regions are opened in the interlayer insulator film and an emitter electrode is formed on the whole surface in the manufacturing process of the vertical IGBT according to Example 4 of the invention.
Figure 21B:
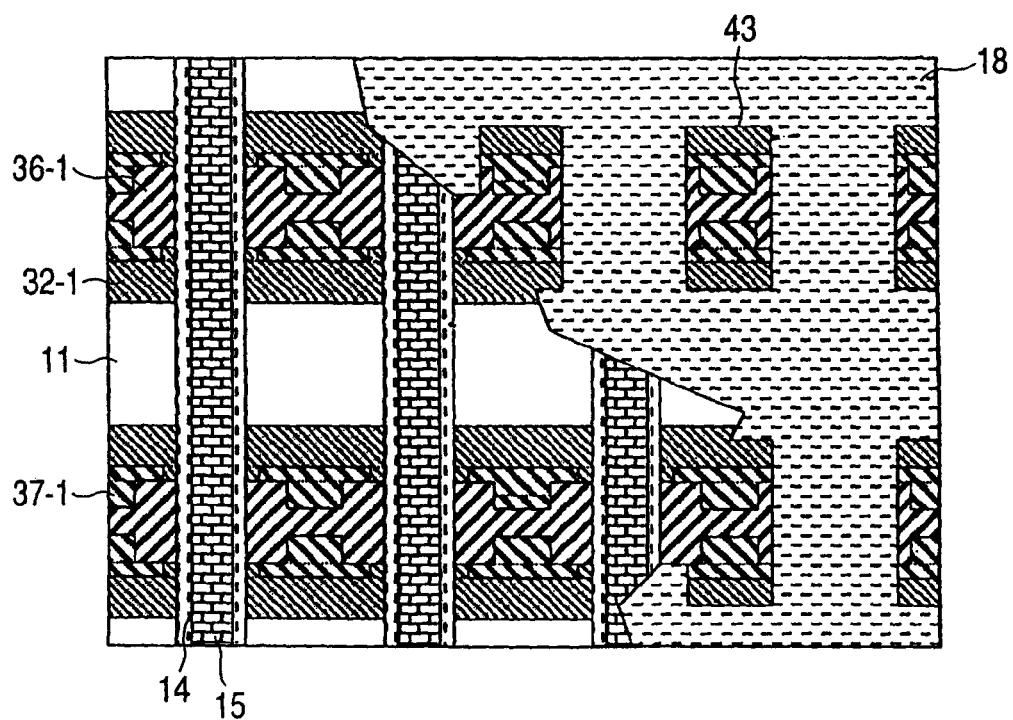
FIG. 21B is a partially cutaway plan view showing the silicon substrate in the step shown in FIG. 21A.
Figure 22:
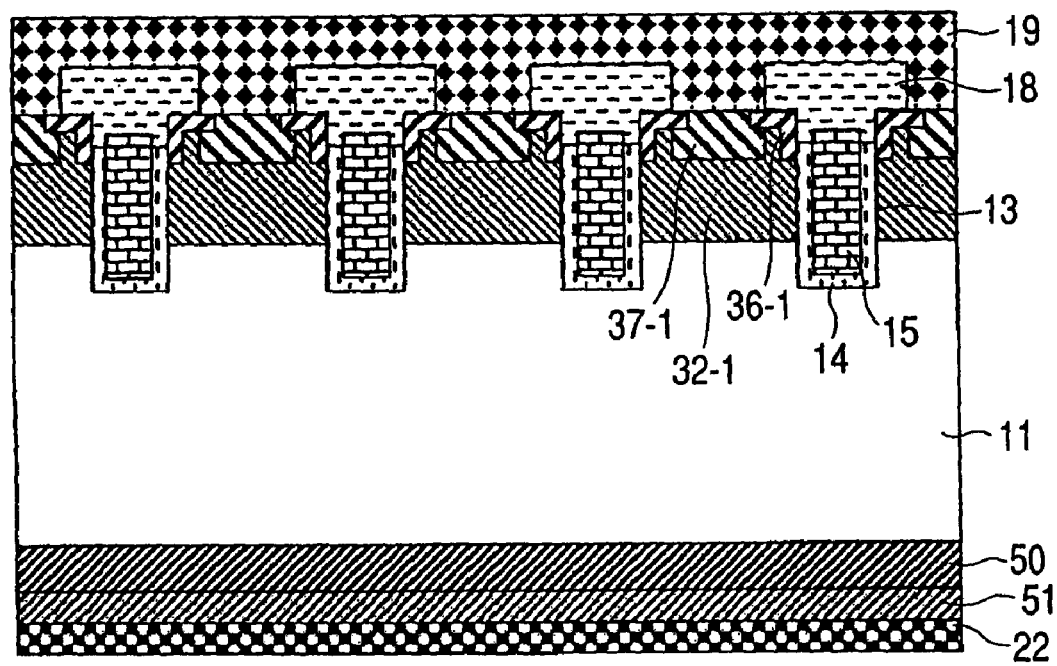
FIG. 22 is a cross sectional view showing the principal part of the silicon substrate in the step in which an $n^+$-type buffer layer, a $p^+$-type collector layer and a collector electrode are formed in the step subsequent to the step shown in FIGS. 21A and 21B to complete the vertical IGBT in a wafer stage in the manufacturing process of the vertical IGBT according to Example 4 of the invention.
Figures 1, 23:
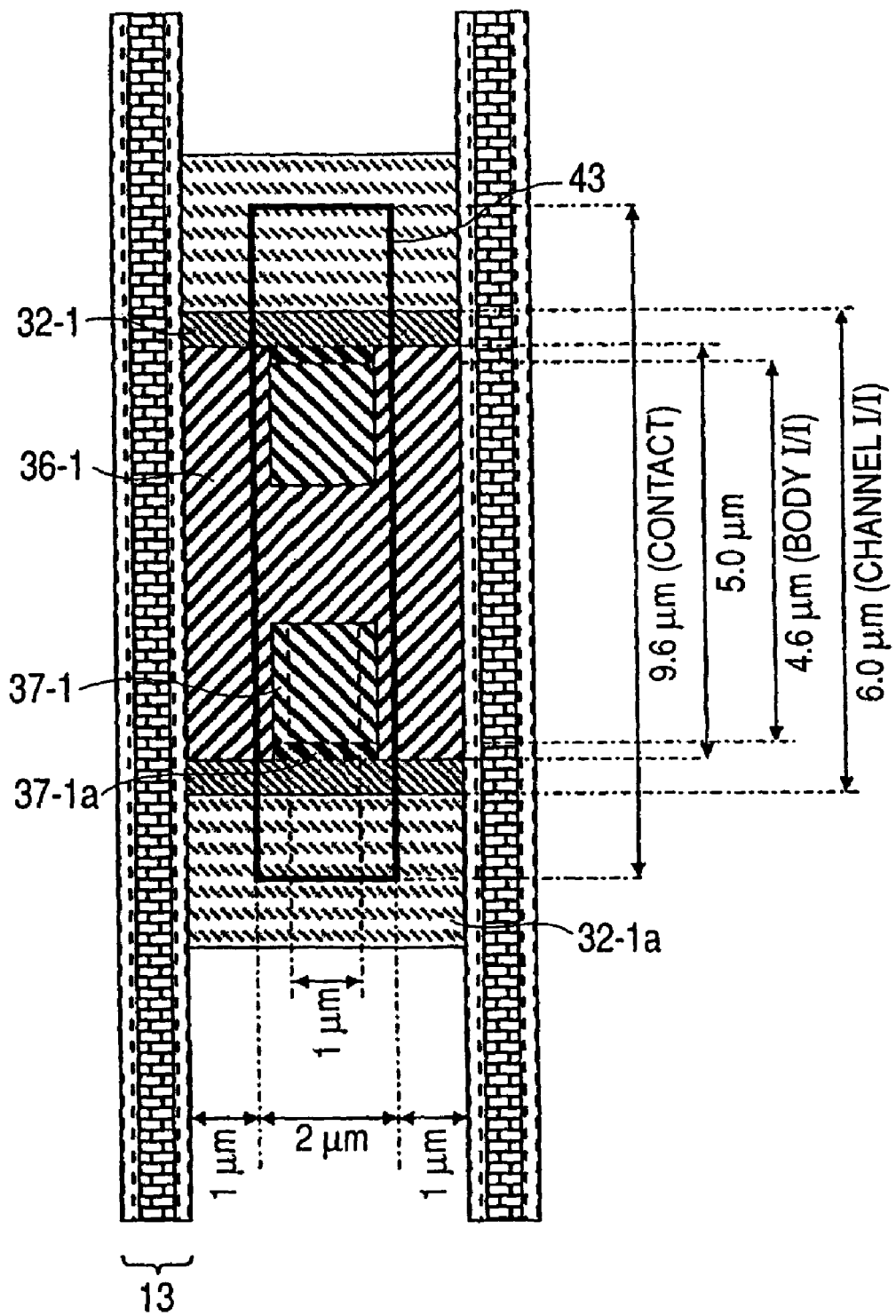
Figures 2, 23:
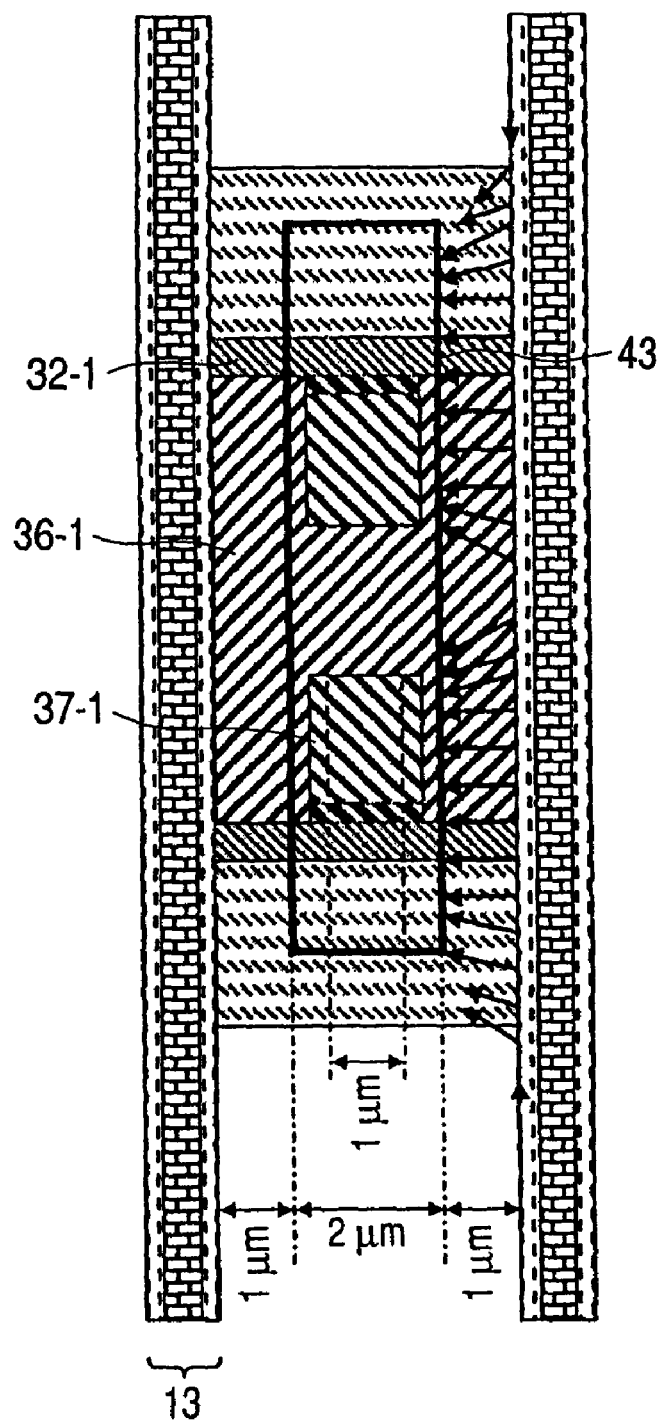
Figure 29:
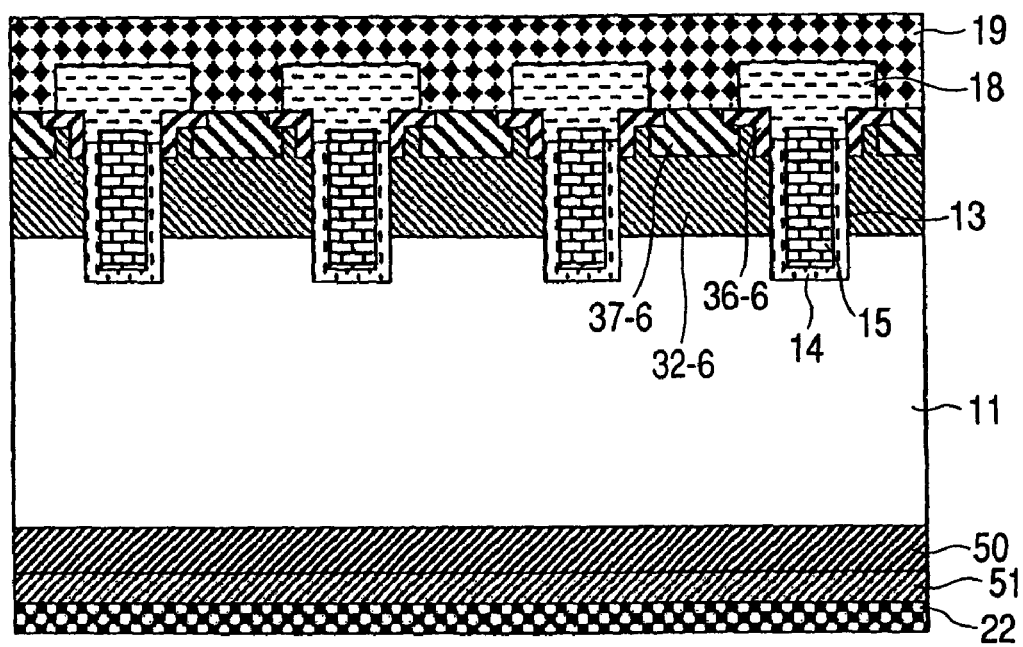
FIG. 29 is a cross sectional view showing the principal part of the silicon substrate in the step in which an n$^+$-type buffer layer, a p$^+$-type collector layer and a collector electrode are formed in the step subsequent to the step shown in FIGS. 28A and 28B to complete the vertical IGBT in a wafer stage in the manufacturing process of the vertical IGBT according to Example 9 of the invention.
Figures 1, 30:
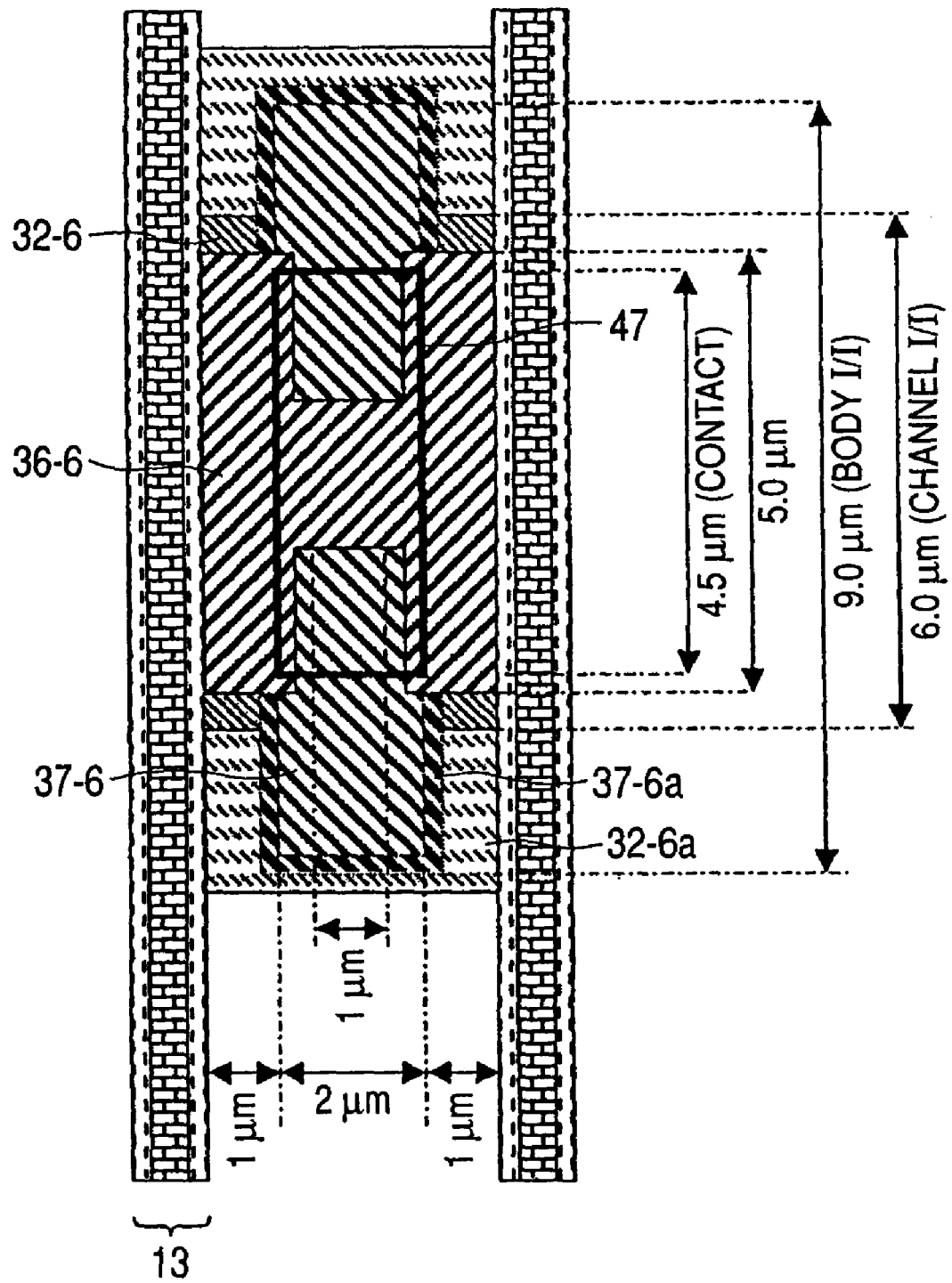
Figures 2, 30:
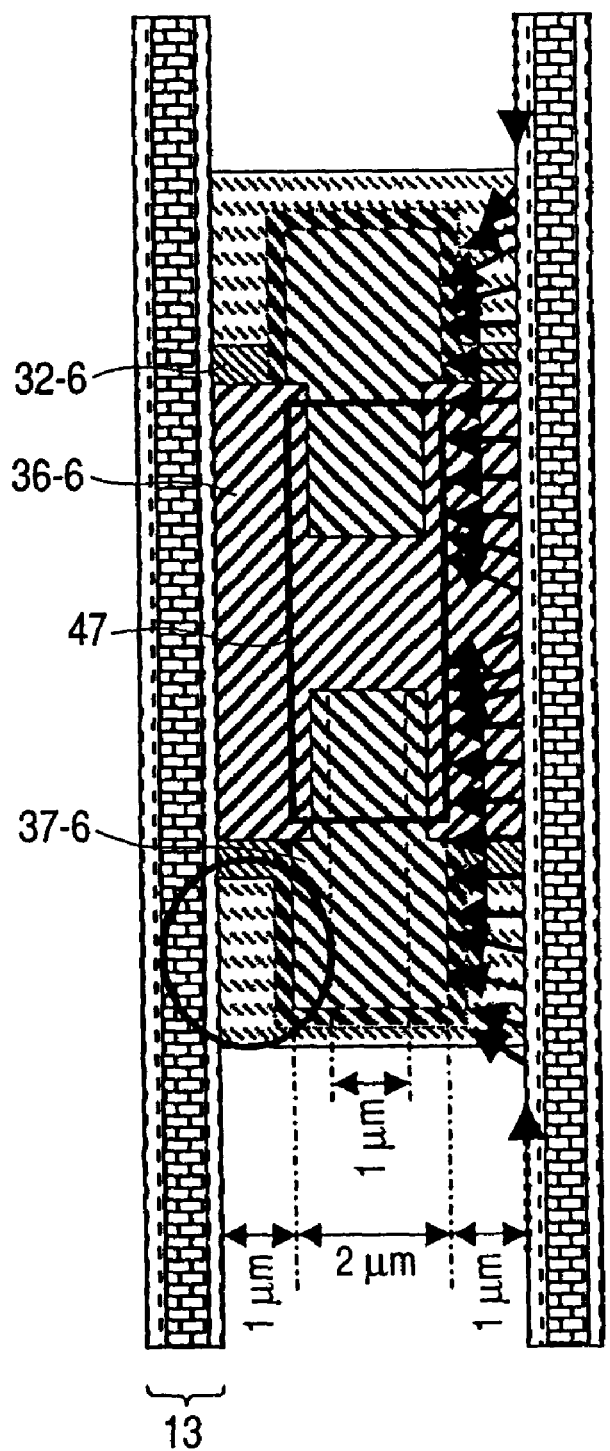
Figure 31:
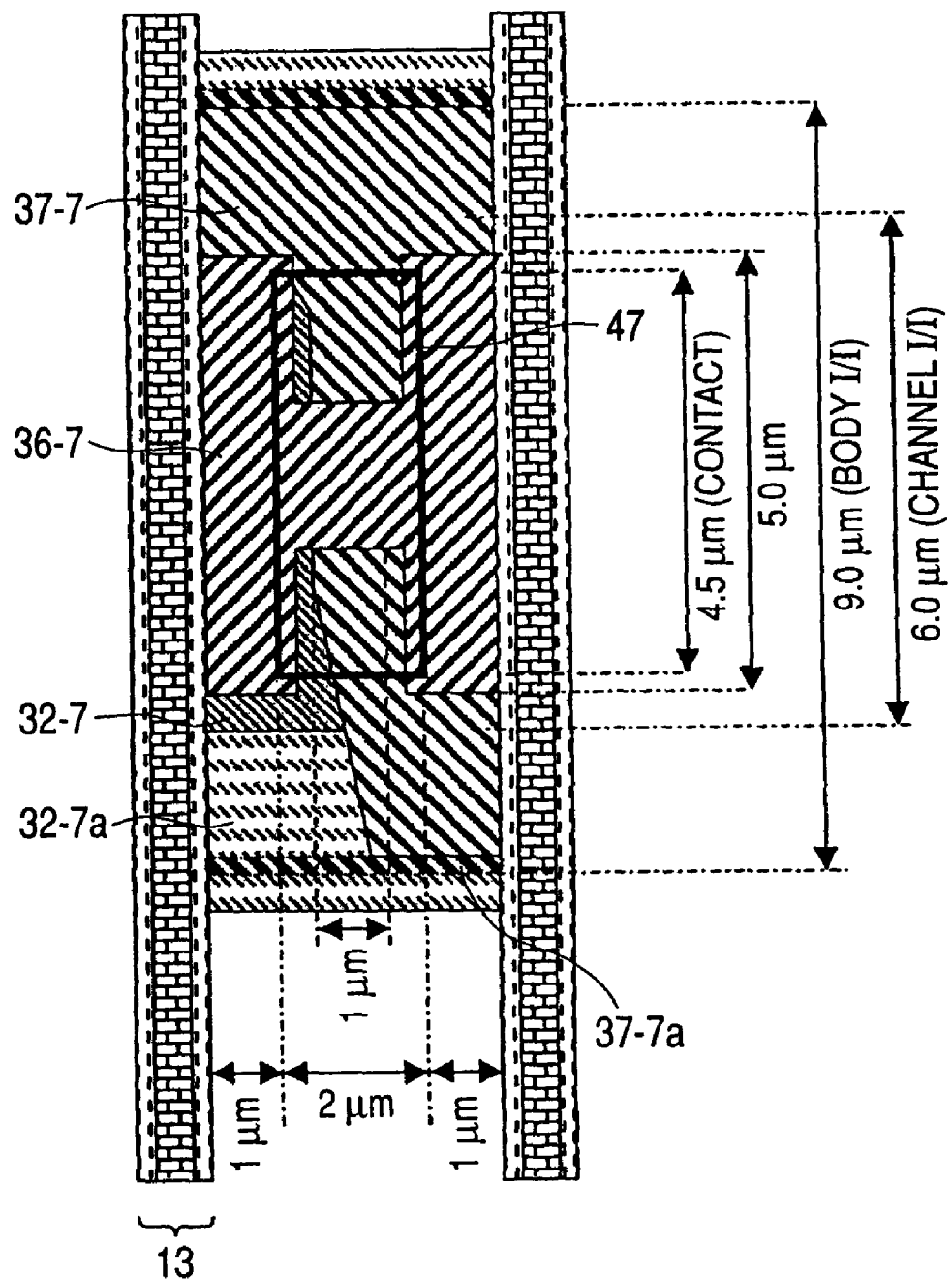
FIG. 31 is an enlarged plan view showing a unit cell region of a vertical IGBT according to Example 10 of the invention.
Figure 32:
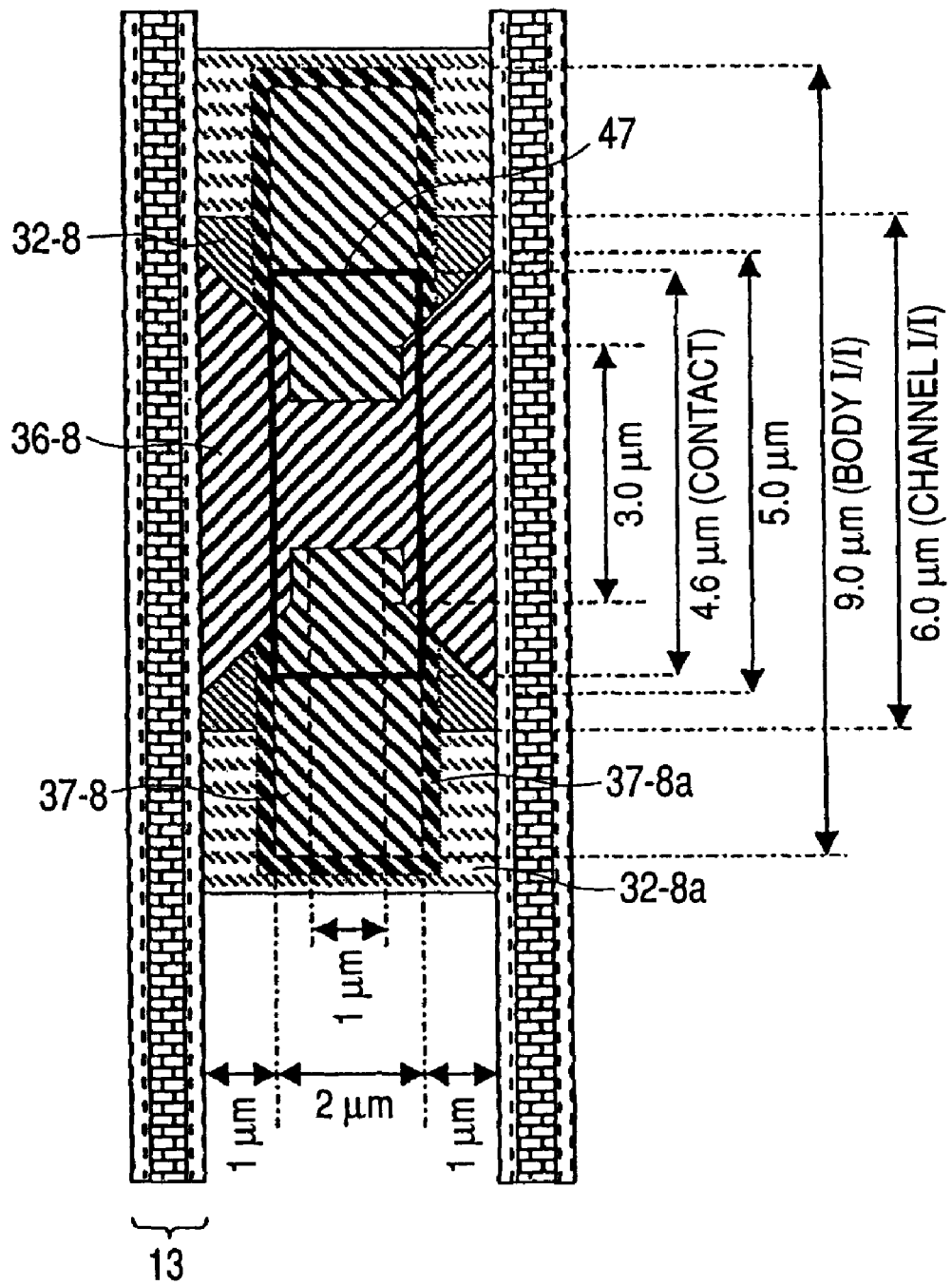
FIG. 32 is an enlarged plan view showing a unit cell region of a vertical IGBT according to Example 11 of the invention.
Figure 33:
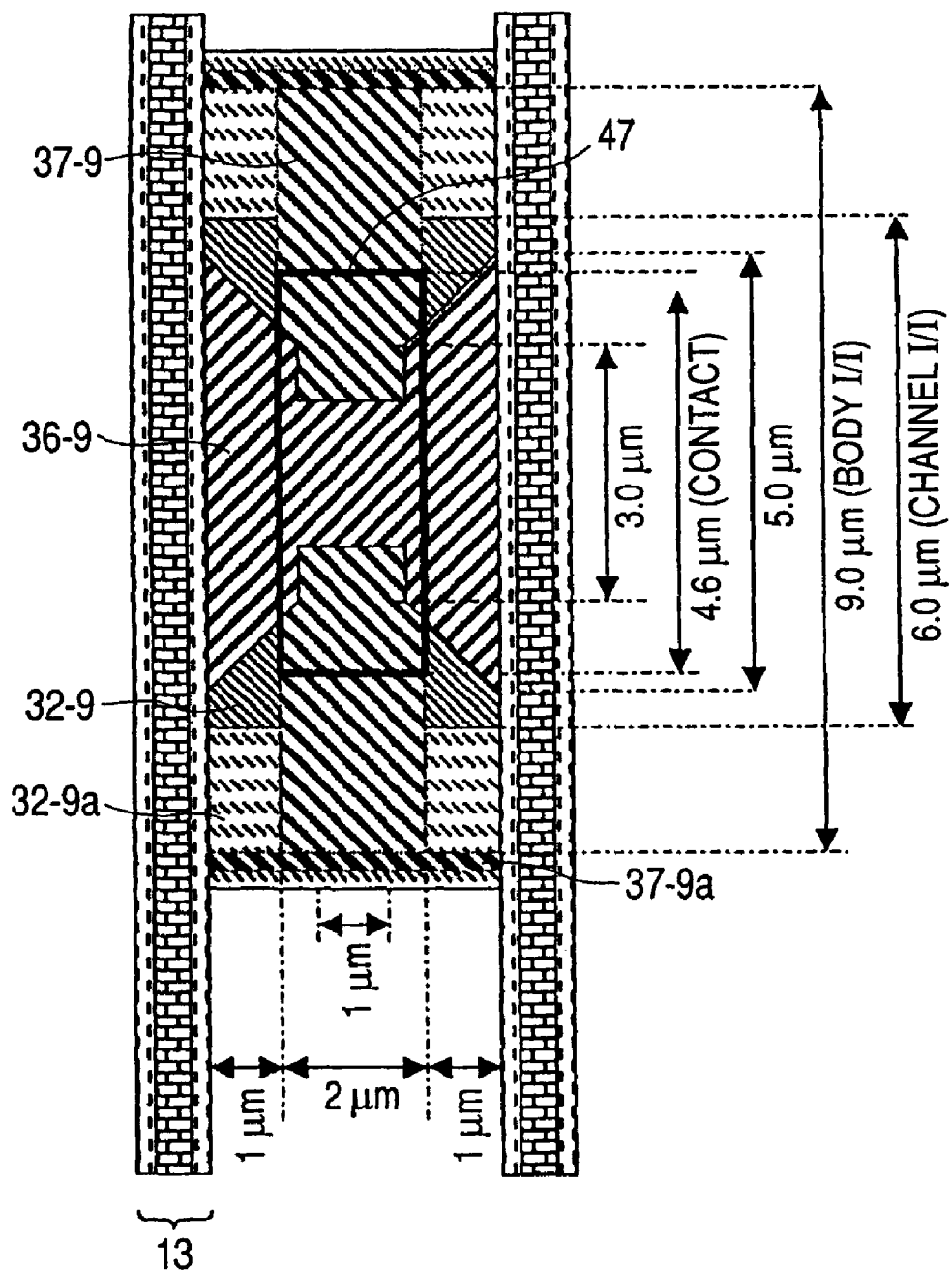
FIG. 33 is an enlarged plan view showing a unit cell region of a vertical IGBT according to Example 12 of the invention.

FIG. 1 to FIG. 9 are cross sectional views showing the principal part of a semiconductor substrate in the order of manufacturing steps in a manufacturing process of a vertical IGBT according to Example 1 of the invention together with partially given plan views. FIG. 13 is an enlarged plan view showing a unit cell region of the vertical IGBT according to Example 1 of the invention. FIG. 14 is an enlarged plan view showing hole current paths in the unit cell region of the vertical IGBT according to Example 1 of the invention shown in FIG. 13. FIG. 15 is an enlarged plan view showing a unit cell region of a vertical IGBT according to Example 2 of the invention. FIG. 16 is an enlarged plan view showing a unit cell region of a vertical IGBT according to Example 3 of the invention. FIGS. 18A and 18B are diagrams showing waveforms of a related vertical and trench type IGBT and the vertical and trench type IGBT according to Example 4 of the invention, respectively, at turning-off. FIG. 19-1A, FIG. 20-1A, FIG. 21A and FIG. 22 are cross sectional views showing the principal part of a semiconductor substrate of a vertical IGBT according to Example 4 of the invention, and showing manufacturing steps that differ from those of the IGBT according to Example 1 in a manufacturing process according to Example 4, together with plan views shown in FIG. 19-1B, FIG. 20-1B and FIG. 21B. FIG. 23-1 is an enlarged plan view showing a unit cell region of the vertical IGBT according to Example 4 of the invention. FIG. 23-2 is an enlarged plan view showing hole current paths in the unit cell region of the vertical IGBT according to Example 4 of the invention shown in FIG. 23-1. FIG. 24 to FIG. 27 are enlarged plan views showing the respective unit cell regions of the vertical IGBTs according to Example 5 to Example 8, respectively, of the invention. FIG. 19-2A, FIG. 20-2A, FIG. 28A and FIG. 29 are cross sectional views showing the principal part of a semiconductor substrate of a vertical IGBT according to Example 9 of the invention in the order about manufacturing steps different from those of the IGBT according to Example 1 in a manufacturing process according to Example 9 together with plan views shown in FIG. 19-2B, FIG. 20-2B and FIG. 28B. FIG. 30-1 is an enlarged plan view showing a unit cell region of the vertical IGBT according to Example 9 of the invention. FIG. 30-2 is an enlarged plan view showing hole current paths in the unit cell region of the vertical IGBT according to Example 9 of the invention shown in FIG. 30-1. FIG. 31 to FIG. 33 are enlarged plan views showing respective unit cell regions of the vertical IGBTs according to Example 10 to Example 12, respectively, of the invention.

Example 1

In the following, Example 1 of the vertical and trench type insulated gate MOS semiconductor device according to the invention will be explained with reference to FIG. 1 to FIG. 9, FIG. 13 and FIG. 14. In Example 1, a vertical IGBT with a breakdown voltage of 600V is taken as an example of a power vertical and trench type insulated gate MOS semiconductor device and its manufacturing process will be explained.

As in a related device, $n^-$-type silicon substrate 11 is prepared as shown in FIG. 1. $N^-$-type silicon substrate 11 has an $n^-$-region that becomes a base region on the surface thereof whose direction of crystal plane is (100) and has a resistivity of 30 Ωcm. On the surface of $n^-$-type silicon substrate 11, a resist pattern is formed for forming a guard ring (a kind of a voltage blocking structure with a function of reducing electric field strength on a surface—not shown), p-type impurity ions are implanted, and heat treatment is carried out after the resist is removed. Thus, a guard ring layer (not shown) is formed around a chip. At the heat treatment, oxide film 30 shown in FIG. 2 is formed, in which openings are formed by carrying out a photolithography process.

As shown in FIG. 2, using oxide film 30 as a mask, $n^-$-type silicon substrate 11 is subjected to etching, by which trenches 13 are formed. In Example 1, trenches 13 were formed by providing openings each with a width of 0.8 μm at 5 μm intervals in oxide film 30 and carrying out anisotropic RIE (Reactive Ion Etching). For removing an inside surface defect layer formed in each trench 13 accompanied by the formation thereof in $n^-$-type silicon substrate 11, a sacrifice oxide film not shown is first formed inside of each trench 13 by oxidation processing. Next, by removing the sacrificial oxide film, the inside face defect layer is removed. Then, all of the oxide films in each of the unit cell regions are removed and oxide film 14 with a film thickness of 80 to 120 nm is thereafter newly formed over the top surface of $n^-$-type silicon substrate 11 and the inside of each trench 13 as shown in FIG. 3.

Figure 3:
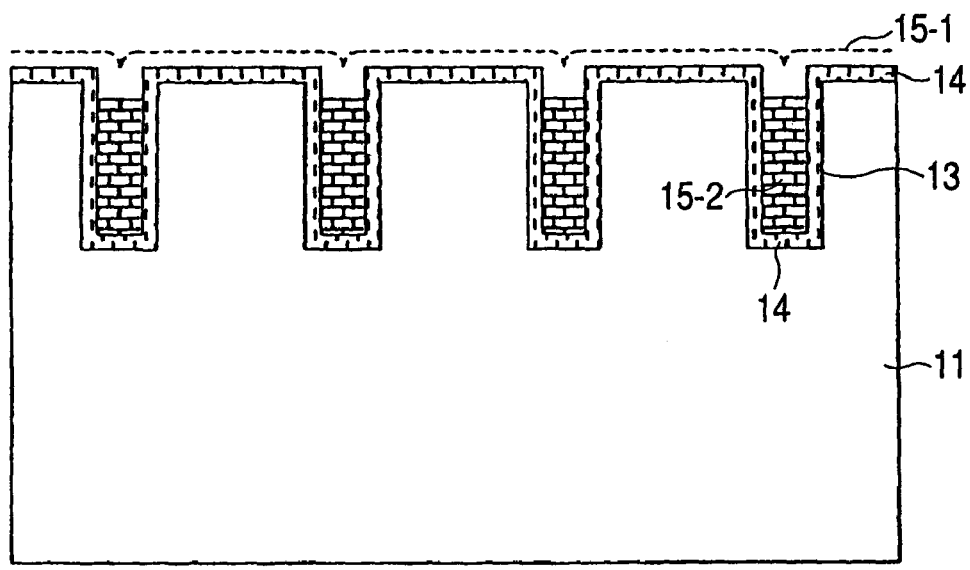
FIG. 3 is a cross sectional view showing the principal part of the silicon substrate in a state in which an oxide film is formed on the top surface of the substrate and inside each of the trenches and a gate electrode is buried in each of the trenches in the step subsequent to the step shown in FIG. 2.

Next, as shown by a broken line in FIG. 3, conductive polycrystalline silicon film 15-1 with a film thickness of 0.5 to 1.0 μm and doped with impurity atoms such as phosphorus atoms or boron atoms is deposited on the whole surface of $n^-$-type silicon substrate 11 and is also buried in each trench 13 as gate electrode 15-2 by a reduced pressure CVD method. Subsequently, etch back of doped polycrystalline silicon film 15-1 is carried out by anisotropic or isotropic gas etching. By stopping the etching of polycrystalline silicon film 15-1 at the step at which oxide film 14 is exposed on the top surface of $n^-$-type silicon substrate 11, gate electrode 15-2 is formed which is buried in each trench 13 as shown in FIG. 3. At this time, polycrystalline film 15-1 is subjected to etch back by an amount approximately equivalent to its deposited film thickness. Thus, gate electrode 15-2 is etched to a depth of the order of 100 to 150 nm from the top of trench 13. Hereinafter gate electrode 15-2 will be simply denoted by reference numeral 15.

Figure 4:
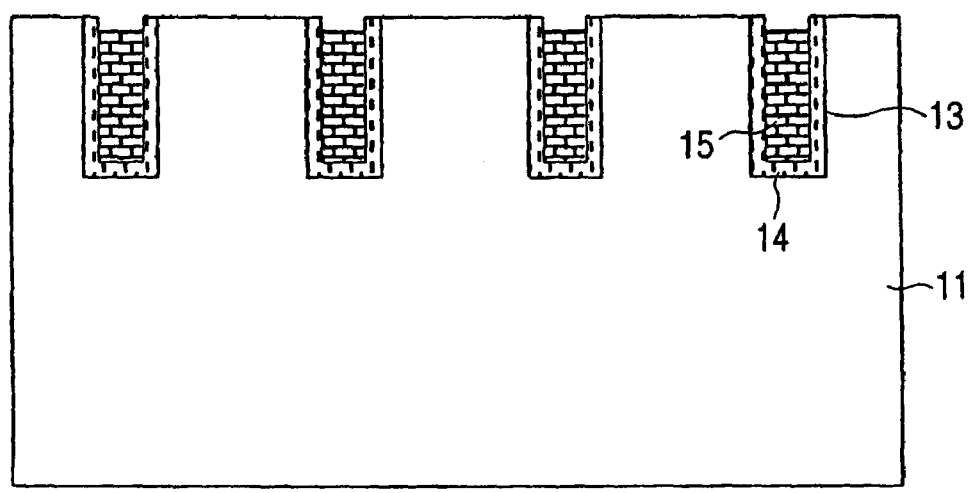
FIG. 4 is a cross sectional view showing the principal part of the silicon substrate in a state in which only the oxide film on the top surface of the substrate is removed in the step subsequent to the step shown in FIG. 3.

Then, as shown in FIG. 4, only oxide film 14 on the top surface side of $n^-$-type silicon substrate 11 is removed to expose the surface of $n^-$-type silicon substrate 11. At this time, the use of anisotropic etching is preferable as a method of removing oxide film 14 because oxide film 14 at the upper part of the sidewall of trench 13 is left as being thick without being etched. Furthermore, the surfaces, upon which ion implantation is carried out in the later process for forming p-type channel region 12, $p^+$-type body region 17 and $n^+$-type emitter region 16, are made flush with one another. In addition, p-type channel region 12 is formed after trenches 13 are formed. This enables the diffusion depth of p-type channel region 12 to be shallow. Further, boron atoms are conveniently prevented from being taken in oxide film 14 while the thermal oxide film is being formed.

Figure 5A:
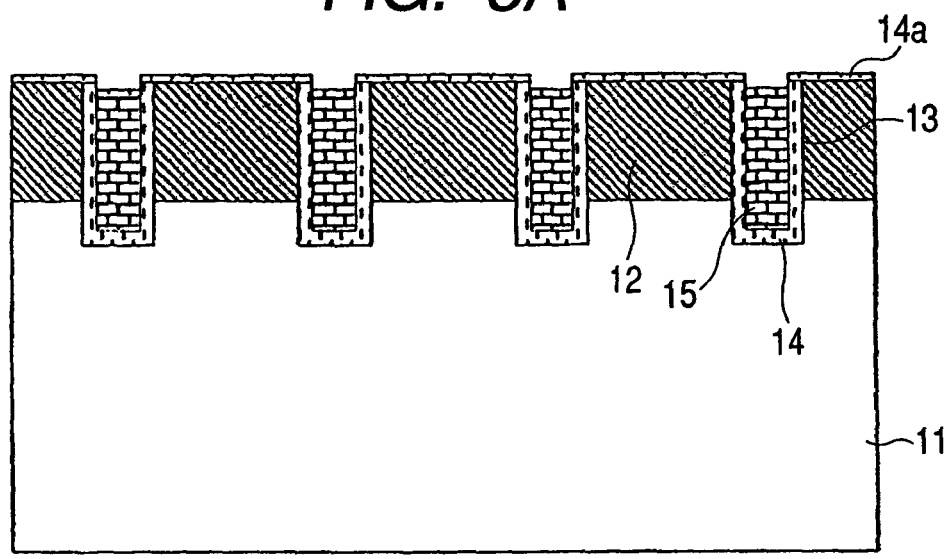
FIG. 5A is a cross sectional view showing the principal part of the silicon substrate in a state in which a p-type channel region is formed on the top surface side thereof in the step subsequent to the step shown in FIG. 4.
Figure 5B:
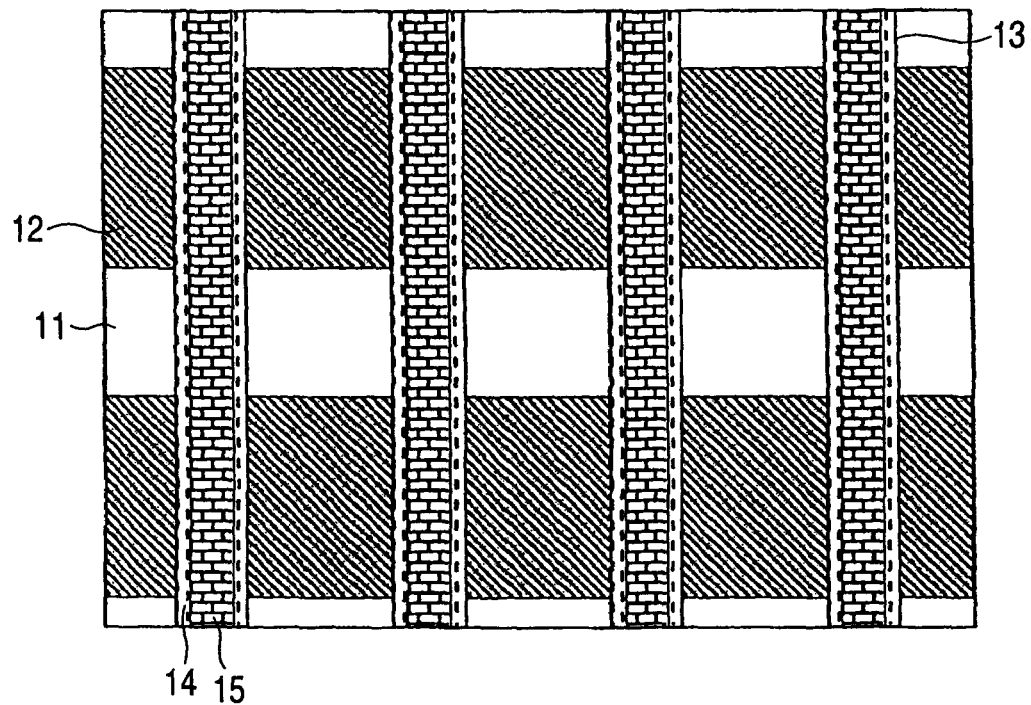
FIG. 5B is a plan view showing the silicon substrate in the step shown in FIG. 5A.
Figure 6A:
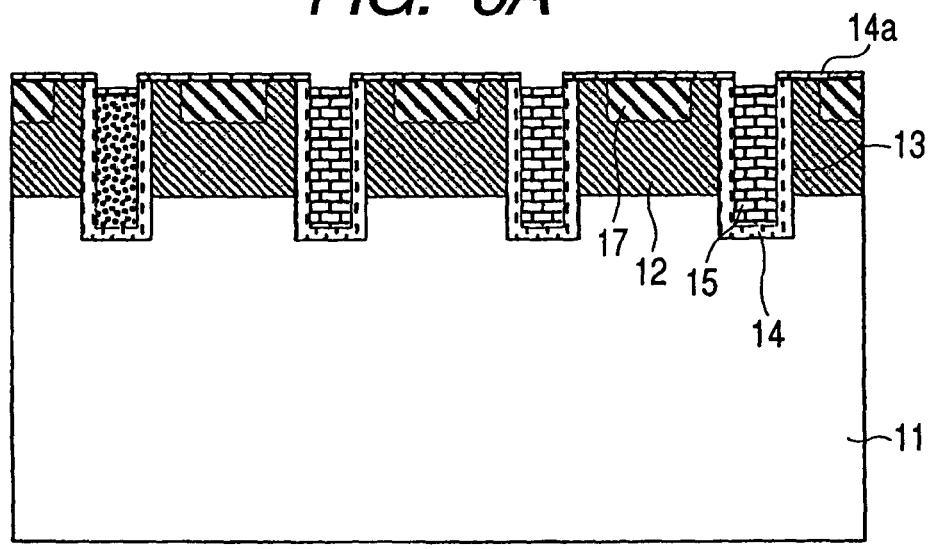
FIG. 6A is a cross sectional view showing the principal part of the silicon substrate in a state in which $p^+$-type body regions are formed on the top surface side thereof in the step subsequent to the step shown in FIGS. 5A and 5B.
Figure 6B:
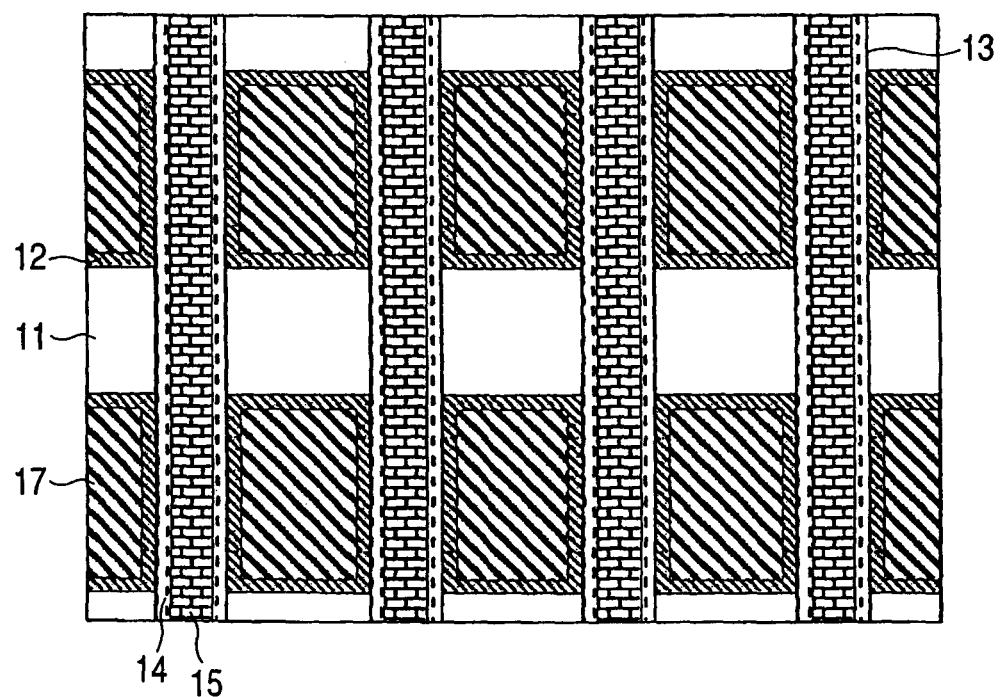
FIG. 6B is a plan view showing the silicon substrate in the step shown in FIG. 6A.

Next, as shown in FIG. 5A, thermal oxide film 14a is formed with a thickness that allows boron ions or arsenide ions to pass through sufficiently, 20 to 50 nm, for example. As shown in FIG. 5B, a plan view of the substrate shown in FIG. 5A, on the surface of $n^-$-type silicon substrate 11 between trenches 13 arranged in parallel, p-type diffusion regions to be p-type channel regions 12 are selectively formed with a pattern orthogonal to trenches 13 by boron ion implantation with an acceleration voltage of the order of 50 keV and a dose of the order of $1\times10^{13}$ cm$^{-2}$ to $5\times10^{14}$ cm$^{-2}$ and thermal diffusion processing at a temperature of the order of 1100° C. In Example 1, of the width of the p-type diffusion region in the longitudinal direction of trench 13, the width of the region in which boron ions are implanted was taken as approximately 6 μm and the width of the region in which no boron ions are implanted (the width after diffusion by heat treatment) was taken as approximately 14 μm. The width of p-type channel region 12 hatched in FIG. 5B is shown as the width after the thermal diffusion. On the surface in the middle of p-type channel region 12 formed between trenches 13, $p^+$-type body region 17 is formed (FIGS. 6A and 6B). $P^+$-type body region 17 can be formed by forming an opening in a resist mask at the portion to be $p^+$-type body region 17 with a photolithography process and by carrying out boron ion implantation with an acceleration voltage of the order of 100 keV and a dose of the order of $1\times10^{15}$ cm$^{-2}$ to $5\times10^{15}$ cm$^{-2}$ and thermal diffusion processing at a temperature of the order of 1000° C. In this Example 1, $p^+$-type body region 17 is formed with a width in the longitudinal direction of trench 13 taken as approximately 5.5 μm and a width in the lateral direction of trench 13 taken as 2 μm so as to be laid out in the middle section between trenches 13.

Figure 7A:
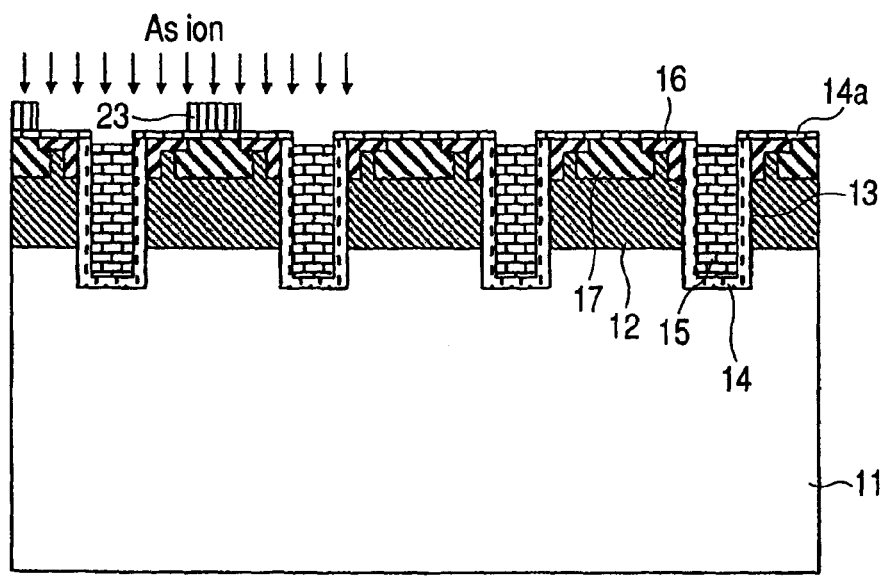
FIG. 7A is a cross sectional view showing the principal part of the silicon substrate in a state in which $n^+$-type emitter regions are formed on the top surface side thereof in the step subsequent to the step shown in FIGS. 6A and 6B.
Figure 7B:
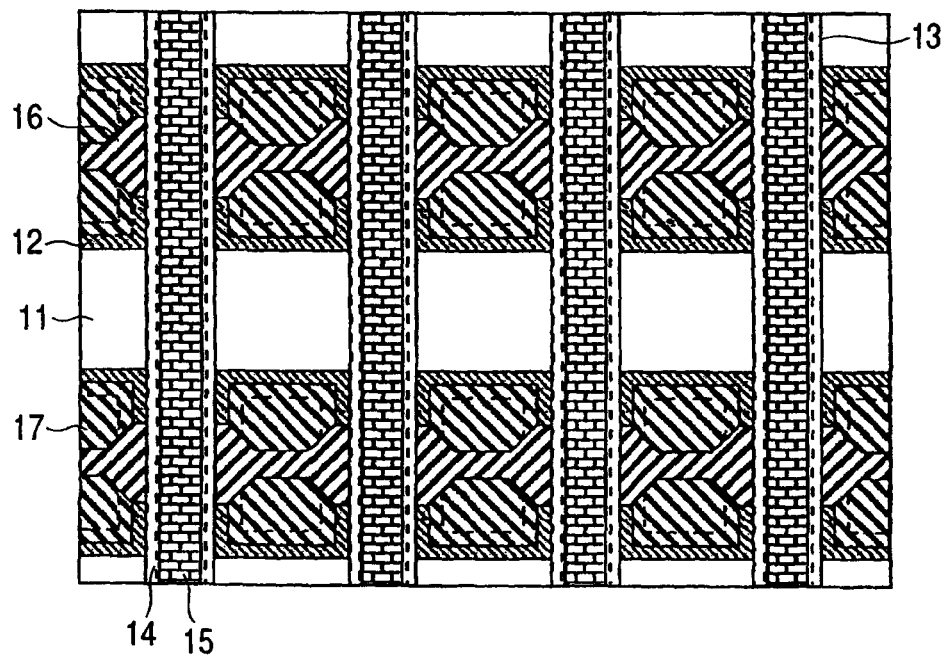
FIG. 7B is a plan view showing the silicon substrate in the step shown in FIG. 7A.

Following this, by a photolithography process and subsequent arsenic ion implantation and heat treatment, $n^+$-type emitter region 16 is formed in p-type channel region 12 between trenches 13 adjacent to each other as shown in FIGS. 7A and 7B. $N^+$-type emitter region 16 has a pattern with a length in the longitudinal direction of trench 13 that becomes shorter from the vicinity of trench 13 toward the middle section between trenches 13 adjacent to each other. The ion implantation for forming $n^+$-type emitter region 16 is carried out by using resist mask 23 with arsenic ions implanted with an acceleration voltage of the order of 100 to 200 keV and a dose of the order of $1\times10^{15}$ cm$^{-2}$ to $5\times10^{15}$ cm$^{-2}$ as shown by arrows in FIG. 7A, for example.

Subsequently, as shown in the cross sectional view of FIG. 8A and the partially cut away plan view of FIG. 8B, interlayer insulator film 18 of a material such as BPSG (Boro Phospho Silicate Glass) is deposited on the whole surface of the substrate. As a result, gate electrode 15 in trench 13 is covered with interlayer insulator film 18 of the BPSG. In interlayer insulator film 18, an opening is formed by a photolithography process at the position of contact region 40 provided on the surface of n⁻-type silicon substrate 11 between adjacent trenches 13 as a region for making metal electrode (emitter electrode) 19 contact with n⁺-type emitter region 16 and p⁺-type body region 17. At this time, the length in the longitudinal direction of trench 13 of the opening in interlayer insulator film 18 is made to be shorter than the length of n⁺-type emitter region 16 in the longitudinal direction of trench 13.

Specifically, compared with the length of 5.0 μm of n⁺-type emitter region 16 in the longitudinal direction of trench 13, the opening length at contact region 40 was taken as 4.5 μm in the longitudinal direction of trench 13 and, in the lateral direction of trench 13, was taken as 2 μm, which is equal to the length of p⁺-type body region 17 in the lateral direction of trench 13. In FIG. 13, an enlarged plan view showing a unit cell region of the vertical IGBT according to Example 1 of the invention, an enlarged pattern around contact region 40 is shown for p⁺-type body region 17 and n⁺-type emitter region 16 formed on the surface of p-type channel region 12 between adjacent trenches 13 with the dimensions of these regions brought together with the dimensions of contact region 40.

However, p-type channel region 12, n⁺-type emitter region 16 and p⁺-type body region 17 expand in the direction of the substrate surface by impurity diffusion due to heat treatment carried out after ion implantation. Therefore, the above given dimensions for the regions are those of openings of the masks for ion implantation. In FIG. 13, the portions of p-type channel region 12 and p⁺-type body region 17 expanded by heat treatment are designated by reference numerals 12a and 17a, respectively.

After this, a metal film such as aluminum film is deposited by a method such as sputtering. The deposited metal film is then subjected to patterning by a photolithography process before being alloyed, by which emitter metal electrode 19 to be an emitter electrode is formed on the whole surface of the unit cell region. Furthermore, a passivation film is also preferably deposited on the whole surface of a chip as necessary.

Figure 8A:
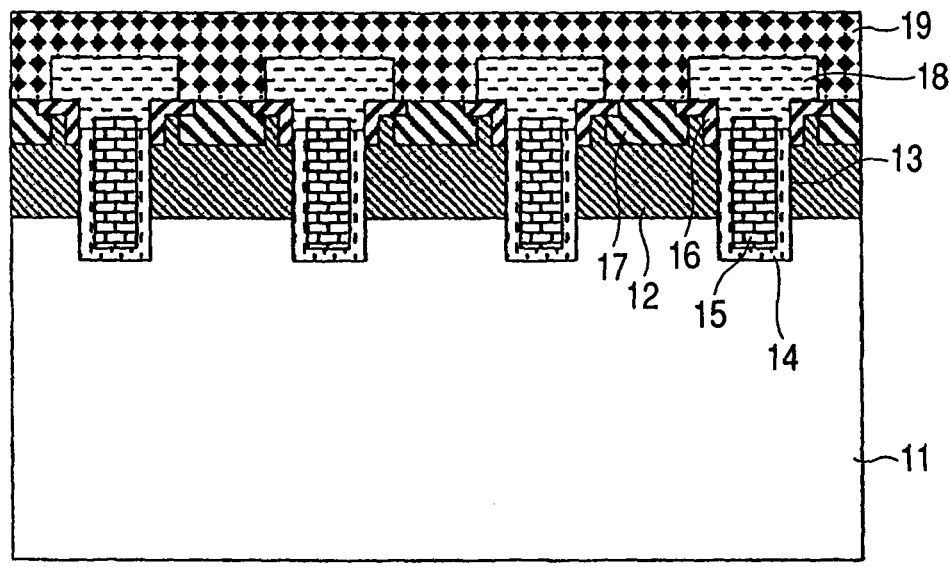
FIG. 8A is a cross sectional view showing the principal part of the silicon substrate in a state in which an interlayer insulator film is deposited on the whole surface of the silicon substrate, openings are provided at contact regions in the interlayer insulator film and an emitter electrode is formed on the whole surface in the step subsequent to the step shown in FIGS. 7A and 7B.
Figure 8B:
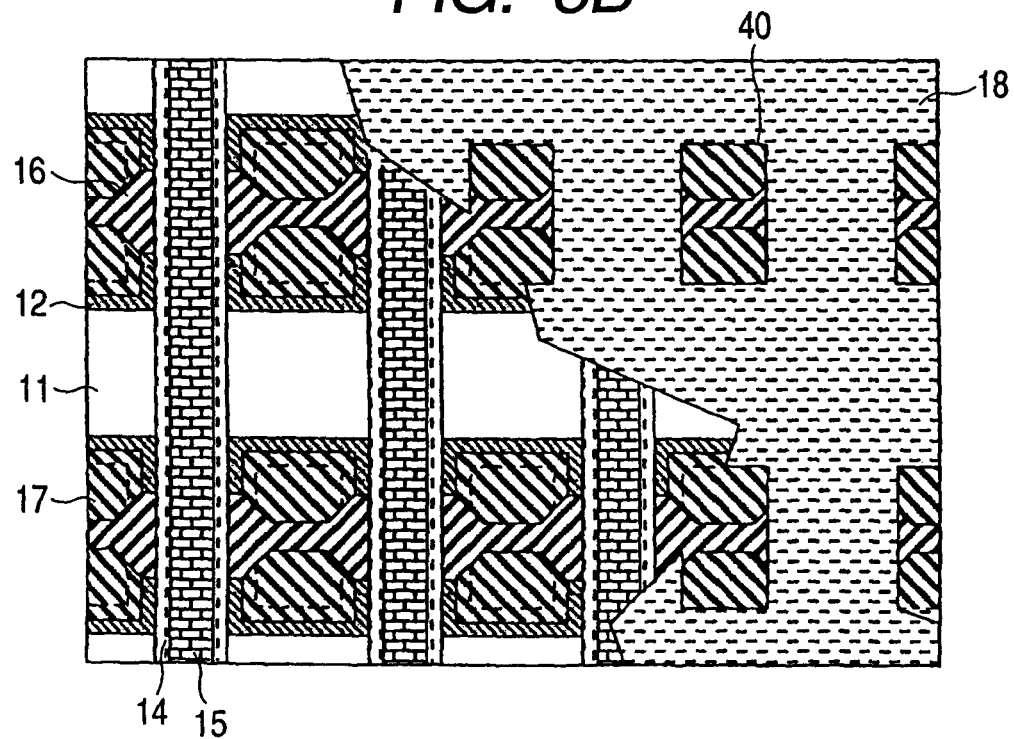
FIG. 8B is a partially cutaway plan view showing the silicon substrate in the step shown in FIG. 8A.
Figure 9:
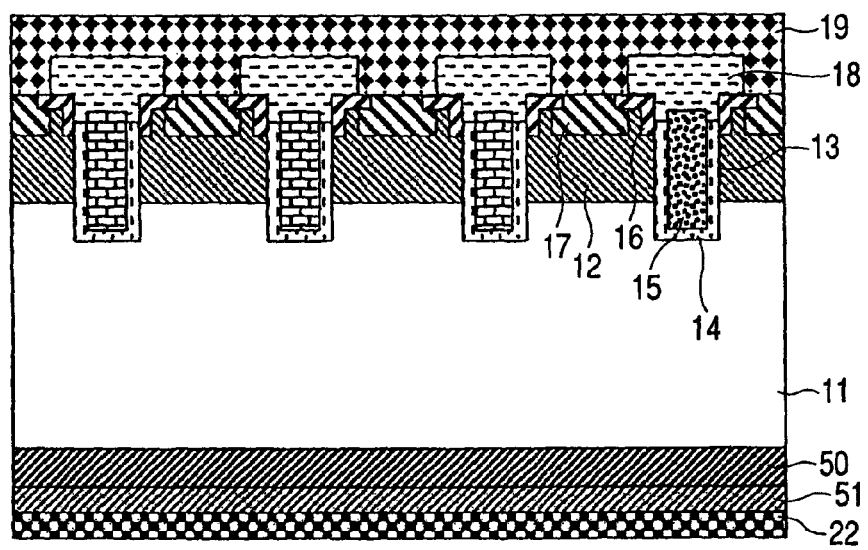
FIG. 9 is a cross sectional view showing the principal part of the silicon substrate in a state in which an $n^+$-type buffer layer, a $p^+$-type collector layer and a collector electrode are formed in the step subsequent to the step shown in FIGS. 8A and 8B to complete the vertical IGBT in a wafer stage in the manufacturing process of the vertical IGBT according to Example 1 of the invention.
Figure 10:
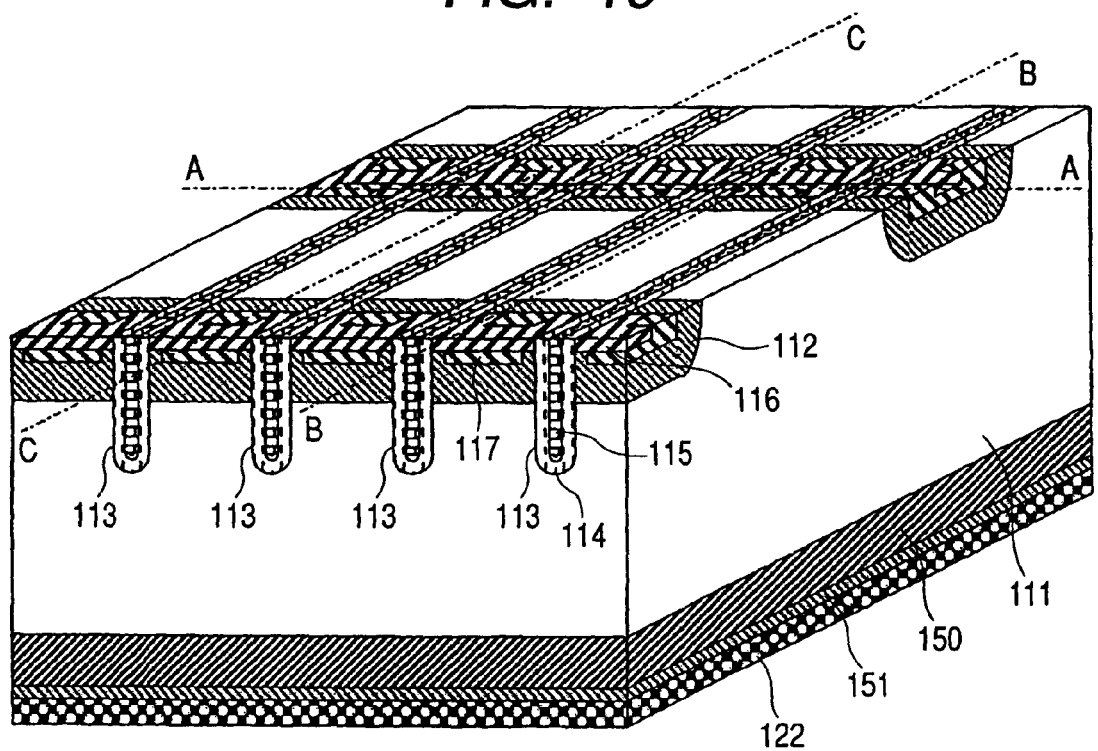
FIG. 10 is a perspective view showing a related vertical and trench type IGBT.
Figures 1, 11:
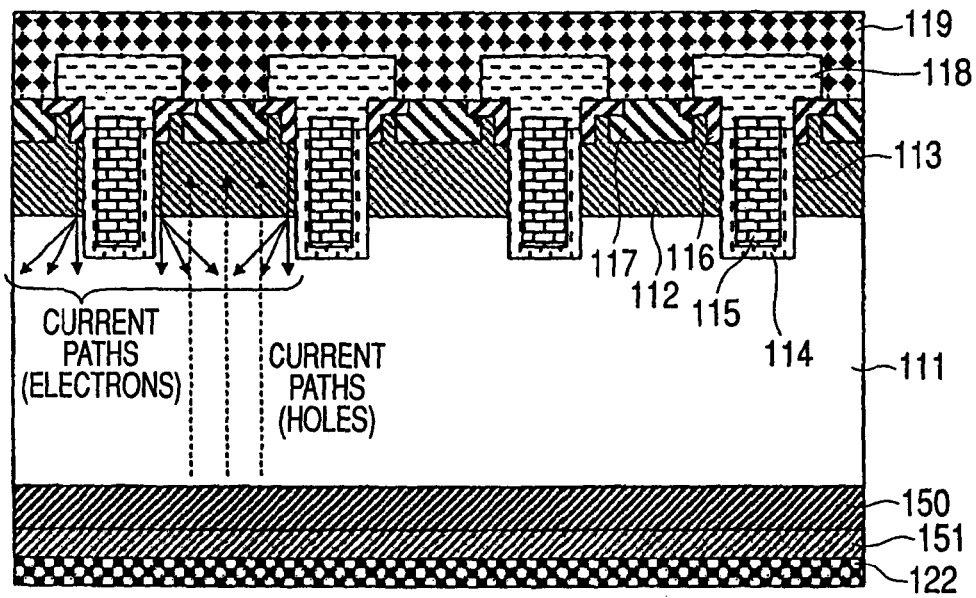
Figures 2, 11:
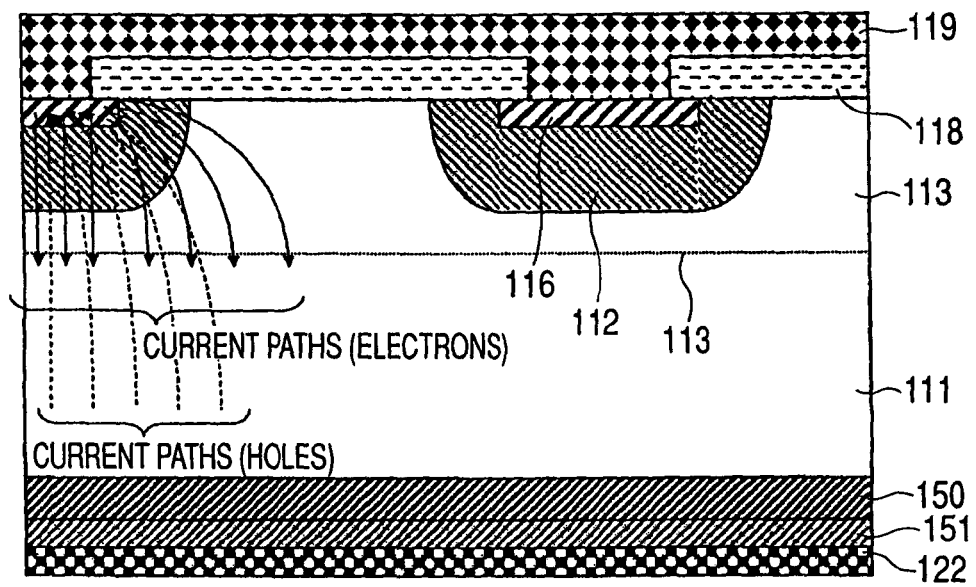
Figures 3, 11:
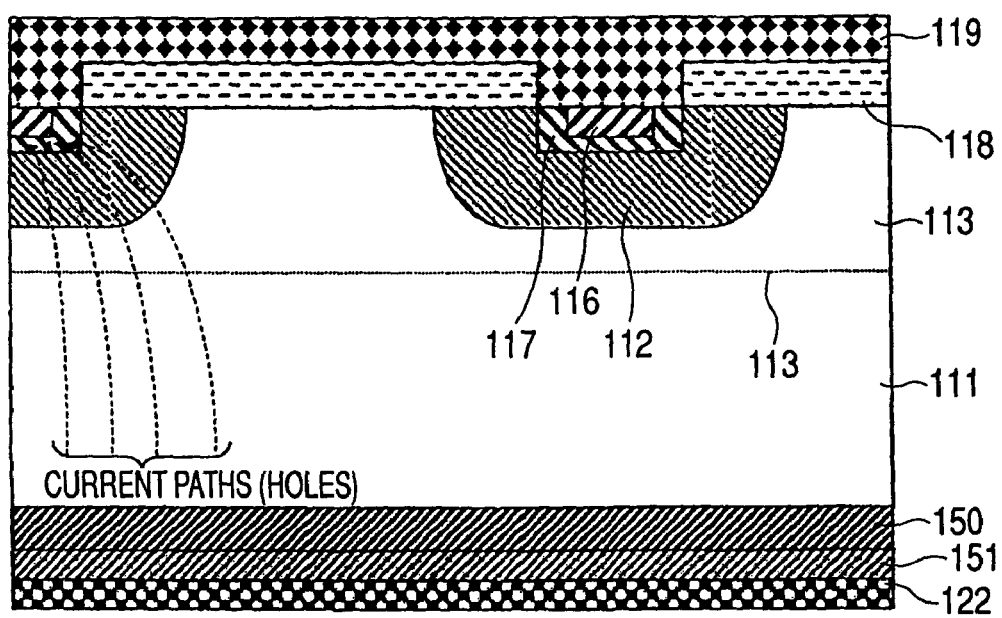

Then, n⁻-type silicon substrate 11 shown in FIG. 8A is polished from the other principal surface to a specified thickness (on the order of 80 to 120 μm) determined by a breakdown voltage. Thereafter, as shown in FIG. 9, n⁺-type buffer layer (or an n⁺-type field stop layer) 50 and p⁺-type collector layer 51 are formed by ion implantation and heat treatment and collector electrode 22 is then formed, by which a vertical IGBT in a wafer stage is completed. Here, some forms of IGBTs necessitate no n⁺-type buffer layer (or an n⁺-type field stop layer) 50 to be formed. Moreover, for the silicon substrate, an n⁻/n⁺⁺/p⁺⁺ substrate can be also used without forming n⁺-type buffer layer 50 and p⁺-type collector layer 51 by ion implantation and heat treatment. Furthermore, by increasing the surface impurity concentration of n⁺-type emitter region 16 with the manufacturing process thereof carried out two times, excellent ohmic contact can be favorably obtained.

By providing p-type channel region 12, p⁺-type body region 17 and n⁺-type emitter region 16 with the above-explained mutual arrangement and dimensions, n⁺-type emitter region 16 present on the hole current paths can be decreased, as shown by arrows representing the hole current paths in FIG. 14. This makes it significantly difficult to operate an NPN transistor formed with n⁺-type emitter region 16/p-type channel region 12/n⁻-type silicon substrate 11. As a result, the operation of a parasitic thyristor of the IGBT is difficult, which thyristor is formed with n⁺-type emitter region 16/p-type channel region 12/n⁻-type silicon substrate 11/p⁺-type collector layer 51, which enables enhancement of turn-off capability.

Example 2

Example 2 of the vertical and trench type insulated gate MOS semiconductor device according to the invention will be explained with reference to FIG. 15. In Example 2, a vertical IGBT with a breakdown voltage of 600 V is taken as an example of a power vertical and trench type insulated gate MOS semiconductor device and its structure will be shown.

The process of manufacturing the IGBT is the same as that in Example 1 with only the shapes, arrangements and dimensions of p⁺-type body region 27, n⁺-type emitter region 26 and contact region 41 of a metal/semiconductor layer being modified from those in Example 1. The main modification is that the angle formed by trench 13 and a side of n⁺-type emitter region 26 intersecting trench 13 is 45 degrees rather than 90 degrees and that the length of contact region 41 of the metal/semiconductor layer in the longitudinal direction of trench 13 is longer than the length of n⁺-type emitter region 26 in the longitudinal direction of trench 13.

By making the angle formed by n⁺-type emitter region 26 and trench 13 smaller than 90 degrees, it becomes possible to make n⁺-type emitter region 26 present on the hole current paths further smaller than that in Example 1. In addition, by making the length of contact region 41 of the metal/semiconductor layer in the longitudinal direction of trench 13 longer than the length of n⁺-type emitter region 26 in the longitudinal direction of the trench, it becomes possible to move the hole current paths away from n⁺-type emitter region 26. Therefore, turn-off capability higher than that of the IGBT in Example 1 can be obtained.

However, p-type channel region 22, n⁺-type emitter region 26 and p⁺-type body region 27 expand in the direction of the substrate surface by impurity diffusion due to heat treatment carried out after ion implantation. Therefore, the above given dimensions for the regions are those of openings of the masks for ion implantation. In FIG. 15, the portions of p-type channel region 22 and p⁺-type body region 27 expanded by heat treatment are designated by reference numerals 22a and 27a, respectively.

Example 3

Example 3 of the vertical and trench type insulated gate MOS semiconductor device according to the invention will be explained with reference to FIG. 16. In Example 3, a vertical IGBT with a breakdown voltage of 600 V is taken as an example of a power vertical and trench type insulated gate MOS semiconductor device and its structure will be shown.

The process of manufacturing the IGBT is the same as that in Example 1 with only the shapes, arrangements and dimensions of p⁺-type body region 37, n⁺-type emitter region 36 and contact region 42 of a metal/semiconductor layer being modified from those in Example 1. The main modification is that the angle formed by trench 13 and a side of n⁺-type emitter region 36 intersecting trench 13 is 45 degrees rather than 90 degrees and that contact region 42 of the metal/semiconductor layer is not provided for all of the portions in the longitudinal direction of trench 13 of n⁺-type emitter region 36. With contact region 42 of the metal/semiconductor layer not provided for all of the portions in the longitudinal direction of trench 13 of n⁺-type emitter region 36, it is possible that hole currents flow in the p⁺-type body region 37 with a high impurity concentration between n⁺-type emitter region 36 and contact region 42 of the metal/semiconductor layer, which enables enhancement of the turn-off capability of the IGBT.

However, p-type channel region 32, n⁺-type emitter region 36 and p⁺-type body region 37 expand in the direction of the substrate surface by impurity diffusion due to heat treatment carried out after ion implantation. Therefore, the above given dimensions for the regions are those of openings of the masks for ion implantation. In FIG. 16, the portions of the p-type channel region 32 and p⁺-type body region 37 expanded by heat treatment are designated by reference numerals 32a and 37a, respectively.

The foregoing is only a part of the examples of the invention and it is a matter of course that various kinds of examples are considered in addition to the foregoing without departing from the spirit and the scope of the invention.

Example 4

In Example 4, a vertical IGBT with a breakdown voltage of 1200 V is taken as an example of a vertical and trench type insulated gate MOS power semiconductor device and its manufacturing processes will be explained with reference to FIGS. 19-1A and 19-1B, FIGS. 20-1A and 20-2B, FIGS. 21A and 21B and FIG. 22, FIG. 23-1 and FIG. 23-2.

Figures 1A, 19:
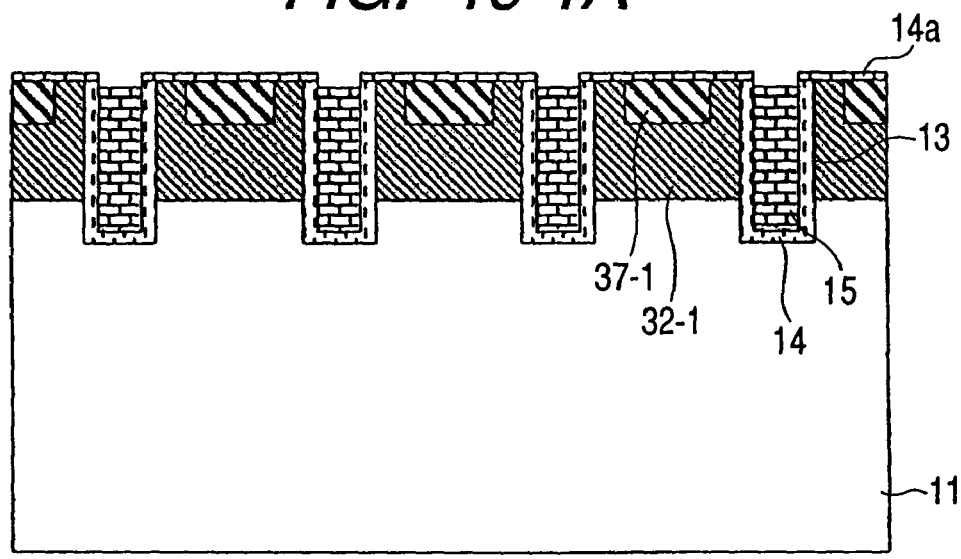
FIG. 19-1A is a cross sectional view showing a principal part of the silicon substrate in the step in which trenches each with a gate electrode buried therein, p-type channel regions, $p^+$-type body regions and an oxide film are formed on the top surface side the substrate in the manufacturing process of a vertical IGBT according to Example 4 of the invention.
Figures 1B, 19:
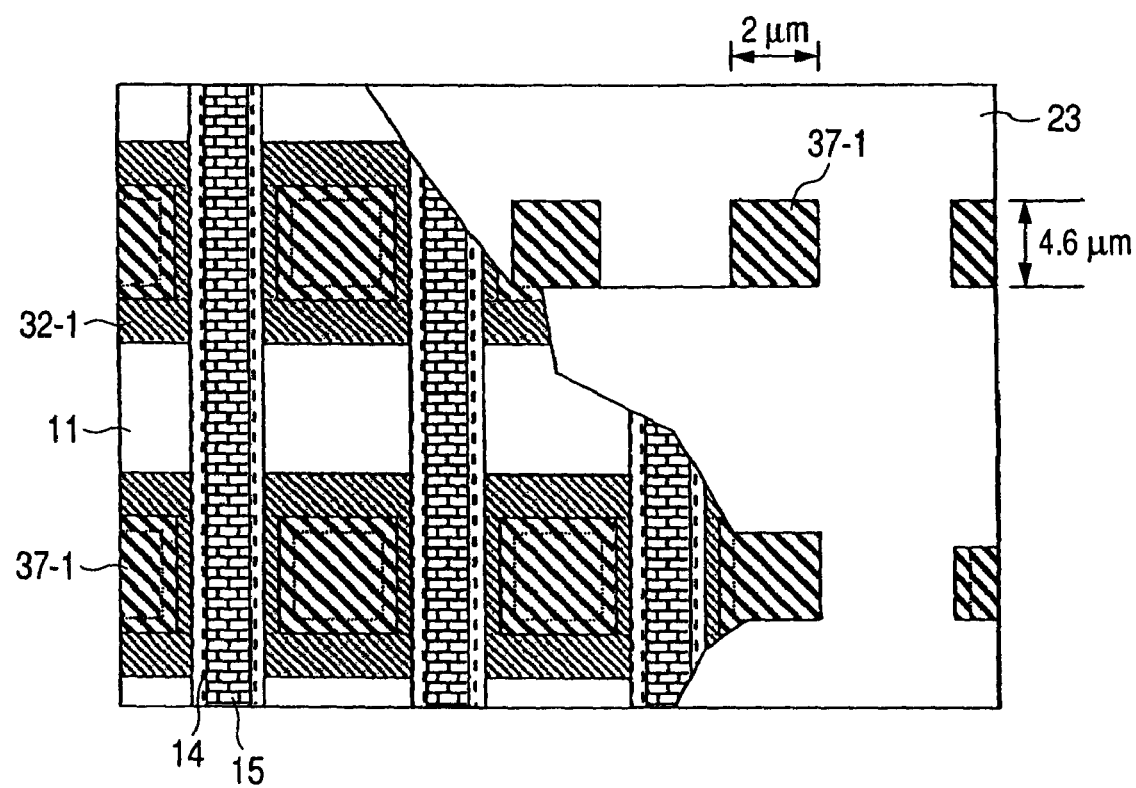

First, n⁻-type silicon substrate 11 is prepared. N⁻-type silicon substrate 11, like n⁻-type silicon substrate 11 in Example 1 shown in FIG. 1, has an n⁻-region becoming a base region on the surface thereof whose direction of crystal plane is (100), but in Example 4, its resistivity is changed from the approximately 30 Ωcm in Example 1 to approximately 60 Ωcm. The other processes prior to the manufacturing process shown in FIGS. 19-1A and 19-1B, are approximately the same as those shown in FIG. 1 to FIG. 5B in Example 1. In Example 4, in the subsequent manufacturing process shown in FIGS. 19-1A and 19-1B, the dimension of p⁺-type body region 37-1 differs from that of p⁺-type body region 17 in FIG. 6 for Example 1. Namely, as shown in FIG. 19-1B, the dimensions of an opening, provided in resist mask 23 for forming p⁺-type body region 37-1 by boron ion implantation, were taken as approximately 4.6 μm in the longitudinal direction of trench 13 and 2 μm in the lateral direction of trench 13.

Figures 1A, 20:
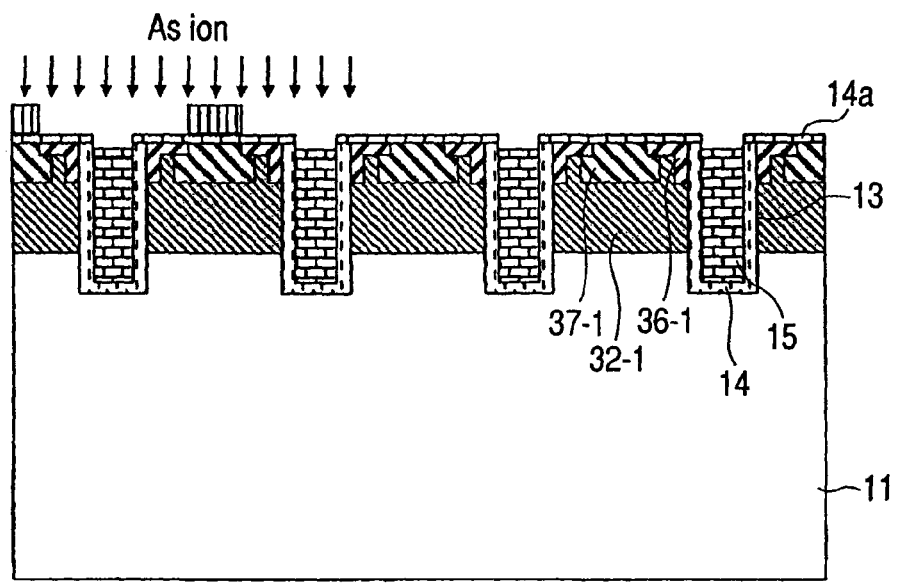
Figures 1B, 20:
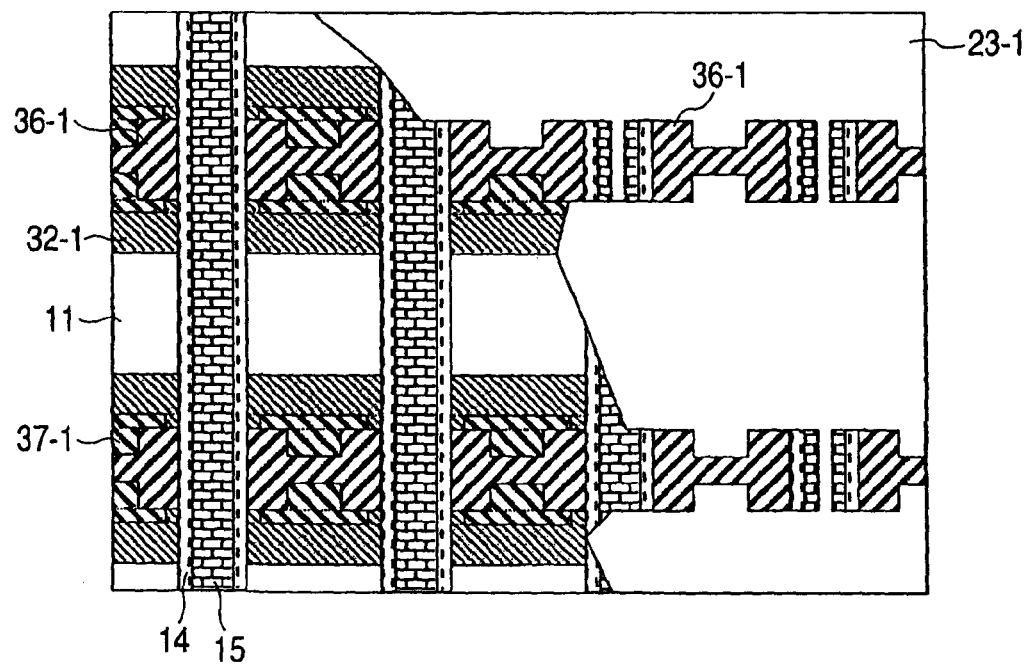
Figures 2A, 20:
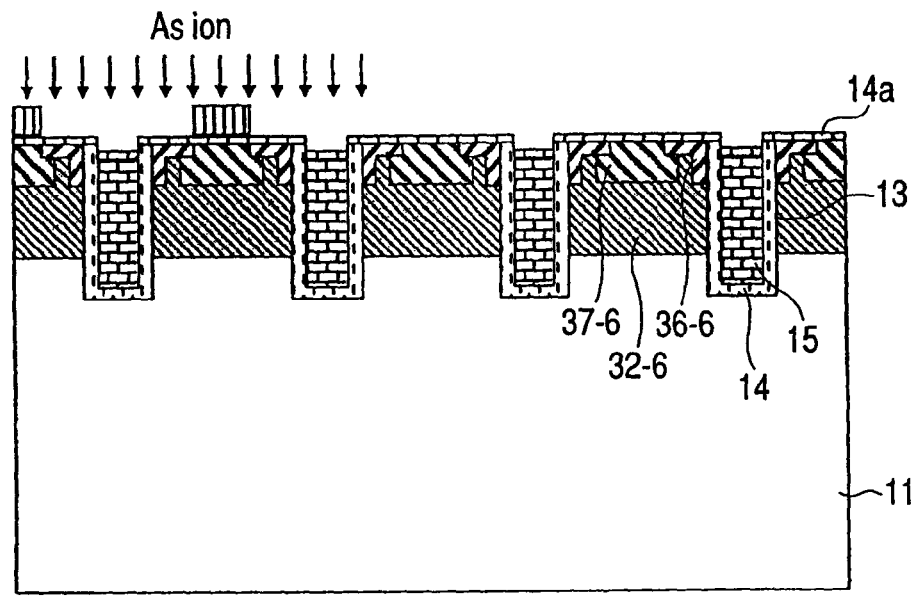
Figures 2B, 20:
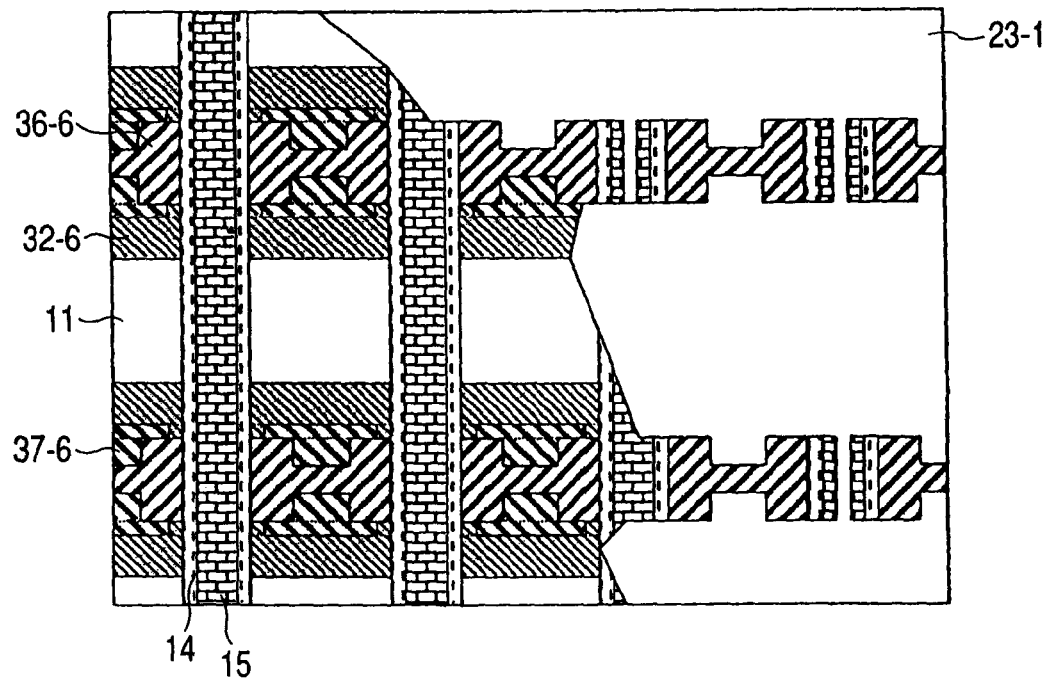

Next, as shown in FIGS. 20-1A and 20-1B, by a photolithography process, resist mask 23-1 is formed with opening dimensions (not shown) that differ different from those in Example 1. With the use of resist mask 23-1, ion implantation with arsenic (As) ions is carried out with subsequent heat treatment as in Example 1 to thereby form n⁺-type emitter region 36-1. The ion implantation is carried out with an acceleration voltage of the order of 100 to 200 keV, for example, and a dose of the order of 1×10¹⁵ cm⁻² to 5×10¹⁵ cm⁻². The specific plane dimension of n⁺-type emitter region 36-1 is shown in FIG. 23-1. In FIG. 23-1, the portions of p-type channel region 32-1 and p⁺-type body region 37-1 expanded by heat treatment are designated by reference numerals 32-1a and 37-1a, respectively. Following this, as shown in FIGS. 21A and 21B, interlayer insulator film 18 of a material such as BPSG is deposited on the whole surface of the substrate. Therefore, interlayer insulator film 18 is formed so as to cover gate electrode 15 in trench 13. Interlayer insulator film 18 is subjected to etching by a photolithography process, by which an opening is formed at the position of contact region 43 so that n⁺-type emitter region 36-1 and p⁺-type body region 37-1 on the substrate surface are exposed. At this time, the length of the opening in the longitudinal direction of trench 13 in interlayer insulator film 18 is longer than the length of n⁺-type emitter region 36-1 in the longitudinal direction of trench 13. In Example 4, the specific dimensions of the opening for making n⁺-type emitter region 36-1 and p⁺-type body region 37-1 contact with emitter electrode 19 at contact region 43 were given so that the opening length in the longitudinal direction of trench 13 became 9.6 μm and the opening length in the lateral direction of trench 13 became 2 μm as shown in FIG. 23-1. Moreover, as shown in FIG. 21A, metallic material such as aluminum is deposited on the whole surface of the substrate by carrying out sputtering. The deposited metal film is subjected to patterning by a photolithography process before being alloyed, by which emitter metal electrode 19 to be an emitter electrode is formed on the whole surface of the unit cell region. Furthermore, a passivation film not shown is preferably deposited on the whole surface of a chip on the emitter electrode. After n⁻-type silicon substrate 11 is polished from the other principal surface to a specified thickness (on the order of 130 to 150 μm), as shown in FIG. 22, n⁺-type buffer layer (or an n⁺-type field stop layer) 50 and p⁺-type collector layer 51 are formed by ion implantation and heat treatment before collector electrode 22 is formed, by which a vertical IGBT in a wafer stage is completed. Here, some forms of IGBTs have no n⁺-type buffer layer (or an n⁺-type field stop layer) 50 formed. Moreover, some forms of IGBTs use n⁻/n⁺⁺/p⁺⁺ substrates for their substrate without forming n⁺-type buffer layer 50 and p⁺-type collector layer 51 by ion implantation and heat treatment. However, with the above-described manufacturing method, the lower end of n⁺-type emitter region 36-1 does not reach the upper end of the gate electrode 15 which is formed with the oxide film. Therefore, the heat treatment time of n⁺-type emitter region 36-1 must be relatively long. In such case, the impurity concentration of n⁺-type emitter region 36-1 becomes low to sometimes make the ohmic contact of emitter metal electrode 19 with n⁺-type emitter region 36-1 difficult. In this case, by forming n⁺-type emitter region 36-1 with the manufacturing process step thereof carried out two times, the surface impurity concentration of n⁺-type emitter region 36-1 can be high to make the ohmic contact easy. Namely, after p-type channel region 32-1 is formed, a first step of forming n⁺-type emitter region 36-1 is carried out. Subsequent to this, p⁺-type body region 37-1 is formed. Then, a resist mask is formed with an opening provided by a photolithography process at a section to be n⁺-type emitter region 36-1. Furthermore, a second step of forming n⁺-type emitter region 36-1 is carried out by ion implantation with arsenic ions, for example, with subsequent heat treatment. This provides a structure for making ohmic contact of n⁺-type emitter region 36-1 with metal electrode 19 easy.

With p-type channel region 32-1, n⁺-type emitter region 36-1 and contact region 43 of emitter metal electrode 19/semiconductor formed as explained above, as shown by arrows in FIG. 23-2, most of the hole currents flowing in from the sidewall of trench 13 flow into the emitter electrode with a lower electric potential to make it possible to inhibit rise in the electric potential of p-type channel region 32-1. Therefore, such an arrangement makes an NPN transistor formed with n⁺-type emitter region 36-1/p-type channel region 32-1/n⁻-type silicon substrate 11 difficult to operate. As a result, the operation of a parasitic thyristor of the IGBT is difficult, which thyristor is formed with n⁺-type emitter region 36-1/p-type channel region 32-1/n⁻-type silicon substrate 11/p⁺-type collector layer 51. This enables enhancement of turn-off capability.

Figure 12:
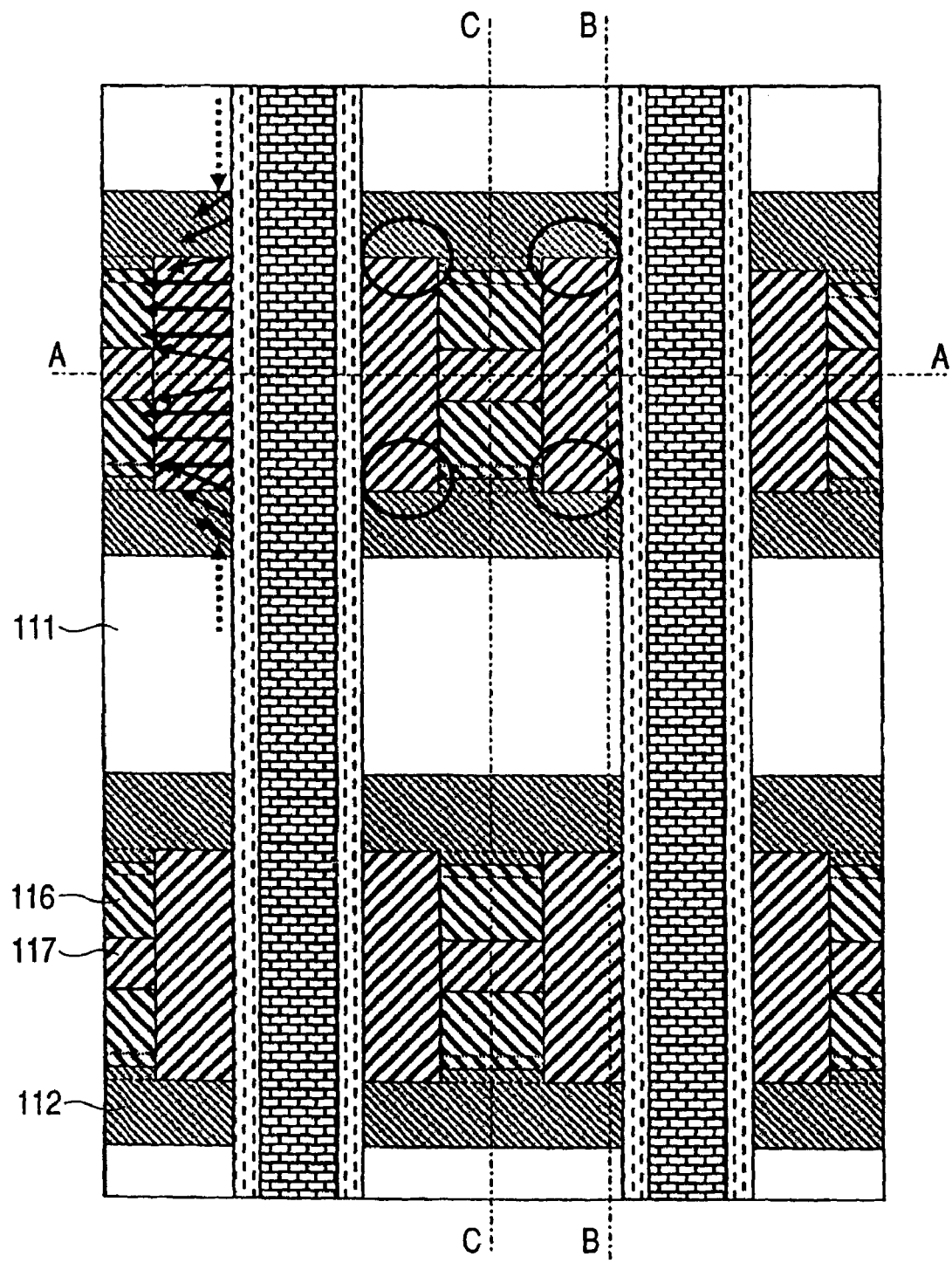
FIG. 12 is a plan view showing the related vertical and trench type IGBT shown in FIG. 10.

FIG. 18A is a diagram showing waveforms of the related IGBT shown in FIG. 12 at turning-off and FIG. 18B is a diagram showing waveforms of the IGBT according to Example 4 at turning-off. Compared with the related IGBT shown in FIG. 12 which is broken down at turning-off at a current density of 375 A/cm² as shown in FIG. 18A, the IGBT according to Example 4 can be turned-off without being broken down at a current density of 2000 A/cm² as shown in FIG. 18B. Thus, it was known that a turn-off capability of five times or more can be obtained with the IGBT according to Example 4. The enhanced turn-off capability is considered to be a result of locating n⁺-type emitter region 36-1 away from the paths of hole currents flowing in from the sidewall of trench 13 as has been explained to make the operation of the parasitic thyristor of the IGBT difficult, which thyristor is formed with n⁺-type emitter region 36-1/p-type channel region 32-1/n⁻-type silicon substrate 11/p⁺-type collector layer 51.

Example 5

Figure 24:
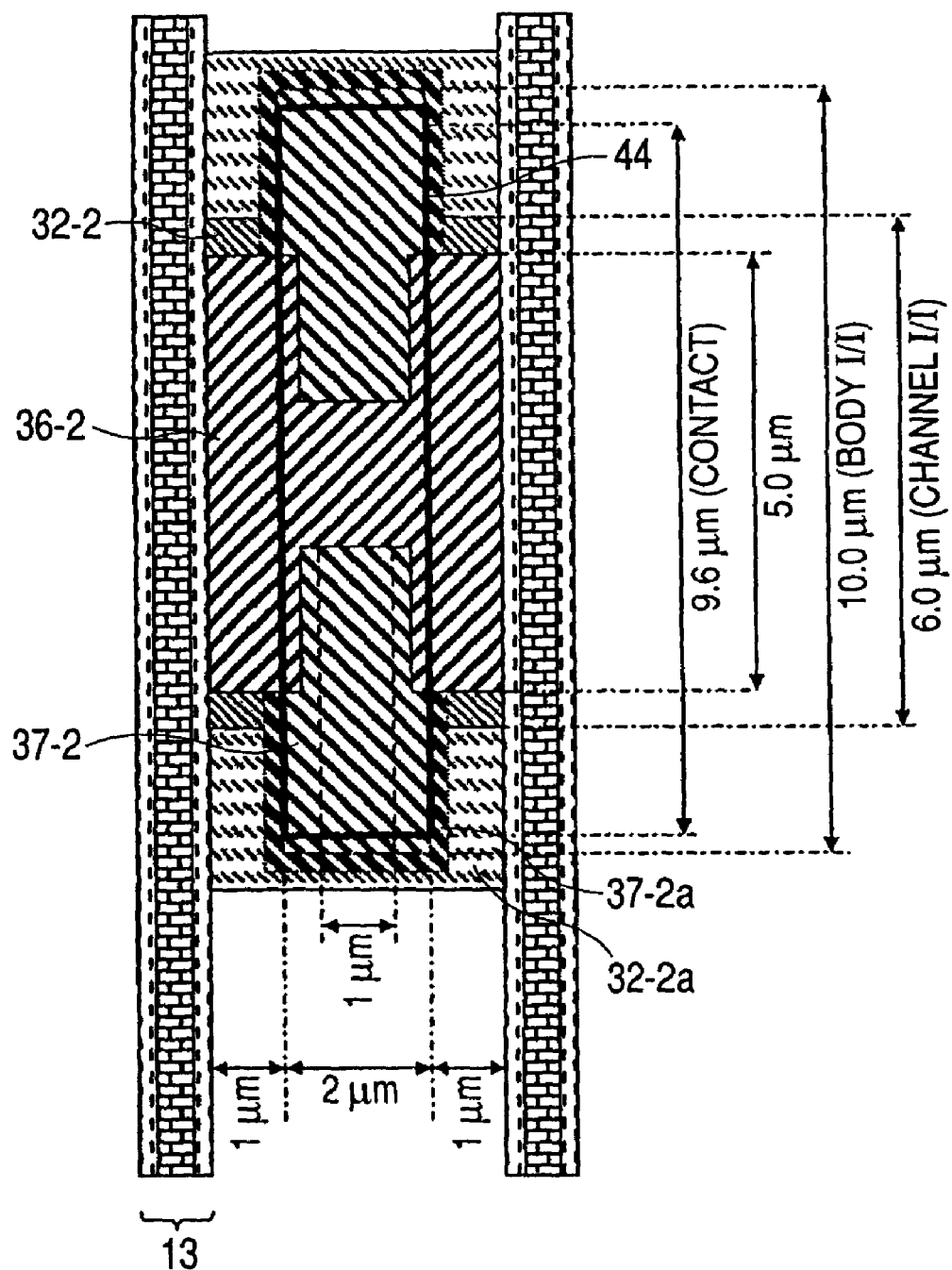
FIG. 24 is an enlarged plan view showing a unit cell region of a vertical IGBT according to Example 5 of the invention.

The vertical IGBT as Example 5 of the vertical and trench type insulated gate MOS semiconductor device according to the invention will be explained with reference to FIG. 24. The manufacturing process of the IGBT is the same as that of Example 4 with the shape of p⁺-type body region 37-2 modified from that in Example 4. Namely, p⁺-type body region 37-2 is formed so as to surround contact region 44 to provide contact with emitter metal electrode 19 with a length (width) in the longitudinal direction of trench 13 that is larger than that of n⁺-type emitter region 36-2. By forming such p⁺-type body region 37-2, most of the hole currents flowing in from the sidewall of trench 13 flow into contact region 44 through p⁺-type body region 37-2 to inhibit rise in the electric potential of p-type channel region 32-2, which makes it possible to obtain turn-off capability higher than that of the IGBT in the Example 4. In addition, it becomes possible to surely prevent contact region 44 from reaching n⁻-type silicon substrate 11. In FIG. 24, the portions of p-type channel region 32-2 and p⁺-type body region 37-2 expanded by heat treatment are designated by reference numerals 32-2a and 37-2a, respectively.

Example 6

Figure 25:
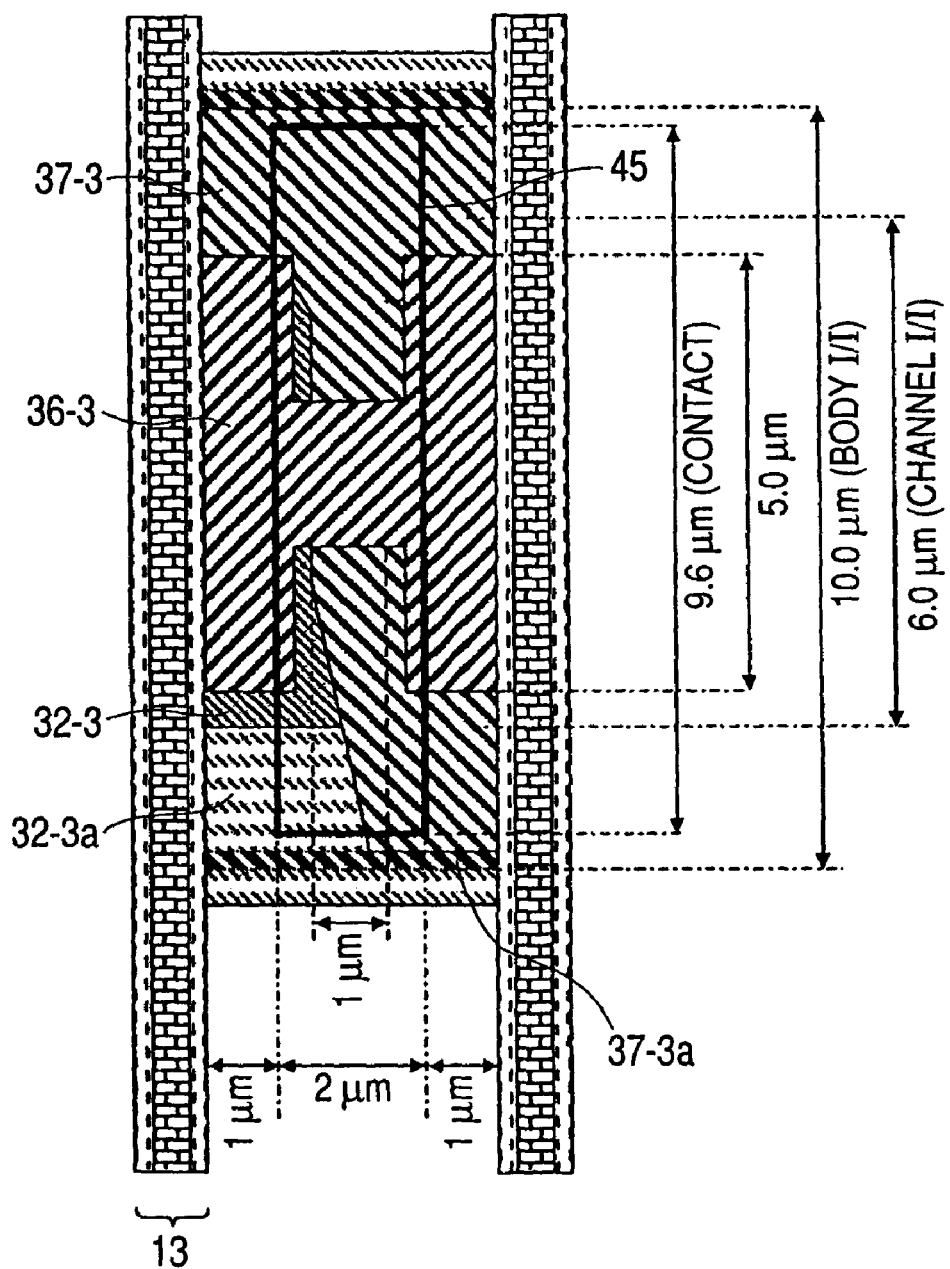
FIG. 25 is an enlarged plan view showing a unit cell region of a vertical IGBT according to Example 6 of the invention.

The vertical IGBT as Example 6 of the vertical and trench type insulated gate MOS semiconductor device according to the invention will be explained with reference to FIG. 25. The manufacturing process of the IGBT is the same as that of Example 4 with the shape of p⁺-type body region 37-3 modified from that in Example 4. Namely, p⁺-type body region 37-3 is formed so as to sufficiently make contact with the sidewall of trench 13. This makes most of the hole currents flowing in from the sidewall of trench 13 flow into contact region 45 through p⁺-type body region 37-3 to make it possible to inhibit rise in the electric potential of p-type channel region 32-3. Therefore, turn-off capability higher than that of the IGBT in the Example 4 can be obtained. In FIG. 25, an n⁺-type emitter region is designated by reference numeral 36-3 and the portions of p-type channel region 32-3 and p⁺-type body region 37-3 expanded by heat treatment are designated by reference numerals 32-3a and 37-3a, respectively.

Example 7

Figure 26:
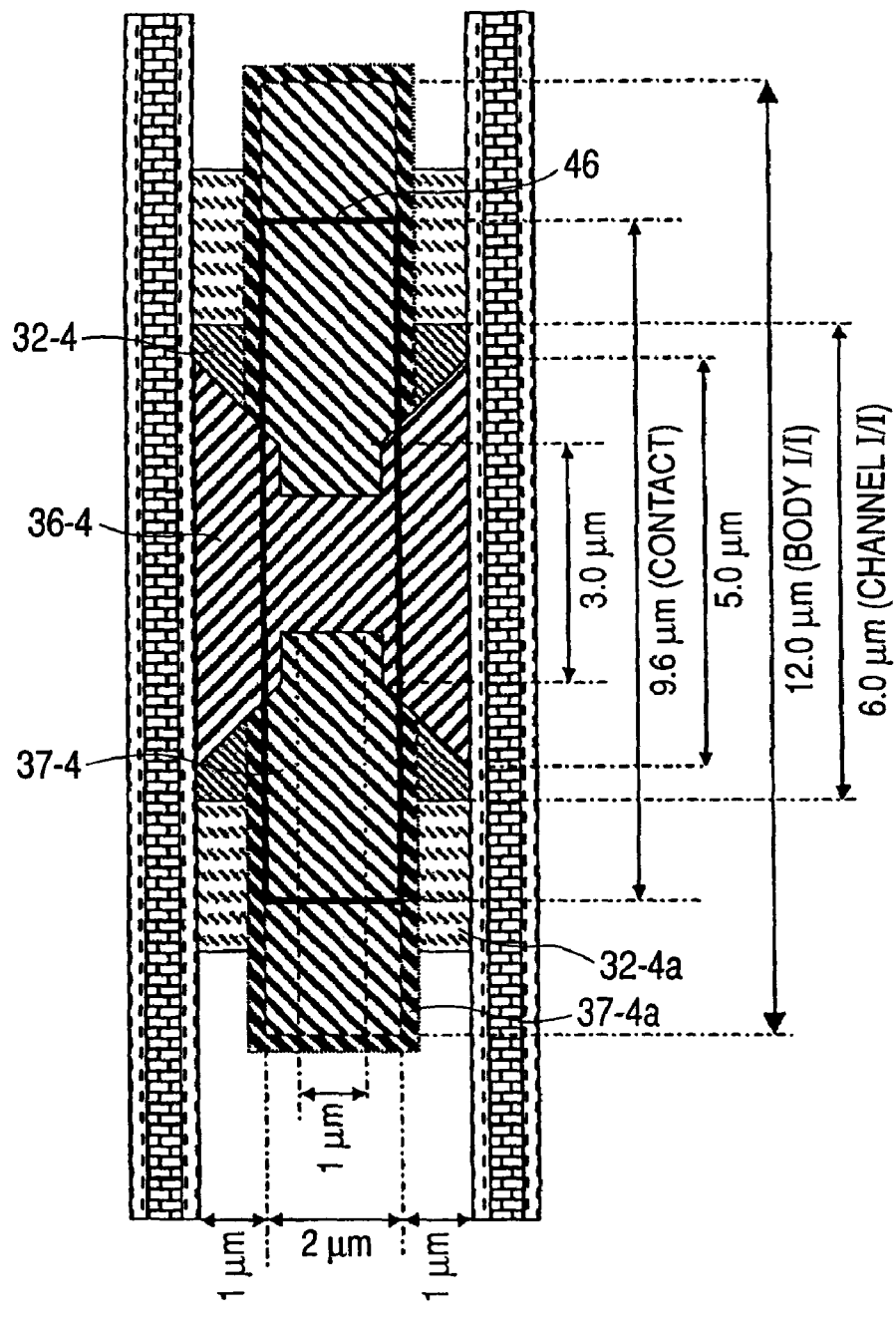
FIG. 26 is an enlarged plan view showing a unit cell region of a vertical IGBT according to Example 7 of the invention.

The vertical IGBT as Example 7 of the vertical and trench type insulated gate MOS semiconductor device according to the invention will be explained with reference to FIG. 26. The manufacturing process of the IGBT is the same as that of Example 4 with the main modification being that the angle formed by trench 13 and a side of n⁺-type emitter region 36-4 intersecting trench 13 is 45 degrees rather than 90 degrees. With contact region 46 not provided for all of the portions of n⁺-type emitter region 36-4 in the longitudinal direction of trench 13, it is possible for more hole currents to flow in p⁺-type body region 37-4 with a high impurity concentration between n⁺-type emitter region 36-4 and contact region 46, which enables enhancement of the turn-off capability of the IGBT. In FIG. 26, a p-type channel region is designated by reference numeral 32-4 and the portions of p-type channel region 32-4 and p⁺-type body region 37-4 expanded by heat treatment are designated by reference numerals 32-4a and 37-4a, respectively.

Example 8

Figure 27:
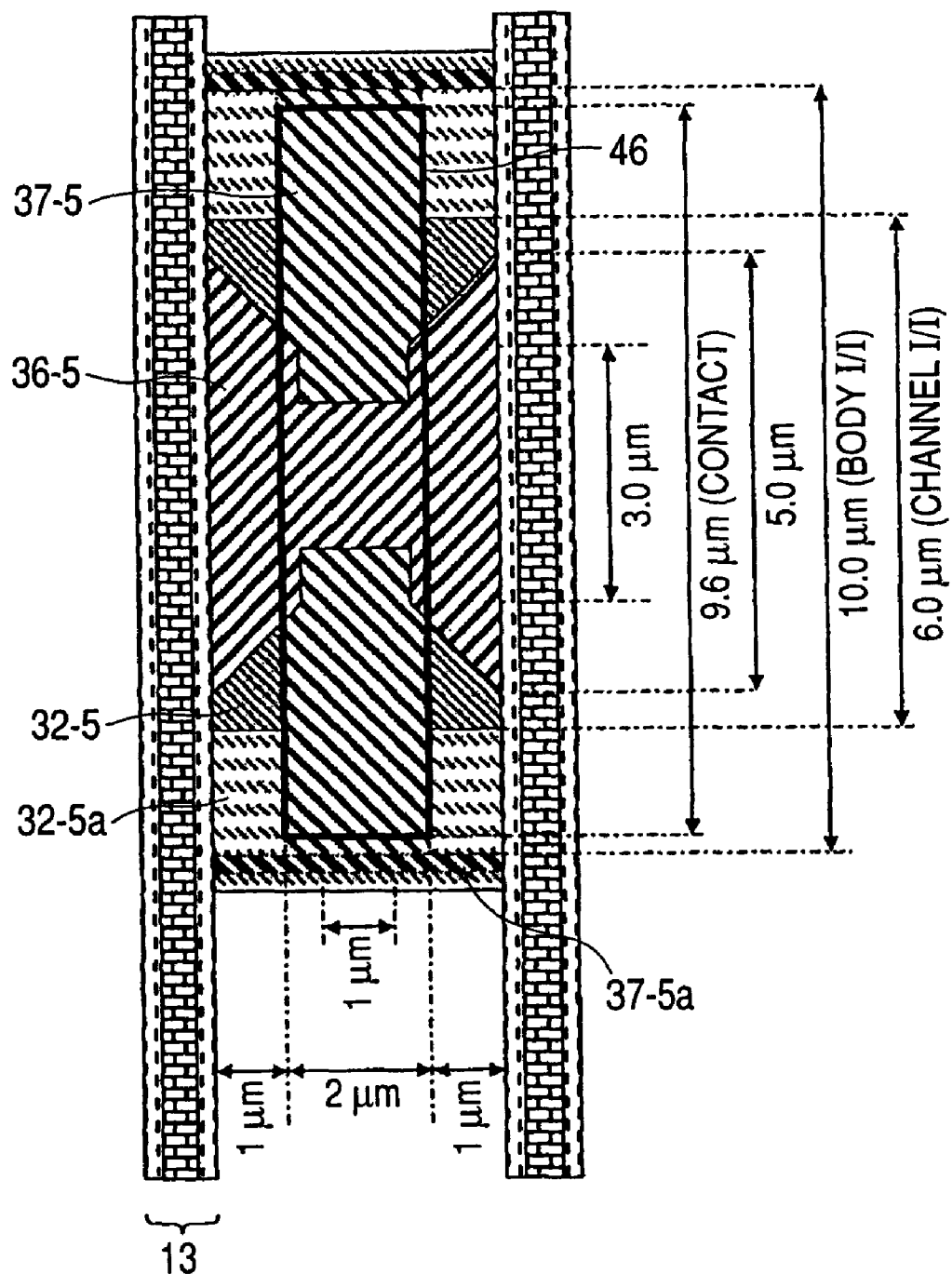
FIG. 27 is an enlarged plan view showing a unit cell region of a vertical IGBT according to Example 8 of the invention.

The vertical IGBT as Example 8 of the vertical and trench type insulated gate MOS semiconductor device according to the invention will be explained with reference to FIG. 27. The manufacturing process of the IGBT is the same as that of Example 4 and the IGBT has a structure in which the structures of the IGBTs in Examples 6 and 7 are combined. The main modification is that p⁺-type body region 37-5 and n⁺-type emitter region 36-5 are formed so that they overlap. With such arrangement, even when mask misalignment unavoidably occurs in a photoetching process, p⁺-type body region 37-5 with a high impurity concentration is formed so as to surely come in contact with n⁺-type emitter region 36-5. Thus, even when mask misalignment occurs, high turn-off capability is stably obtained. In FIG. 27, a p-type channel region is designated by reference numeral 32-5 and the portions of p-type channel region 32-5 and p⁺-type body region 37-5 expanded by heat treatment are designated by reference numerals 32-5a and 37-5a, respectively.

Example 9

Figures 2A, 19:
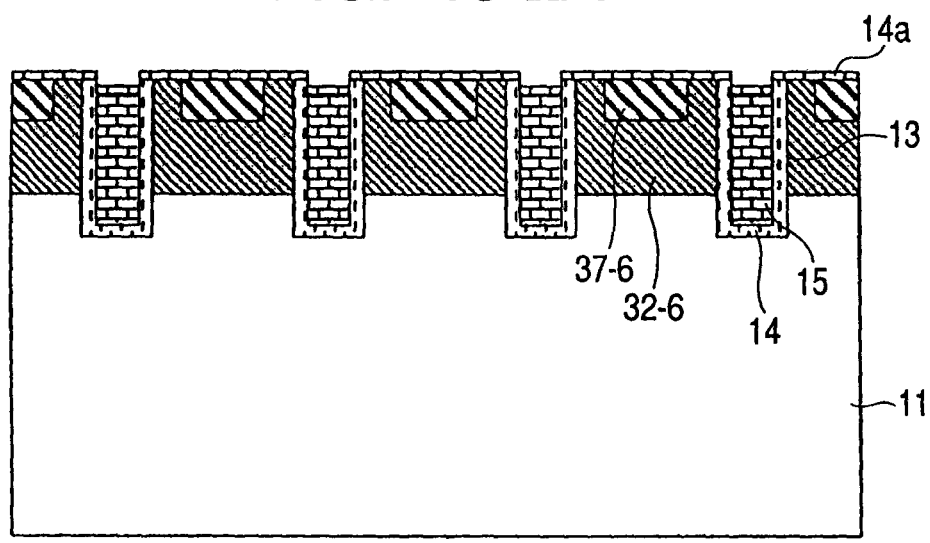
Figures 2B, 19:
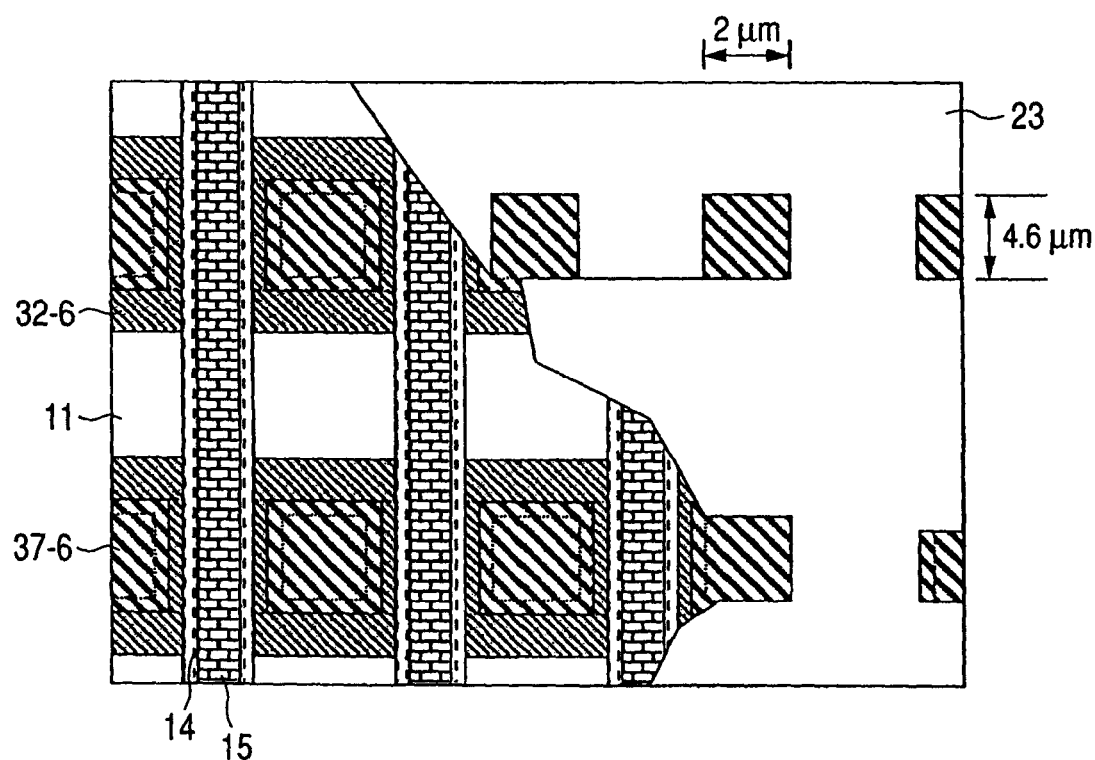

In Example 9, a vertical IGBT with a breakdown voltage of 1200 V is taken as an example of a vertical and trench type insulated gate MOS power semiconductor device and its manufacturing processes will be explained with reference to FIGS. 19-2A and 19-2B, FIGS. 20-2A and 20-2B, FIGS. 28A and 28B, FIG. 29, FIG. 30-1 and FIG. 30-2. First, n⁻-type silicon substrate 11 is prepared as in Example 1 (FIG. 1). N⁻-type silicon substrate 11 has an n-region becoming a base region on the surface thereof whose direction of crystal plane is (100), and has a resistivity of approximately 60 Ωcm. The manufacturing processes prior to that shown in FIGS. 19-2A and 19-2B are approximately the same as the manufacturing processes prior to that shown in FIGS. 19-1A and 19-1B in Example 4.

Figure 28A:
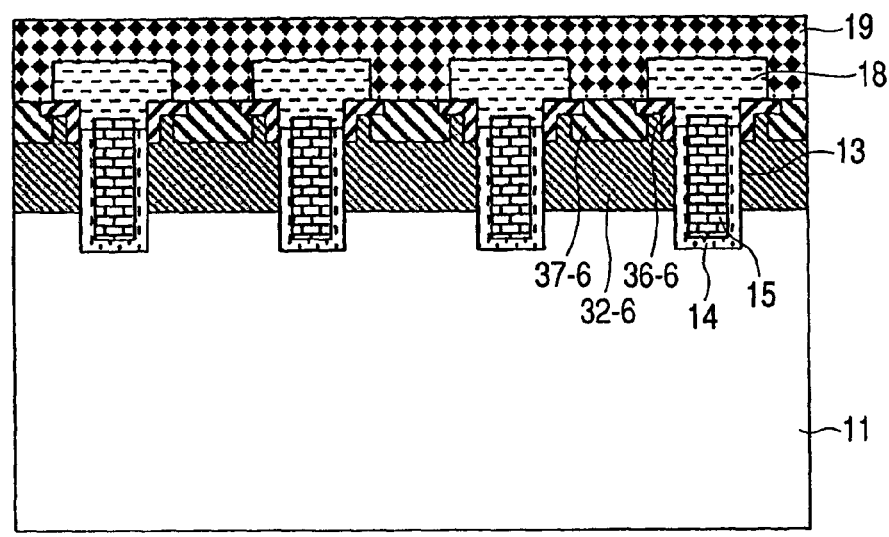
FIG. 28A is a cross sectional view showing the principal part of a silicon substrate in the step in which an interlayer insulator film is deposited on the whole surface of the silicon substrate, contact regions are opened in the interlayer insulator film and an emitter electrode is formed on the whole surface in the manufacturing process of the vertical IGBT according to Example 9 of the invention.
Figure 28B:
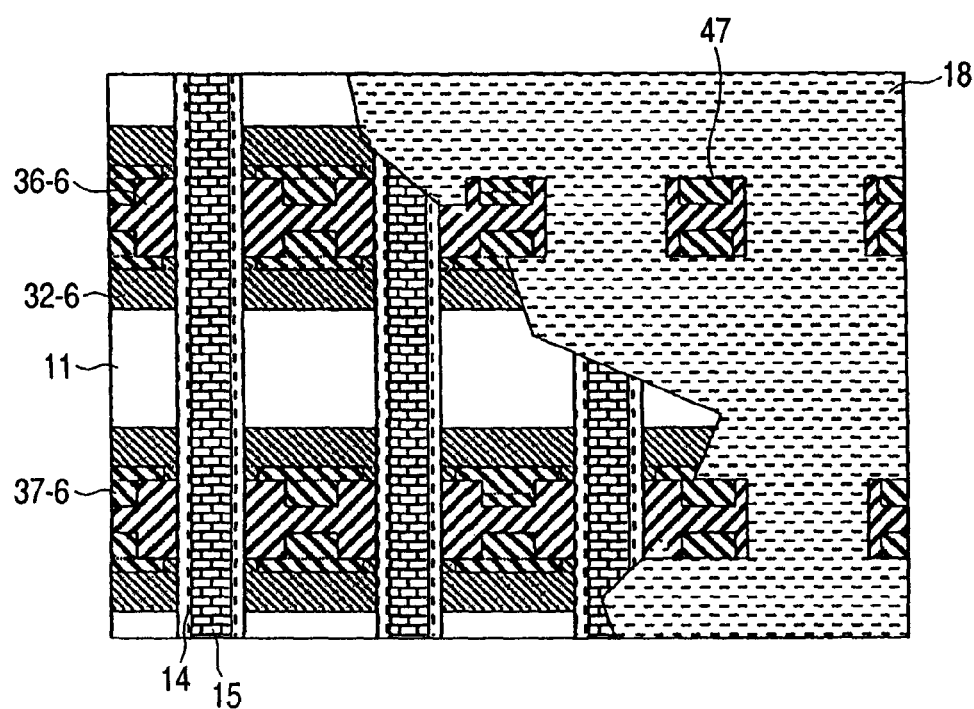
FIG. 28B is a partially cutaway plan view showing the silicon substrate in the step shown in FIG. 28A.

In Example 9, as shown in FIGS. 28A and 28B, interlayer insulator film 18 of a material such as BPSG is deposited on the whole surface of the substrate. Interlayer insulator film 18 is subjected to etching by a photolithography process, by which an opening for providing contact with emitter metal electrode 19 is provided at a position of contact region 47 so that n⁺-type emitter region 36-6 and p⁺-type body region 37-6 are exposed. The dimensions of contact region 47 are shown in FIG. 30-1. In FIG. 30-1, a p-type channel region is designated by reference numeral 32-6 and the portions of p-type channel region 32-6 and p⁺-type body region 37-6 expanded by heat treatment were designated by reference numerals 32-6a and 37-6a, respectively. The length of contact region 47 in the longitudinal direction of trench 13 is shorter than the length of n⁺-type emitter region 36-6 in the longitudinal direction of trench 13. Specific dimensions of the opening were given so that the opening length in the longitudinal direction of trench 13 was 4.5 µm and the opening length in the lateral direction of trench 13 was 2 μm. Then, a metallic material such as aluminum is deposited on the whole surface of n⁻-type silicon substrate 11 by sputtering. The deposited metal film is subjected to patterning by a photolithography process before being alloyed, by which emitter metal electrode 19 to be an emitter electrode is formed on the whole surface of the unit cell region. Furthermore, a passivation film is preferably deposited on the whole surface of a chip. As shown in FIG. 29, as in Example 4, the other principal surface of n⁻-type silicon substrate 11 is polished, on which p⁺-type collector layer 51 is formed by ion implantation and heat treatment. Thereafter, collector electrode 22 is formed, by which a vertical IGBT in a wafer stage is completed.

With p-type channel region 32-6, p⁺-type body region 37-6 and n⁺-type emitter region 36-6 thus formed, as shown by arrows in FIG. 30-2, most of the hole currents flowing in from the sidewall of trench 13 flow into p⁺-type body region 37-6 with a high impurity concentration with a lower electric potential (near the emitter potential) to make it possible to inhibit rise in the electric potential of p-type channel region 32-6. Therefore, such an arrangement makes an NPN transistor formed with n⁺-type emitter region 36-6/p-type channel region 32-6/n⁻-type silicon substrate 11 difficult to operate. As a result, the operation of a parasitic thyristor of the IGBT is difficult, which thyristor is formed with n⁺-type emitter region 36-6/p-type channel region 32-6/n⁻-type silicon substrate 11/p⁺-type collector layer 51. This enables enhancement of turn-off capability.

A turning-off test was carried out also in the IGBT according to Example 9. Like the result of the turning-off test on the IGBT according to Example 4 as shown in FIG. 18B, the IGBT according to Example 9 can be turned-off without being broken down with a current density of 2000 A/cm² to show that a turn-off capability of five times or more can be obtained compared with that of a related IGBT. The enhanced turn-off capability is considered to be a result of locating n⁺-type emitter region 36-6 away from the paths of hole currents flowing in from the sidewall of trench 13 as has been explained to make the operation of the parasitic thyristor of the IGBT difficult, which thyristor is formed with n⁺-type emitter region 36-6/p-type channel region 32-6/n⁻-type silicon substrate 11/p⁺-type collector layer 51.

Example 10

In the following, the vertical IGBT as Example 10 of the vertical and trench type insulated gate MOS semiconductor device according to the invention will be explained, particularly for a contact region with reference to FIG. 31. The manufacturing process of the IGBT is the same as that of Example 9 with the shape of p⁺-type body region 37-7 only modified from that in Example 9, so that the explanation of the process will be omitted. The main modification is that p⁺-type body region 37-7, formed long while being extended from n⁺-type emitter region 36-7 in the longitudinal direction of trench 13, is formed so as to sufficiently make contact with the sidewall of trench 13. By forming p⁺-type body region 37-7 so as to sufficiently make contact with the sidewall of trench 13, most of the hole currents flowing in from the sidewall of trench 13 flow into p⁺-type body region 37-7 to make it possible to inhibit rise in the electric potential of p-type channel region 32-7. Therefore, turn-off capability higher than that of the IGBT in Example 9 can be obtained. In FIG. 31, the portions of p-type channel region 32-7 and p⁺-type body region 37-7 expanded by heat treatment are designated by reference numerals 32-7a and 37-7a, respectively.

Example 11

The vertical IGBT as Example 11 of the vertical and trench type insulated gate MOS semiconductor device according to the invention will be explained, particularly for a contact region with reference to FIG. 32. The manufacturing process of the IGBT is the same as that of Example 9, so that the explanation of the process will be omitted. The main modification is that the angle formed by the trench 13 and a side of the n⁺-type emitter region 36-8 intersecting the trench 13 is 45 degrees rather than 90 degrees. By modifying the shape of the n⁺-type emitter region 36-8, the n⁺-type emitter region 36-8 on hole current paths can be small to make an NPN transistor formed with the n⁺-type emitter region 36-8/the p-type channel region 32-8/the n⁻-type silicon substrate 11 hard to be operated. As a result, the operation of a parasitic thyristor of the IGBT is difficult, which thyristor is formed with n⁺-type emitter region 36-8/p-type channel region 32-8/n⁻-type silicon substrate 11/p⁺-type collector layer 51. This enables enhancement of turn-off capability. In FIG. 32, a p⁺-type body region is designated by reference numeral 37-8 and the portions of p-type channel region 32-8 and p⁺-type body region 37-8 expanded by heat treatment are designated by reference numerals 32-8a and 37-8a, respectively.

Example 12

The vertical IGBT as Example 12 of the vertical and trench type insulated gate MOS semiconductor device according to the invention will be explained, particularly for a contact region with reference to FIG. 33. The manufacturing process of the IGBT is the same as that of Example 9, so that the explanation of the process will be omitted. The IGBT in Example 12 has a structure in which the structures of the IGBTs in Example 10 and the Example 11 are combined. The main modification is that p⁺-type body region 37-9 and n⁺-type emitter region 36-9 are formed so that they overlap. With such an arrangement, even when mask misalignment unavoidably occurs in a photoetching process, p⁺-type body region 37-9 with a high impurity concentration is formed so as to surely come in contact with n⁺-type emitter region 36-9. Thus, there is a merit that high turn-off capability can be stably obtained even when mask misalignment occurs. In FIG. 33, a p-type channel region is designated by reference numeral 32-9 and the portions of p-type channel region 32-9 and p⁺-type body region 37-9 expanded by heat treatment are designated by reference numerals 32-9a and 37-9a, respectively.

As has been explained in the foregoing, the invention relates to a vertical and trench type IGBT as a vertical and trench type insulated gate MOS semiconductor device which has trenches each being formed in a straight line, an insulator film formed in each of the trenches and a control electrode buried in each of the trenches with the insulator film provided between and in which first conductivity type regions and second conductivity type regions alternate in the longitudinal direction of the trench. In the vertical and trench type IGBT, the shape of a contact region for making the n⁺-type emitter region and the p⁺-type body region in contact with the emitter electrode is most suitable to enable turn-off capability to be enhanced by a considerably simple method without increasing the number of manufacturing processes.

Example 13

Figure 34:
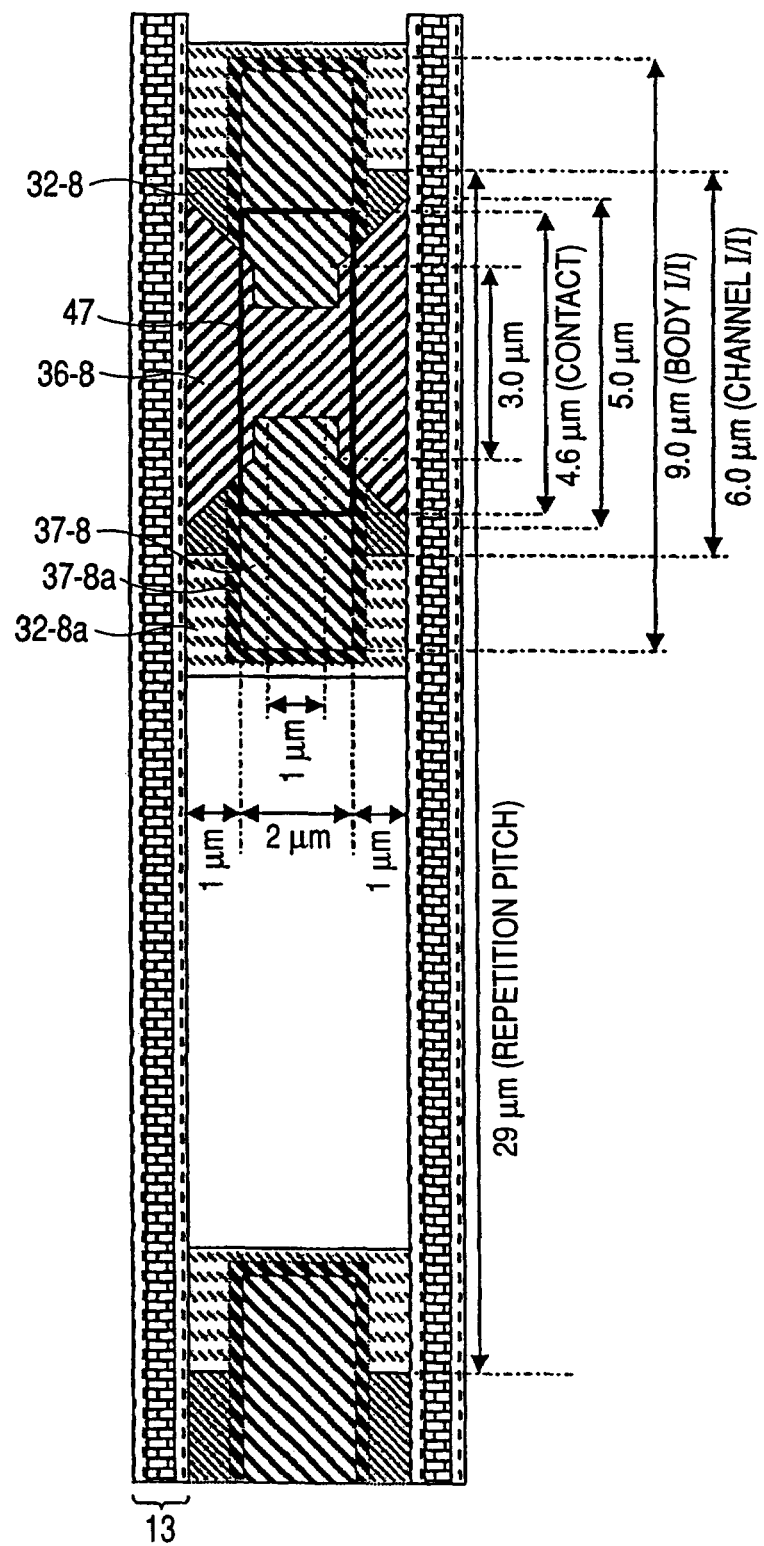
FIG. 34 is an enlarged plan view showing a unit cell region of the vertical IGBT according to Example 11 of the invention.
Figure 35:
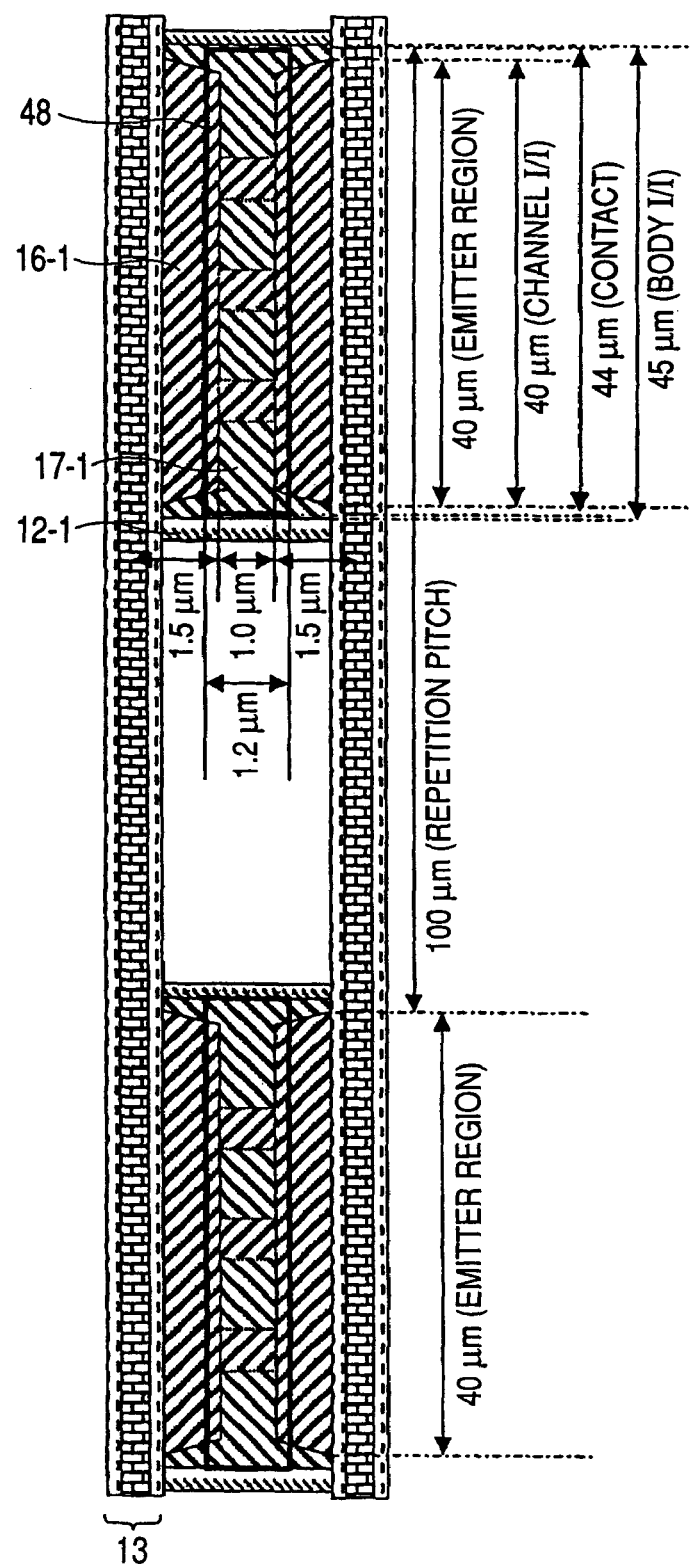
FIG. 35 is an enlarged plan view showing a unit cell region of a vertical IGBT according to Example 13 of the invention when $R_{Emitter}$ is taken as $R_{Emitter}$=40%.

The vertical IGBT as Example 13 of the vertical and trench type insulated gate MOS semiconductor device according to the invention will be explained. In Example 13, an IGBT with a breakdown voltage of 1200 V is taken as an example of a vertical and trench type insulated gate MOS power semiconductor device for hybrid vehicle and its manufacturing processes are explained. Since the manufacturing processes are basically the same as the manufacturing processes of Example 1 shown in FIG. 1 to FIG. 9 except for the patterns and the dimensions in each region, explanations about similar manufacturing processes are omitted and differences in the processes are emphasized. The manufacturing processes corresponding to those shown in FIG. 1 to FIG. 5B about Example 1 are approximately the same as those of Example 1. The subsequent manufacturing processes are similar to those in Example 4 except that the processes shown in FIGS. 6A and 6B, FIGS. 7A and 7B and FIGS. 8A and 8B about Example 1 or those shown in FIGS. 19-1A and 19-1B, FIGS. 20-1A and 20-1B and FIGS. 21A and 21B about Example 4 are changed to those shown in FIGS. 42A and 42B, FIGS. 43A and 43B and FIGS. 44A and 44B. An enlarged plan view showing a unit cell region of the vertical IGBT according to Example 13 is shown in FIG. 35. For comparing the IGBT according to Example 13 with the IGBT according to Example 11, an enlarged plan view of a unit cell region of the vertical IGBT according to Example 11 is shown in FIG. 34.

Figure 42A:
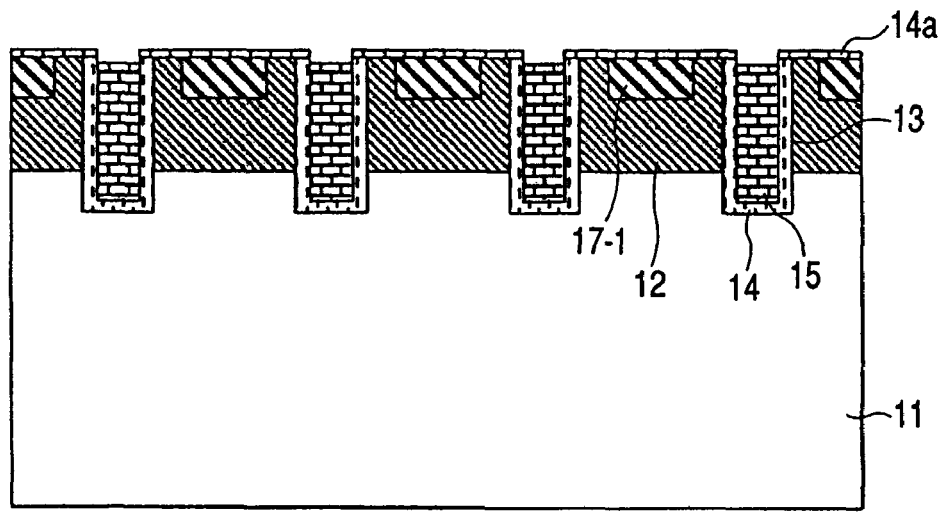
FIG. 42A is a cross sectional view showing a principal part of the silicon substrate in a state in which trenches each with a gate electrode buried therein, p-type channel regions, p$^+$-type body regions and an oxide film are formed on the top surface side of the substrate in the manufacturing process of the vertical IGBT according to Example 13 of the invention.
Figure 42B:
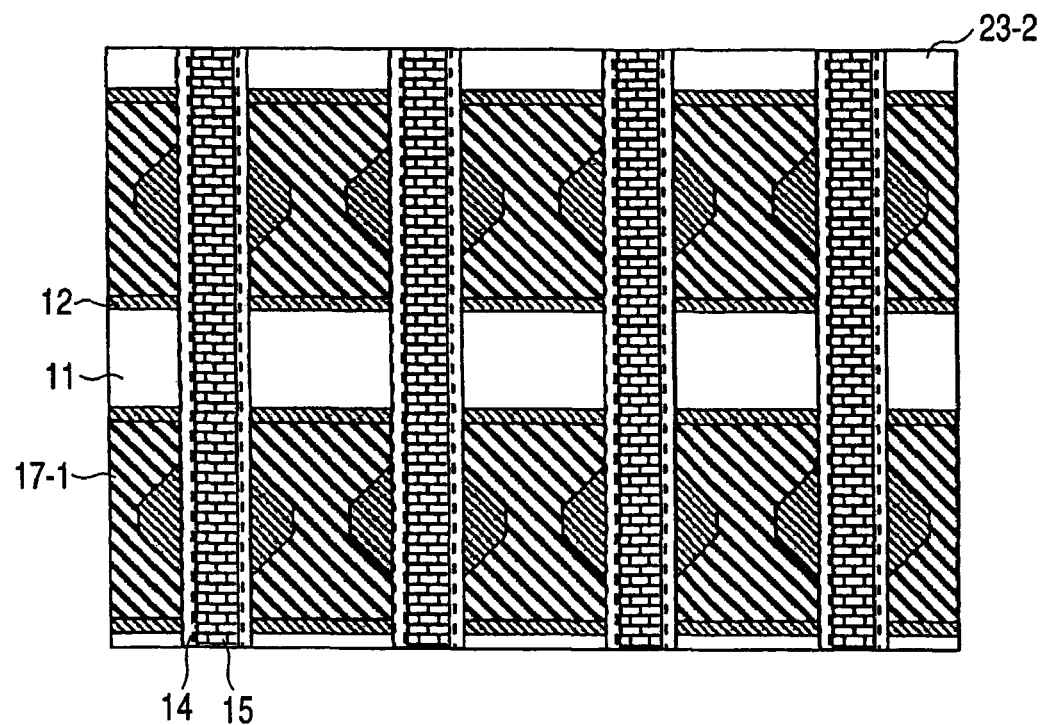
FIG. 42B is a plan view showing the silicon substrate in the process shown in FIG. 42A.

First, n⁻-type silicon substrate 11 is prepared. N⁻-type silicon substrate 11, like n⁻-type silicon substrate 11 in Example 1 shown in FIG. 1, has an n⁻-region becoming a base region on the surface thereof whose direction of crystal plane is (100), but in Example 13 its resistivity is changed from approximately 30 Ωcm in Example 1 to approximately 50 Ωcm. The other processes prior to the manufacturing process shown in FIGS. 42A and 42B are approximately the same as those shown in FIG. 1 to FIG. 5B in Example 1. In Example 13, however, the width of a stripe-like trench was taken as 0.8 µm, the spacing between the trenches adjacent to each other was taken as 4 µm and the thickness of the gate oxide film formed on the inner surface of the trench was taken as 140 nm to 170 nm. Moreover, the repetition pitch ($Z_{Unit}$) of the channel region, formed on the surface of the semiconductor substrate between the trenches, in the longitudinal direction of the trench was taken as 100 µm and the length of the channel region in the longitudinal direction was taken as 40 µm. In this case, the ratio ($R_{Emitter}$) of the length of the channel region 12-1 to the repetition pitch ($Z_{Unit}$) is 40%.

The subsequent manufacturing processes corresponding to those shown in FIGS. 6A and 6B, FIGS. 7A and 7B and FIGS. 8A and 8B about Example 1 or those shown in FIGS. 19-1A and 19-1B, FIGS. 20-1A and 20-1B and FIGS. 21A and 21B about Example 4 are changed to those shown in FIGS. 42A and 42B, FIGS. 43A and 43B and FIGS. 44A and 44B. In Example 13, the dimensions of p⁺-type body region 17-1 and n⁺-type emitter region 16-1 are different from those shown in FIGS. 7A and 7B and FIGS. 8A and 8B about Example 1 or those shown in FIGS. 20-1A and 20-1B and FIGS. 21A and 21B about Example 4. Namely, as shown in FIG. 35 and FIGS. 42A and 42B, the width for boron ion implantation in the longitudinal direction of the trench for forming p⁺-type body region 17-1 was changed to 100 µm×0.4+5 µm=45 µm (FIG. 35).

Figure 43A:
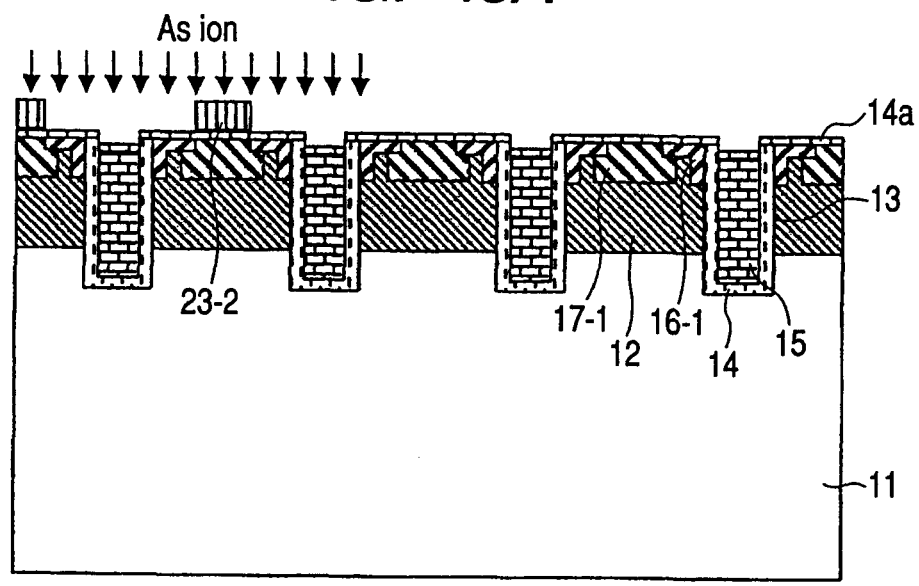
FIG. 43A is a cross sectional view showing the principal part of the silicon substrate in a state in which n$^+$-type emitter regions are formed on the top surface side thereof in the step subsequent to the step shown in FIGS. 42A and 42B.
Figure 43B:
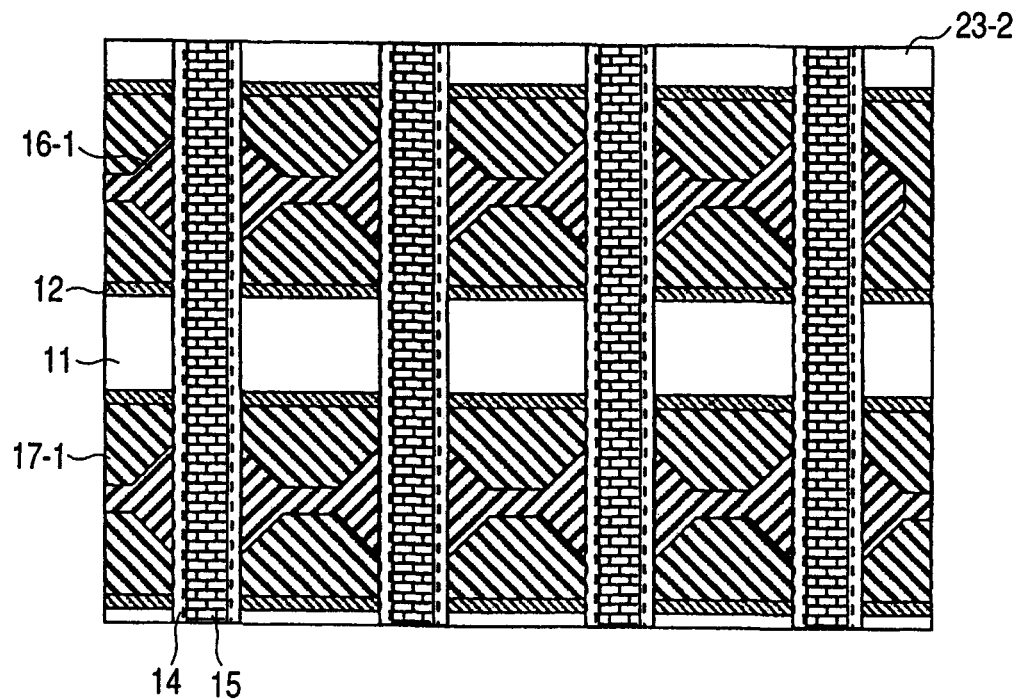
FIG. 43B is a plan view showing the silicon substrate in the step shown in FIG. 43A.

Next, as shown in FIGS. 43A and 43B, by a photolithography process, resist mask 23-2 is formed with opening dimensions that differ from those in Example 4. With the use of resist mask 23-2, ion implantation with arsenic (As) ions is carried out with subsequent heat treatment as in Example 1 to thereby form n⁺-type emitter region 16-1. The specific plane dimension of n⁺-type emitter region 16-1 was taken as 40 µm as shown in FIG. 35. The ratio ($R_{Emitter}$) of the length of n⁺-type emitter region 16-1 to the repetition pitch ($Z_{Unit}$) is 40%.

Figure 44A:
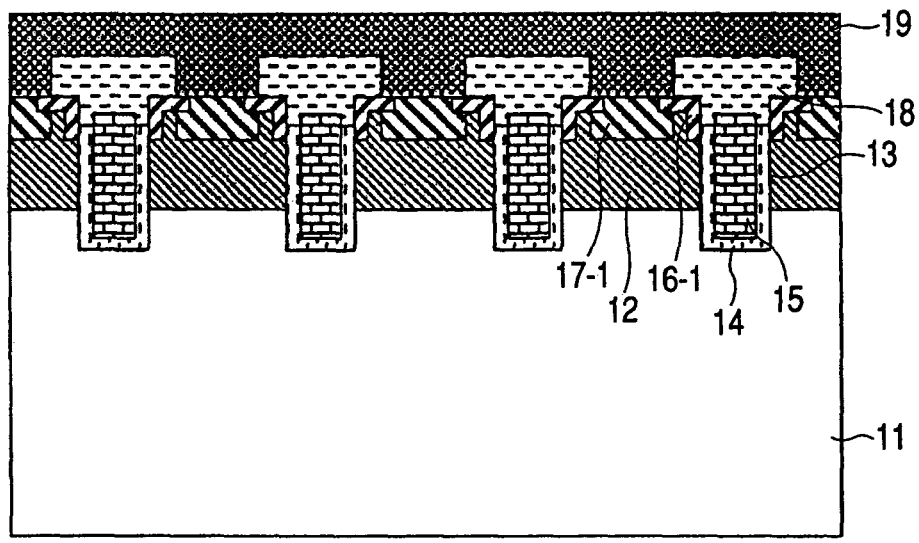
FIG. 44A is a cross sectional view showing the principal part of the silicon substrate in a state in which an interlayer insulator film is made deposited on the whole surface of the silicon substrate, openings are provided at contact regions in the interlayer insulator film and an emitter electrode is formed on the whole surface in the step subsequent to the step shown in FIGS. 43A and 43B.
Figure 44B:
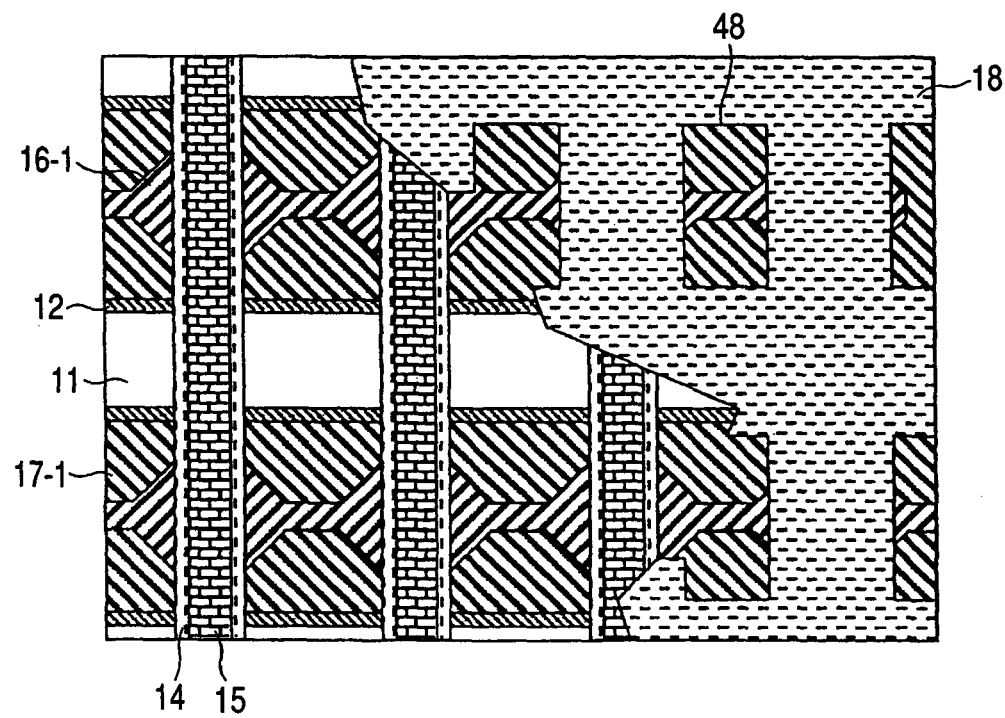
FIG. 44B is a partially cutaway plan view showing the silicon substrate in the step shown in FIG. 44A.

Following this, as shown in FIGS. 44A and 44B, interlayer insulator film 18 of a material such as BPSG is deposited on the whole surface of the substrate. Therefore, interlayer insulator film 18 is formed so as to cover gate electrode 15 in trench 13. Interlayer insulator film 18 is subjected to etching by a photolithography process, by which an opening is formed at the position of contact region 48 so that n⁺-type emitter region 16-1 and p⁺-type body region 17-1 on the substrate surface are exposed. At this time, the length of the opening in the longitudinal direction of trench 13 in interlayer insulator film 18 is longer than the length of n⁺-type emitter region 16-1 in the longitudinal direction of trench 13. In Example 13, the specific dimensions of the opening for making n⁺-type emitter region 16-1 and p⁺-type body region 17-1 contact with emitter electrode 19 at contact region 48 were given so that the opening length in the longitudinal direction of trench 13 was 44 µm and the opening length in the lateral direction of trench 13 was 1.2 µm as shown in FIG. 35. With subsequent manufacturing processes similarly carried out as those in Example 1 or Example 4, a vertical IGBT in a wafer stage is completed.

The form of the unit cell region when the ratio ($R_{Emitter}$) in Example 13 is taken as $R_{Emitter}$=40% becomes such a form as to have the dimensions as shown in FIG. 35. In the following, the length (width) of each region in the longitudinal direction of the trench will be shown. Namely, the length of each region is 40 µm in n⁺-type emitter region 16-1, 40 µm in p-type channel region 12-1, 44 µm in contact region 48, 45 µm in p⁺-type body region 17-1 and 100 µm in the repetition pitch of p-type channel region 12-1. The length (width) of each region in the longitudinal direction of the trench in the unit cell region shown in FIG. 34 according to Example 11, which is shown for comparison, is 5.0 µm in n⁺-type emitter region 36-8, 6.0 µm in p-type channel region 32-8, 4.6 µm in contact region 47, 9.0 µm in p⁺-type body region 37-8 and 29 µm for the repetition pitch of p-type channel region 32-8.

Figure 36:
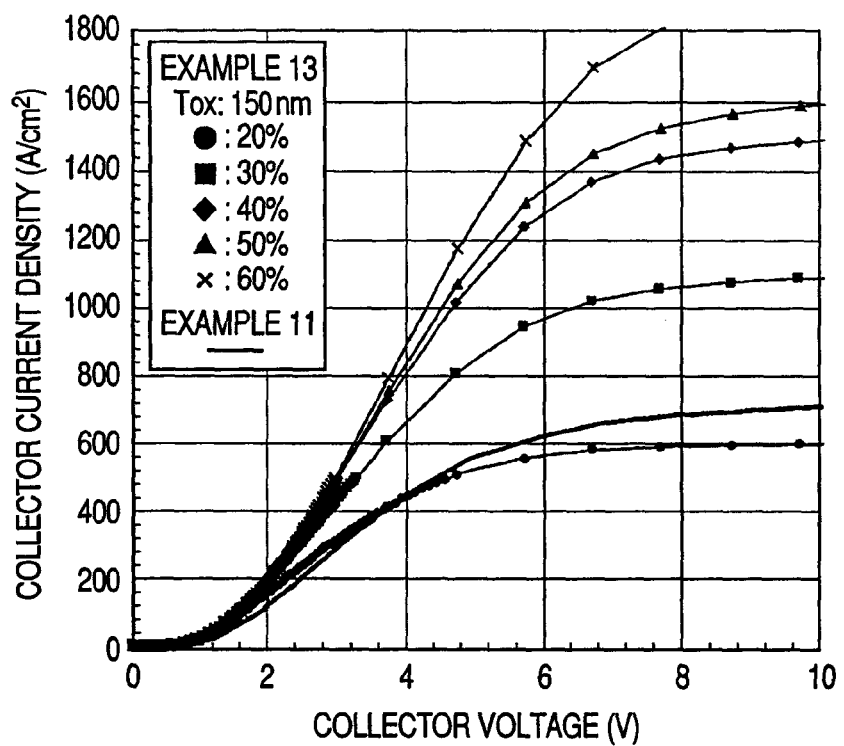
FIG. 36 is a diagram showing I-V output characteristics of the vertical IGBT according to Example 13 of the invention compared with that of the IGBT according to Example 11 of the invention.
Figure 37:
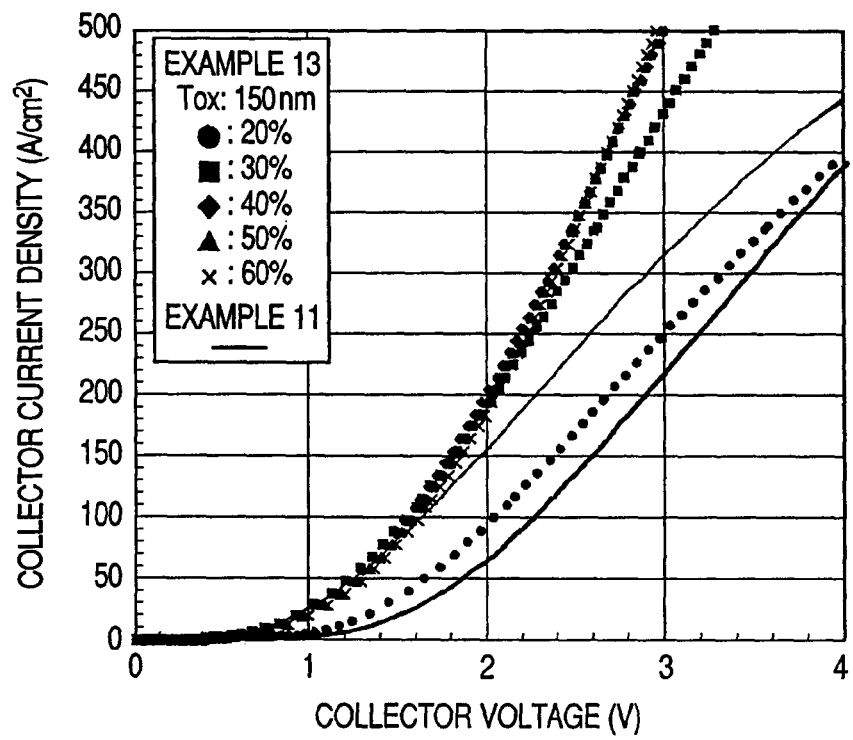
FIG. 37 is a diagram showing I-V output characteristics of the vertical IGBT according to Example 13 of the invention compared with that of the IGBT according to Example 11 of the invention, and is a close-up of region of low collector density of the I-V output characteristics in FIG. 36.

The I-V output characteristics in the IGBT according to Example 13, formed as explained above with the pattern arrangement formed as shown in FIG. 35, are shown in FIG. 36 and FIG. 37. The I-V output characteristics are obtained when $R_{Emitter}$ was varied within the range between 20% to 60% with the thickness of the gate oxide film taken as 140 nm to 170 nm (150 nm in FIGS. 36 and 37). The similar output I-V characteristics in the IGBT according to Example 11 with the pattern arrangement shown in the previous FIG. 34 are also shown in FIG. 36 and FIG. 37.

As is apparent from FIG. 36, in the IGBT in Example 11, its saturation current density is on the order of 700 A/cm² and the on-voltage at 400 A/cm² is on the order of 3.6 V. Compared with this, in the IGBT in Example 13, with $R_{Emitter}$ brought to 30% or more, it is shown that its current is made to become saturated at a current density of 1100 A/cm² and its on-voltage can also be lowered to 3 V or less at 400 A/cm². However, also in Example 13, when $R_{Emitter}$ is brought to 20%, the saturation current density is as low as 600 A/cm² and the on-voltage is high as being on the order of 3.6 V.

Namely, for making a saturation current density high and making an on-voltage low, it can be said that the saturation current density must be kept at least three times or more than a current density being used and, for this, further the total emitter length (width) per unit area of the device must be kept more than the specified value.

The total emitter lengths (widths) per unit area of the device when the values of $R_{Emitter}$ of the device are taken as 30% and 40% are calculated as 7.5 m/cm² and 10 m/cm², respectively. Namely, by taking the total emitter length (width) per unit area as 7.5 m/cm² and desirably taking the total emitter length (width) per unit area as 10 m/cm², a low on-voltage can be achieved with a high current density (400 A/cm²).

Figure 38:
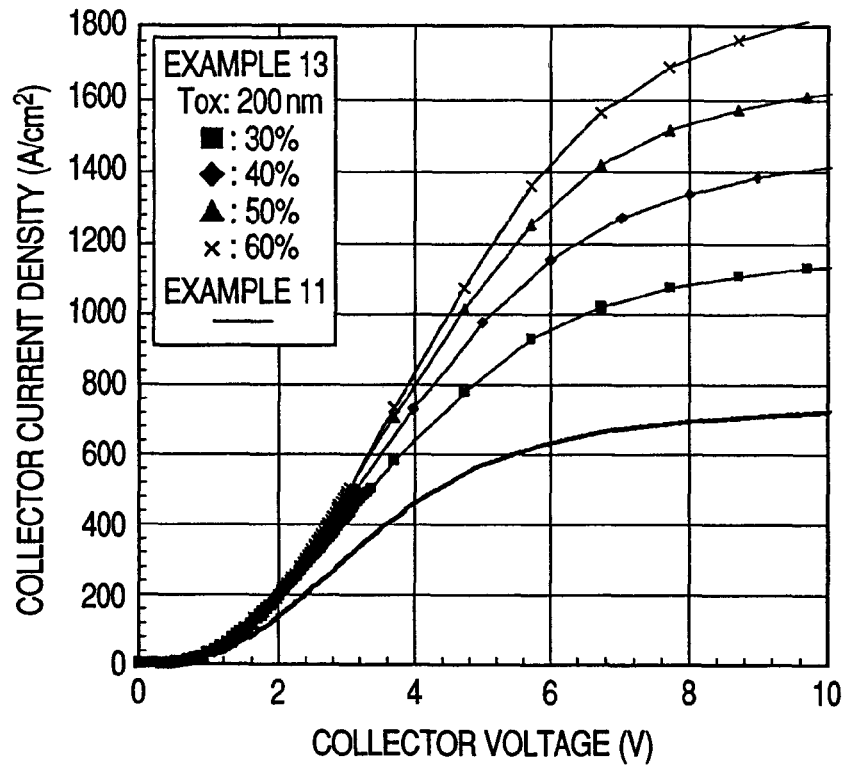
FIG. 38 is a diagram showing I-V output characteristics of the vertical IGBT according to Example 13 of the invention compared with that of the IGBT according to Example 11 of the invention when the thickness of the gate oxide layer of the vertical IGBT according to Example 13 is increased.
Figure 39:
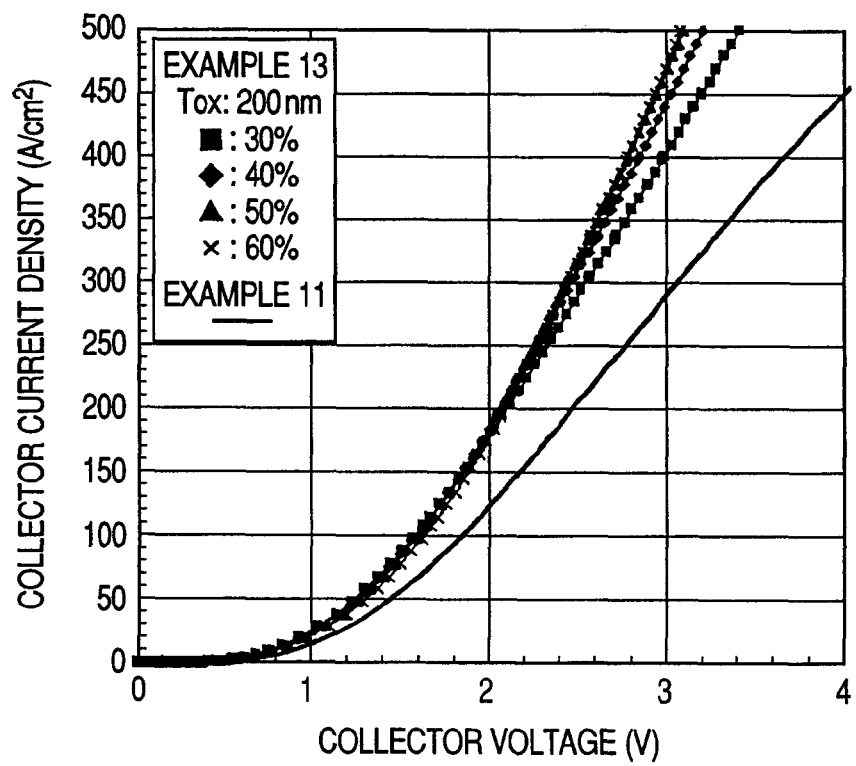
FIG. 39 is a diagram showing I-V output characteristics of the vertical IGBT according to Example 13 of the invention compared with that of the IGBT according to Example 11 of the invention when the thickness of the gate oxide layer of the vertical IGBT according to Example 13 is increased, and is a close-up of region of low collector current density of the I-V output characteristics in FIG. 38.

Furthermore, about the IGBT according to Example 13 with the pattern arrangement formed as shown in FIG. 35, the I-V output characteristics are shown in FIG. 38 and FIG. 39, which characteristics were obtained when $R_{Emitter}$ was varied within the range between 20% to 60% with the thickness of the gate oxide film increased to 190 nm to 230 nm. Also about the IGBT according to Example 11 with the pattern arrangement formed as shown in the previous FIG. 34, similar I-V output characteristics are shown in FIG. 38 and FIG. 39. As is apparent from FIG. 38 and FIG. 39, also in the case when the thickness of the gate oxide layer is 200 nm, there is exhibited a tendency similar to that exhibited when the gate oxide film thickness is 150 nm. Thus, it is known that that the saturation current density must be kept at least three times or more than the current density being used and, for this, further the total emitter length (width) per unit area of the device must be kept more than the specified value.

Namely, it is desirable that $R_{Emitter}$ is brought to 30% or more. Therefore, by taking the total emitter length (width) per unit area as 7.5 m/cm² and desirably taking the total emitter length (width) per unit area as 10 m/cm², a low on-voltage can be achieved with a high current density (400 A/cm²).

Figure 40:
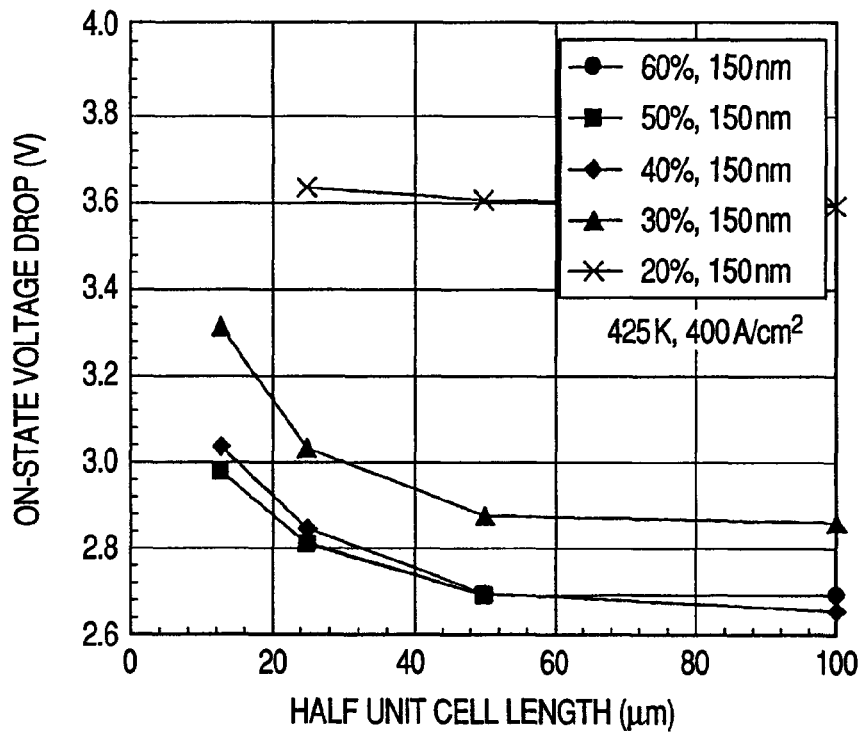
FIG. 40 is a diagram showing the relation between an on-voltage and a half unit cell length when the current density is 400 A/cm$^2$ in the IGBT according to Example 13.
Figure 41:
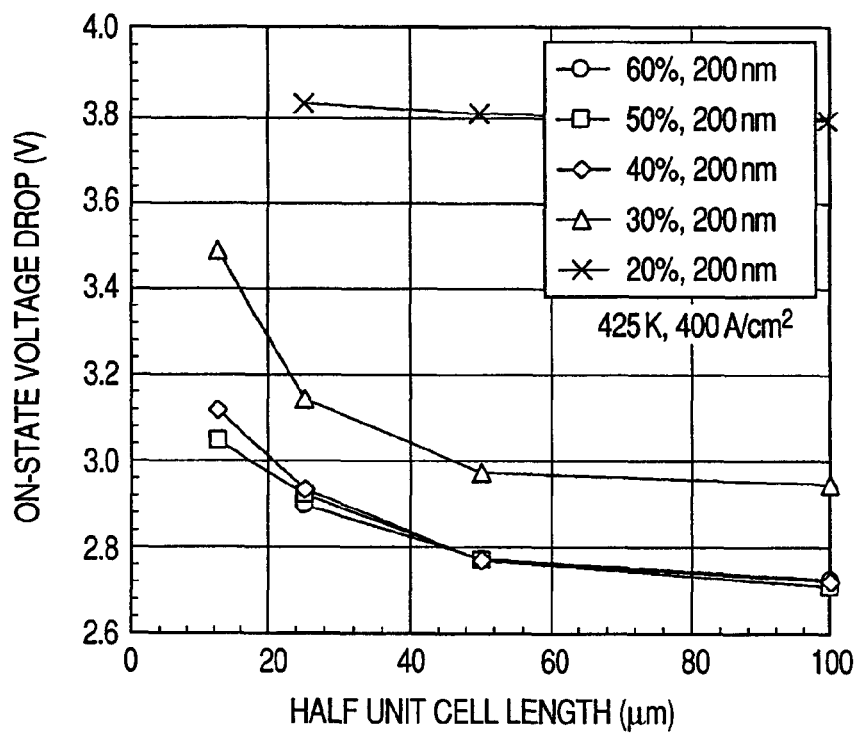
FIG. 41 is a diagram showing the relation between an on-voltage and a half unit cell length when the current density is 400 A/cm$^2$ in the IGBT according to Example 13 with the thickness of the gate oxide layer thereof increased.

FIG. 40 is a diagram showing relations between the on-voltage and the half unit cell length when the thickness of the gate oxide film in the IGBT in Example 13 is on the order of 140 to 170 nm (150 nm in FIG. 40). The diagram shows the case when the current density is 400 A/cm² and the ratio ($R_{Emitter}$) of the length (width) of the emitter in the longitudinal direction of the trench to the repetition pitch ($Z_{Unit}$) of the width of the emitter in the longitudinal direction of the trench is taken as a parameter. Moreover, FIG. 41 is a diagram showing relations between the on-voltage and the half unit cell length when the thickness of the gate oxide film in the IGBT according to Example 13 is made to be on the order of 190 to 230 nm (200 nm in FIG. 40). The diagram shows the case when the current density is 400 A/cm² and the ratio ($R_{Emitter}$) of the length (width) of the emitter in the longitudinal direction of the trench to the repetition pitch ($Z_{Unit}$) of the width of the emitter in the longitudinal direction of the trench is taken as a parameter.

According to Example 13 explained in the foregoing, the following tendencies are observed from each of the diagrams. Large increase in on-voltage is observed at the emitter length (width) ratio ($R_{Emitter}$) of 20% to 30%, which means deterioration of on-voltage. With emitter length (width) ratios ($R_{Emitter}$) of 40% or above, the on-voltage is almost equal. The on-voltage is reduced more as the repetition pitch ($Z_{Unit}$) of the width of the emitter in the longitudinal direction of the trench becomes longer, but shows a tendency to saturate. Therefore, even though the repetition pitch is made longer than necessary, the effect of on-voltage reduction is limited. Namely, with the emitter length (width) ratios ($R_{Emitter}$) made 30% or above, desirably 40% or above, a low on-voltage and a high current density can be made compatible. In addition, with the repetition pitch ($Z_{Unit}$) made 50 μm or above, desirably 100 μm or above, a low on-voltage and a high current density can be made compatible.

Thus, a vertical and trench type insulated gate MOS semiconductor device has been described according to the present invention. The above explained vertical and trench type insulated gate MOS semiconductor devices according to the invention are only examples and in addition to this, and many modifications and variations may be made to the techniques and structures described and illustrated herein without departing from the spirit and scope of the invention. Accordingly, it should be understood that the devices and processes described herein are illustrative only and are not limiting upon the scope of the invention.

What is claimed is:

1. A vertical and trench type insulated gate MOS semiconductor device comprising:
    a first conductivity type semiconductor substrate;
    a second conductivity type channel region selectively formed on a first principal surface of the semiconductor substrate;
    a first conductivity type emitter region selectively formed on a surface of the second conductivity type channel region;
    trenches, each having a depth that extends through the second conductivity type channel region and into the semiconductor substrate, arranged in parallel in a parallel stripe surface pattern;
    a polysilicon gate electrode buried in each of the trenches with a gate insulator film interposed between the gate electrode and a sidewall of each of the trenches;
    an emitter electrode contacting both a surface of the first conductivity type emitter region and the surface of the second conductivity type channel region in a contact region, the contact region being between the trenches as a region including surfaces of both a portion of the first conductivity type emitter region and a portion of the second conductivity type channel region;
    a collector layer formed on a second principal surface of the first conductivity type semiconductor substrate; and
    a collector electrode making contact with a surface of the collector layer,
    wherein surfaces of the second conductivity type channel regions and surfaces of portions of the first conductivity type semiconductor substrate alternate in the longitudinal direction of the trenches between the trenches arranged in parallel, and
    wherein the first conductivity type emitter region selectively formed on the surface of the second conductivity type channel region has a surface shape that is wider at the side of each trench than it is at the center between the trenches.

2. The vertical and trench type insulated gate MOS semiconductor device as claimed in claim 1, wherein the first conductivity type emitter region makes contact with the trenches with a side having a length which is shorter than the length of the contact region in the longitudinal direction of the trenches.

3. The vertical and trench type insulated gate MOS semiconductor device as claimed in claim 1, wherein the first conductivity type emitter region makes contact with the trenches with a side having a length which is longer than the length of the contact region in the longitudinal direction of the trenches.

4. The vertical and trench type insulated gate MOS semiconductor device as claimed in claim 1, wherein the first conductivity type emitter region has a side intersecting the trenches at approximately 45 degrees.

5. The semiconductor device as claimed in claim 1, wherein a second conductivity type body region is formed in the second conductivity type channel region, the body region being wider than that of the contact region and having an impurity concentration higher than that of the channel region.

6. A vertical and trench type insulated gate MOS semiconductor device comprising:
a first conductivity type semiconductor substrate;
a second conductivity type channel region selectively formed on a first principal surface of the semiconductor substrate;
a first conductivity type emitter region selectively formed on a surface of the second conductivity type channel region;
a second conductivity type body region selectively formed on the surface of the second conductivity type channel region and having an impurity concentration higher than that of the second conductivity type channel region;
trenches, each having a depth that extends through the second conductivity type channel region and into the semiconductor substrate, arranged in parallel in a parallel stripe surface pattern;
a polysilicon gate electrode buried in each of the trenches with a gate insulator film interposed between the gate electrode and a sidewall of each of the trenches;
an emitter electrode making contact with a surface of the first conductivity type emitter region, a surface of the second conductivity type body region and a surface of the second conductivity type channel region in a contact region, the contact region being between the trenches as a region including surfaces of a portion of the first conductivity type emitter region, a portion of the second conductivity type body region and a portion of the second conductivity type channel region;
a collector layer formed on a second principal surface of the first conductivity type semiconductor substrate; and
a collector electrode making contact with a surface of the collector layer,
wherein surfaces of the second conductivity type channel regions and surfaces of portions of the first conductivity type semiconductor substrate alternate in the longitudinal direction of the trenches between the trenches arranged in parallel,
wherein the first conductivity type emitter region selectively formed on the surface of the second conductivity type channel region has a surface shape that is wider at the side of each trench than it is at the center between the trenches, and
the second conductivity type body region has a length in the longitudinal direction of the trenches that is longer than the length of the first conductivity type emitter region in the longitudinal direction of the trenches.

7. A vertical and trench type insulated gate MOS semiconductor device comprising:
a first conductivity type semiconductor substrate;
a second conductivity type channel region selectively formed on a first principal surface of the semiconductor substrate;
a first conductivity type emitter region selectively formed on a surface of the second conductivity type channel region;
a second conductivity type body region selectively formed on the surface of the second conductivity type channel region and having an impurity concentration higher than that of the second conductivity type channel region;
trenches, each having a depth that extends through the second conductivity type channel region and into the semiconductor substrate, arranged in parallel in a parallel stripe surface pattern;
a polysilicon gate electrode buried in each of the trenches with a gate insulator film interposed between the gate electrode and a sidewall of each of the trenches;
an emitter electrode making contact with a surface of the first conductivity type emitter region, the surface of the second conductivity type body region and a surface of the second conductivity type channel region in a contact region, the contact region being between the trenches as a region including the surfaces of a portion of the first conductivity type emitter region, a portion of the second conductivity type body region and a portion of the second conductivity type channel region;
a collector layer formed on a second principal surface of the first conductivity type semiconductor substrate; and
a collector electrode making contact with a surface of the collector layer,
wherein surfaces of the second conductivity type channel regions and surfaces of portions of the first conductivity type semiconductor substrate alternate in the longitudinal direction of the trenches between the trenches arranged in parallel, and
the second conductivity type body region has a length in the longitudinal direction of the trenches that is longer than the length of the first conductivity type emitter region in the longitudinal direction of the trenches.

8. The vertical and trench type insulated gate MOS semiconductor device as claimed in claim 1, wherein the first conductivity type emitter region selectively formed on the surface of the second conductivity type channel region has the surface shape comprising a portion of a first width at each end where it contacts the side of the trench and a center portion of a second width which lies between and connects the portions of the first width, wherein the second width is narrower than the first width.

9. The vertical and trench type insulated gate MOS semiconductor device as claimed in claim 1, wherein the first conductivity type emitter region selectively formed on the surface of the second conductivity type channel region has the surface shape like a dumbbell.

10. The vertical and trench type insulated gate MOS semiconductor device as claimed in claim 6, wherein the first conductivity type emitter region selectively formed on the surface of the second conductivity type channel region has the surface shape comprising a portion of a first width at each end where it contacts the side of the trench and a center portion of a second width which lies between and connects the portions of the first width, wherein the second width is narrower than the first width.

11. The vertical and trench type insulated gate MOS semiconductor device as claimed in claim 10, wherein the first conductivity type emitter region selectively formed on the surface of the second conductivity type channel region has the surface shape like a dumbbell.

12. The vertical and trench type insulated gate MOS semiconductor device as claimed in claim 7, wherein the first conductivity type emitter region selectively formed on the surface of the second conductivity type channel region has a surface shape comprising a portion of a first width at each end where it contacts the side of the trench and a center portion of a second width which lies between and connects the portions of the first width, wherein the second width is narrower than the first width.

13. The vertical and trench type insulated gate MOS semiconductor device as claimed in claim 12, wherein the first conductivity type emitter region selectively formed on the surface of the second conductivity type channel region has the surface shape like a dumbbell.

14. The vertical and trench type insulated gate MOS semiconductor device as claimed in claim 1, wherein the first conductivity type emitter region has a pattern with a length in the longitudinal direction of the trenches that is shorter in the middle section between trenches adjacent to each other than it is in the vicinity of the trench.

15. The vertical and trench type insulated gate MOS semiconductor device as claimed in claim 6, wherein the first conductivity type emitter region has a pattern with a length in the longitudinal direction of the trenches that is shorter in the middle section between trenches adjacent to each other than it is in the vicinity of the trench.

16. The vertical and trench type insulated gate MOS semiconductor device as claimed in claim 7, wherein the first conductivity type emitter region has a pattern with a length in the longitudinal direction of the trenches that is shorter in the middle section between trenches adjacent to each other than it is in the vicinity of the trench.

17. The vertical and trench type insulated gate MOS semiconductor device as claimed in claim 1, wherein the first conductivity type emitter region makes contact with the trenches with a side having a length which is longer than the length of the contact region in the longitudinal direction of the trenches.

* * * * *